(12) United States Patent
Miyairi et al.

(10) Patent No.: US 7,927,991 B2
(45) Date of Patent: Apr. 19, 2011

(54) METHOD FOR MANUFACTURING SEMICONDUCTOR DEVICE

(75) Inventors: Hidekazu Miyairi, Kanagawa (JP); Yasuhiro Jinbo, Kanagawa (JP); Eiji Higa, Kanagawa (JP); Shunpei Yamazaki, Tokyo (JP)

(73) Assignee: Semiconductor Energy laboratory Co., Ltd. (JP)

( * ) Notice: Subject to any disclaimer, the term of this patent is extended or adjusted under 35 U.S.C. 154(b) by 307 days.

(21) Appl. No.: 11/839,349

(22) Filed: Aug. 15, 2007

(65) Prior Publication Data

US 2008/0070393 A1    Mar. 20, 2008

(30) Foreign Application Priority Data

Aug. 25, 2006   (JP) ................................. 2006-229777

(51) Int. Cl.
    *H01L 21/20*   (2006.01)
    *H01L 21/3205* (2006.01)

(52) U.S. Cl. ................. 438/584; 438/585; 257/E21.235

(58) Field of Classification Search .......... 438/584–688, 438/E21.235
    See application file for complete search history.

(56) References Cited

U.S. PATENT DOCUMENTS

| | | | |
|---|---|---|---|
| 4,861,964 A | 8/1989 | Sinohara | |
| 4,865,686 A | 9/1989 | Sinohara | |
| RE33,947 E | 6/1992 | Shinohara | |
| 5,708,252 A | 1/1998 | Shinohara et al. | |
| 6,149,988 A | 11/2000 | Shinohara et al. | |
| 6,261,856 B1 | 7/2001 | Shinohara et al. | |
| 6,900,141 B2 * | 5/2005 | Watanabe | 438/725 |
| 7,491,557 B2 * | 2/2009 | Park | 438/29 |
| 2006/0158482 A1 | 7/2006 | Nakamura et al. | |
| 2006/0270175 A1 | 11/2006 | Aoki et al. | |
| 2007/0281247 A1 * | 12/2007 | Phillips et al. | 430/311 |

FOREIGN PATENT DOCUMENTS

| | | |
|---|---|---|
| JP | 63-84789 | 4/1988 |
| JP | 2005-99500 | 4/2005 |

* cited by examiner

*Primary Examiner* — Kiesha R Bryant
*Assistant Examiner* — Tucker Wright
(74) *Attorney, Agent, or Firm* — Husch Blackwell LLP

(57) ABSTRACT

In a manufacturing process of a semiconductor device, a manufacturing technique for reducing the number of lithography processes that use a photoresist and simplifying the process is provided, which improves throughput. An etching mask for forming a pattern of a layer to be processed such as a conductive layer or a semiconductor layer is manufactured without using a lithography technique that uses a photoresist. The etching mask is formed of a light absorption layer including a material which absorbs a laser beam. The mask is formed by irradiating the light absorption layer with a laser beam through a photomask and utilizing laser ablation by energy of the laser beam absorbed by the light absorption layer.

11 Claims, 36 Drawing Sheets

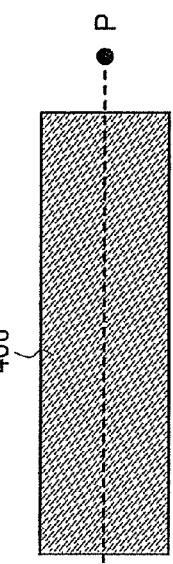
FIG. 4A
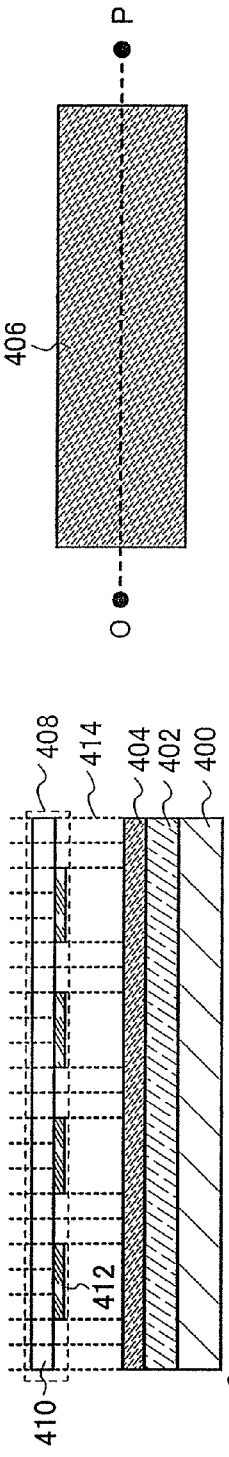
FIG. 4B
FIG. 4C
FIG. 4D
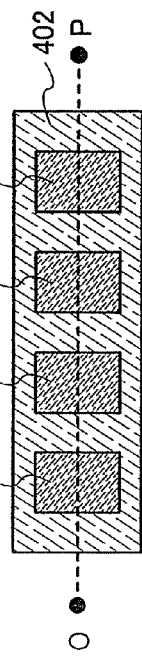
FIG. 4E
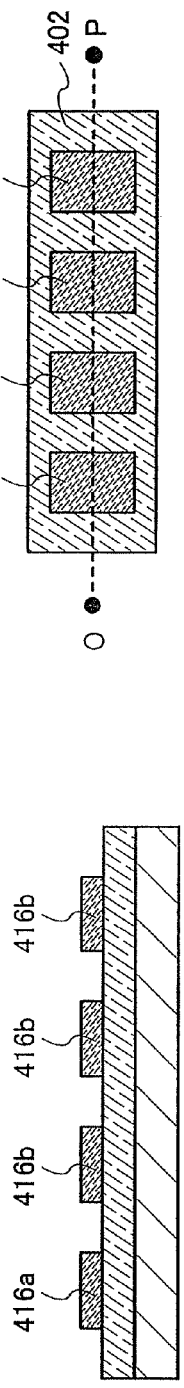
FIG. 4F
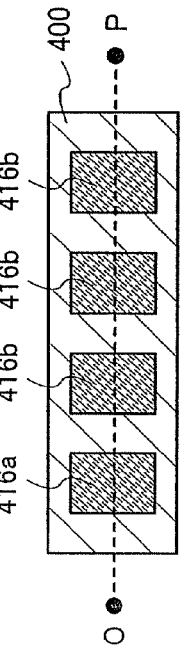
FIG. 4G
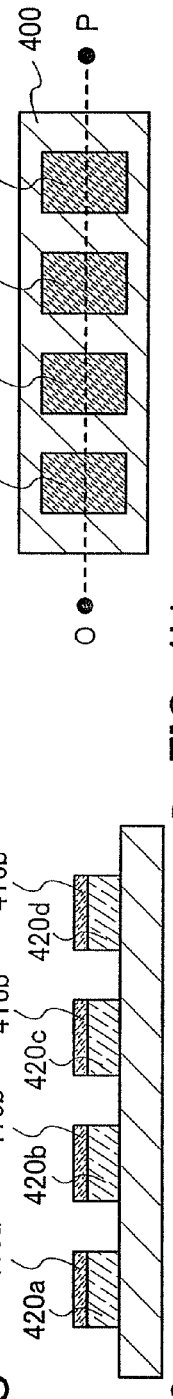
FIG. 4H

8500
8501
8502

METHOD FOR MANUFACTURING SEMICONDUCTOR DEVICE

BACKGROUND OF THE INVENTION

1. Field of the Invention

The present invention relates to a manufacturing method of a semiconductor device and, in particular, relates to a method for forming a pattern of a conductive layer, a semiconductor layer, or the like.

2. Description of the Related Art

Conventionally, a large number of thin films such as an insulating layer and a conductive layer are formed over a substrate and a lithography technique is appropriately used to manufacture a MOS transistor, a thin film transistor (hereinafter referred to as a TFT), and a semiconductor device including such a transistor. A lithography technique is a technique in which a pattern of a circuit or the like called a photomask, which is formed using a light-blocking material over a transparent flat plate, is transferred to an aimed object by utilizing light. The lithography technique is widely used in a process of manufacturing a semiconductor integrated circuit and the like.

The manufacturing process using the lithography technique requires multiple steps such as resist application using a photosensitive resin called a photoresist, light exposure, development, etching using a resist as a mask, and a resist removal. Therefore, throughput is inevitably decreased as the number of lithography processes is increased.

For example, a technique for processing a pattern into a linear shape without using a photoresist is proposed in Patent Document 1 (Japanese Published Patent Application No. S63-84789). Patent Document 1 describes a technique in which a transparent conductive film (ITO) is linearly irradiated with an excimer laser beam to form a linear opening, so that a pattern is formed.

In addition, Patent Document 2: Japanese Published Patent Application No. 2005-099500 describes a technique, in which a resist including aliphatic polyester is used; the resist is selectively exposed to ultraviolet light so that the resist in the ultraviolet-irradiated region is removed, thereby making a development step using a developing solution unnecessary and simplifying the lithography process.

SUMMARY OF THE INVENTION

An object of the present invention is to improve throughput in a manufacturing process of a semiconductor device by reducing the number of lithography processes.

Another object of the present invention is to provide a pattern formation technique in a manufacturing process of a semiconductor device, which can also be applied to a large-area substrate.

One feature of the present invention is to form a mask for forming a pattern of a layer such as a semiconductor layer, a wiring layer, or an electrode layer, by utilizing laser ablation, instead of using a photoresist. A process for forming a pattern by utilizing laser ablation as in the present invention is also called a laser ablation patterning process (LAPP). First, a light absorption layer is formed over a layer to be processed, and a mask formed from the light absorption layer is formed by laser beam irradiation through a photomask. Using the mask as an etching mask, the layer to be processed is etched, so that a layer having a desired pattern shape is formed. By laser beam irradiation through a photomask, even a large area can be selectively irradiated at a time. Accordingly, it is possible to form a mask for processing a large area at a time.

The light absorption layer is formed using a material which absorbs a laser beam. By laser beam irradiation from a side of the light absorption layer formed over the layer to be processed, the laser beam is absorbed by the light absorption layer. The light absorption layer is heated by energy of the absorbed laser beam, and the light absorption layer in the irradiated region is broken and removed. A phenomenon in which the irradiated region is removed by energy of the laser beam as described above is called laser ablation.

Laser beam irradiation is conducted through a photomask. The photomask is formed of a region which transmits a laser beam and a region which blocks a laser beam, so that a desired pattern is formed. In the present invention, since laser beam irradiation is conducted through the photomask, a laser beam which passes through the light-transmitting region of the photomask is absorbed by the light absorption layer. Accordingly, in accordance with the formed pattern of the photomask, the light absorption layer is laser-ablated and removed.

Next, the layer to be processed is etched using the remaining light absorption layer as a mask. The layer to be processed remains in accordance with the light absorption layer used as a mask. Accordingly, the layer to be processed is formed to have a pattern corresponding to the photomask. After the layer to be processed is processed into a desired shape, the light absorption layer used as a mask may be removed as needed.

The layer to be processed is formed using a conductive material or a semiconductor material. By utilizing laser ablation, a conductive layer or a semiconductor layer can be formed without using a lithography process that uses a photoresist.

One feature of the present invention is to include the steps of forming a layer to be processed; forming a light absorption layer over the layer to be processed; irradiating the light absorption layer with a laser beam through a photomask, so that an irradiated region of the light absorption layer is removed; and etching the layer to be processed using a remaining part of the light absorption layer as a mask.

Another feature of the present invention is to include the steps of forming a layer to be processed; forming a light absorption layer over the layer to be processed; irradiating the light absorption layer with a laser beam through a photomask, so that an irradiated region of the light absorption layer is removed; and etching the layer to be processed using a remaining part of the light absorption layer as a mask, so that a layer having a tapered shape is formed.

Further, the layer having a tapered shape is formed by etching using a wet etching method or a combination of a dry etching method and a wet etching method.

Another feature of the present invention is to include the steps of forming a layer to be processed; forming a light absorption layer over the layer to be processed; irradiating the light absorption layer with a laser beam through a photomask, so that an irradiated region of the light absorption layer is removed; and etching the layer to be processed using a remaining part of the light absorption layer as a mask, so that a layer having a perpendicular shape is formed.

Further, the layer having a perpendicular shape is formed by etching using a dry etching method.

Another feature of the present invention is that the layer to be processed is formed using a conductive material or a semiconductor material.

Another feature of the present invention is that the light absorption layer is formed using a material which absorbs a laser beam.

Still another feature of the present invention is that the light absorption layer is formed using a conductive material, a semiconductor material, or an insulating material.

Further, another feature of the present invention is to form the light absorption layer using at least one element selected from chromium (Cr), molybdenum (Mo), nickel (Ni), titanium (Ti), cobalt (Co), copper (Cu), or aluminum (Al).

Further, another feature of the present invention is that a photomask including a pattern formed of a region which transmits the laser beam and a region which blocks the laser beam is used.

According to the present invention, a mask formed from a light absorption layer can be manufactured by laser beam irradiation through a photomask. By using the mask, a semiconductor layer, a conductive layer, and the like can be processed into a desired shape.

By employing the present invention, lithography processes in manufacturing a semiconductor device can be reduced, which improves throughput.

By employing the present invention, a pattern of a conductive layer functioning as a wiring, an electrode, or the like; a semiconductor layer; or the like can be formed over a large-area substrate, which improves throughput.

BRIEF DESCRIPTION OF DRAWINGS

In the accompanying drawings:

FIGS. 4A to 4H are conceptual diagrams for explaining the present invention;

DETAILED DESCRIPTION OF THE INVENTION

Figure 1A:
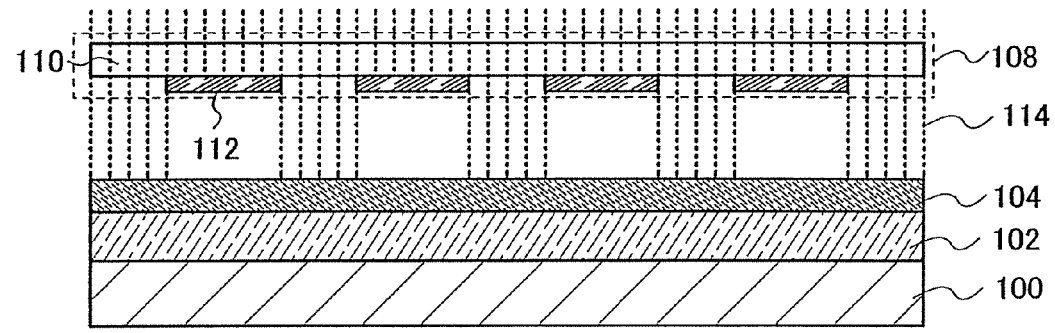
FIGS. 1A to 1D are conceptual diagrams for explaining the present invention.

Embodiment modes and an embodiment of the present invention will be described with reference to the drawings. It is easily understood by those skilled in the art that various changes may be made in forms and details without departing from the spirit and the scope of the invention. Therefore, the present invention should not be limited to the descriptions of the embodiment modes and the embodiment below. In addition, in the following structures of the present invention, there is a case where the same reference numerals are commonly given to the same components or components having a similar function throughout the drawings.

Embodiment Mode 1

One feature of the present invention is to form a layer such as a conductive layer or a semiconductor layer having a desired shape, without using a lithography technique that uses a photoresist. A layer which is processed by using the present invention is also referred to as a layer to be processed. In this embodiment mode, a conductive layer, such as a wiring layer, a gate electrode layer, a source electrode layer, or a drain electrode layer, or a semiconductor layer, which forms a transistor or the like for example, is processed.

One mode of a manufacturing method of a layer to be processed, to which the present invention is applied will be described with reference to FIGS. 1A to 1D and FIGS. 2A and 2B.

First, a substrate 100, over which a layer to be processed 102 and a light absorption layer 104 are sequentially formed to be stacked, is prepared. Then, irradiation with a laser beam 114 is conducted through a photomask 108 to a side of the light absorption layer 104 (FIG. 1A).

As the substrate 100, a glass substrate, a quartz substrate, a sapphire substrate, a ceramic substrate, a semiconductor substrate, or the like is used. A base insulating layer may be formed over the substrate 100. In that case, the base insulating layer is preferably formed using an insulating material such as silicon oxide ($SiO_x$), silicon nitride ($SiN_x$), silicon oxynitride ($SiO_xN_y$)(x>y), or silicon nitride oxide ($SiN_xO_y$)(x>y).

The layer to be processed 102 is formed of a material appropriate for its purpose. For example, when a conductive layer functioning as an electrode or a wiring is desired to be formed as the layer to be processed 102, the layer to be processed 102 is formed using a conductive material. As the conductive material, an element selected from silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), or copper (Cu) or an alloy material or a compound material containing the element as its main component can be used. The layer to be processed 102 can be formed using the conductive material with a single layer structure or a stacked structure by a sputtering method, a CVD method, or the like.

When a semiconductor layer forming a channel or the like is desired to be formed as the layer to be processed 102, the layer to be processed 102 is formed using a semiconductor material. As the semiconductor material, silicon, silicon germanium, or the like can be used. Further, as the layer to be processed 102, an amorphous semiconductor layer may be formed, or a crystalline semiconductor layer may be formed. The layer to be processed 102 can be formed using the semiconductor material with a single layer structure or a stacked structure by a sputtering method, a CVD method, or the like.

The light absorption layer 104 is formed of a material which can absorb a laser beam. Further, it is preferable that a material having a boiling point or a sublimation point lower than a melting point of the layer to be processed 102, which is placed below the light absorption layer 104, be used for the light absorption layer 104. For example, the light absorption layer 104 can be formed using a conductive material, a semiconductor material, or an insulating material. Specifically, a conductive material such as any element of chromium (Cr), molybdenum (Mo), nickel (Ni), titanium (Ti), cobalt (Co), copper (Cu), or aluminum (Al); or an alloy material or a compound material containing the element as its main component can be used. As the compound containing the element as its main component, a nitrogen compound, an oxygen compound, a carbon compound, a halogen compound, or the like can be used, and for example, aluminum nitride, tungsten nitride, tantalum nitride, or the like can be used. Alternatively, a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Further alternatively, an organic resin material such as polyimide, acrylic, polyamide, polyimide-amide, resist, or benzocyclobutene; or an insulating material such as siloxane or polysilazane can be used. Further, zinc sulfide, silicon nitride, mercury sulfide, aluminum chloride, or the like can be used. The light absorption layer 104 can be formed using the above-described material with a single layer structure or a stacked structure by an evaporation method, a sputtering method, a CVD method, or the like. In the case where the light absorption layer 104 is formed using the insulating material, it can be formed by a coating method. Further, hydrogen or an inert gas (rare gas such as helium (He), argon (Ar), krypton (Kr), neon (Ne), or xenon (Xe)) can be added to the light absorption layer 104. When hydrogen or an inert gas is added to the light absorption layer 104, release of a gas from the light absorption layer 104 or evaporation of the light absorption layer 104 can be easily caused in subsequent laser beam irradiation.

The photomask 108 includes a region which transmits a laser beam (hereinafter also referred to as a light-transmitting region) 110 and a region which blocks a laser beam (hereinafter also referred to as a light-blocking region) 112, and a desired pattern is formed by the light-transmitting region 110 and the light-blocking region 112. For example, the photomask 108 is formed in such a manner that a desired pattern is formed using a light-blocking material, on a surface of a light-transmitting substrate. Note that a material for forming the light-blocking region 112 needs to be a material superior in a light-blocking property and resistant to energy of the laser beam 114. For example, in the case of using an excimer laser beam for the laser beam 114, tungsten, molybdenum, or aluminum can be used.

For the laser beam 114, a laser beam having such energy that can be absorbed by the light absorption layer 104 is appropriately selected. Typically, a laser beam in an ultraviolet region, a visible light region, or an infrared region can be appropriately selected to conduct irradiation.

As a laser oscillator which can produce such laser beams, the following can be used: an excimer laser such as a KrF, ArF, or XeCl laser; a gas laser such as a He, He—Cd, Ar, He—Ne, or HF laser; a solid-state laser using, as a medium, single crystalline YAG $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, which is doped with one or more of Nd, Yb, Cr, Ti, Ho, Er, Tm, and Ta as a dopant; or a semiconductor laser such as a GaN, GaAs, GaAlAs, or InGaAsP laser. Note that in the case of using a solid-state laser, it is preferable to use a wave that is appropriately selected from the fundamental wave to the fifth harmonic.

For the laser beam 114, a continuous wave laser beam or a pulsed laser beam can appropriately be used. For the pulsed laser beam, a repetition rate of several tens of Hz to several KHz is usually used. Alternatively, a pulsed laser, which can emit a laser beam at a repetition rate of 10 MHz or more, that is much higher than the usual, and with a pulse width in the range of picoseconds or in the range of femtoseconds ($10^{-15}$ seconds), may be used.

A cross section of the laser beam 114 may be a circular shape, an elliptical shape, a rectangular shape, or a linear shape (strictly, a narrow rectangular shape) as appropriate. The laser beam 114 is preferably processed into such a cross sectional shape by an optical system.

Energy of the laser beam 114 is preferably in such a level that release of a gas in the light absorption layer 104 or evaporation of the light absorption layer 104 is caused.

Figure 1B:
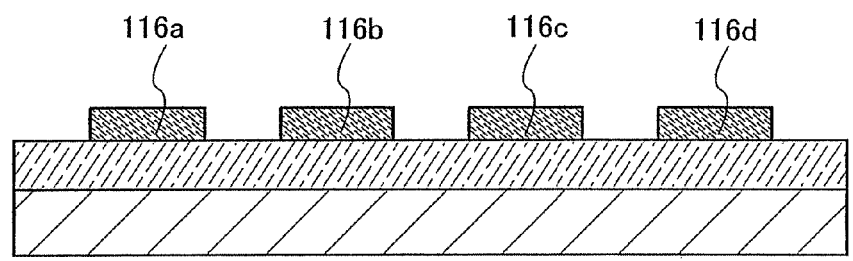

In FIG. 1A, the laser beam 114 passes through the light-transmitting region 110 of the photomask 108 and is absorbed by the light absorption layer 104. A region which the laser beam 114 reaches (hereinafter also referred to as an irradiated region) of the light absorption layer 104 is laser-ablated and removed (FIG. 1B). A remaining portion of the light absorption layer 104 is separated into a light absorption layer 116a, a light absorption layer 116b, a light absorption layer 116c, and a light absorption layer 116d. The remaining light absorption layers 116a to 116d function as etching masks in etching the layer to be processed 102. Note that a pattern of the remaining light absorption layers 116a to 116d corresponds to the pattern formed in the photomask 108, specifically the pattern formed by the light-blocking region 112.

The laser ablation which occurs here indicates evaporation and removal (or dispersal) of the irradiated region of the light absorption layer 104 by energy of the laser beam 114 absorbed by the light absorption layer 104.

Since the etching masks are formed by utilizing laser ablation in the above-described manner, a step for coating a resist and a development step using a developing solution in a lithography process using a photoresist can be omitted. Accordingly, loss of materials such as a photoresist material and a developing solution can be prevented. Further, since the substrate does not need to be rotated, the present invention can more easily be applied to a large-area substrate. Further, since laser beam irradiation is conducted through a photomask, even a large area can be selectively irradiated at a time. Accordingly, it is possible to form a mask pattern in a large area at a time.

In a usual lithography process, a mask pattern for etching a layer to be processed is formed through steps such as resist coating, light exposure, development, etching, and removal of the resist, with an exposure apparatus including a complicated optical system such as a stepper. On the other hand, in the present invention, since a mask pattern is formed by utilizing laser ablation, an apparatus for resist coating, development, removal of the resist, and the like is not needed. By applying the present invention, maintenance of an apparatus for forming a pattern can be facilitated.

After irradiation with the laser beam 114, a gas such as $N_2$ or air may be jetted to the side of the substrate 100, which is irradiated with the laser beam 114. Alternatively, the substrate 100 may be washed using a liquid which is an unreactive matter such as water. Thus, by jetting a gas or washing with a liquid, a dust, a residue, or the like caused by ablation can be reduced.

Figure 1C:
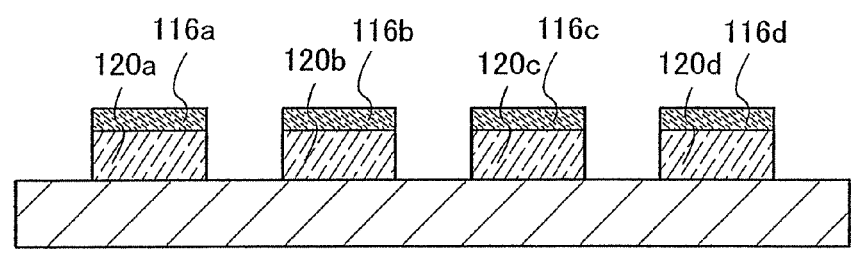

Next, using the remaining light absorption layers 116a to 116d as masks, the layer to be processed 102 is etched to form a layer to be processed 120a, a layer to be processed 120b, a layer to be processed 120c, and a layer to be processed 120d (FIG. 1C). The layers to be processed 120a to 120d each have a desired pattern shape, and a conductive layer functioning as a wiring, an electrode, or the like or a semiconductor layer is formed. The pattern shape of the layers to be processed 120a to 120d corresponds to the pattern formed in the photomask 108. Specifically, the pattern shape of the layers to be processed 120a to 120d corresponds to the pattern of the light-blocking region 112 formed in the photomask 108. The remaining light-absorption layers 116a to 116d function as etching masks.

The layer to be processed 102 is subjected to anisotropic etching or isotropic etching, so that the layers to be processed 120a to 120d are formed. Etching may be conducted by a dry etching method, a wet etching method, or a combination of a dry etching method and a wet etching method.

Generally, when a wet etching method is used, an object to be etched (in this embodiment mode, the layers to be processed 120a to 120d) becomes to have an isotropic shape. Therefore, a wet etching method is employed for the isotropic etching. On the other hand, a dry etching method has a chemical etching aspect for conducting etching by a chemical reaction and a physical etching aspect for conducting etching physically by a sputtering effect or the like. The chemical etching is isotropic, the physical etching is anisotropic, and the ratio of both the etchings is changed depending on the structure of an apparatus or the like. Since both anisotropic etching and isotropic etching can be conducted depending on the ratio of the chemical etching aspect and the physical etching aspect when using the dry etching method, the dry etching method can be applied to both etchings.

When using the dry etching method, a gas, which can obtain a high etching selectivity between the layer to be processed 102 and the light absorption layers 116a to 116d, is used as an etching gas. For example, a fluorine-based gas or a chlorine-based gas such as $CF_4$, $CHF_3$, $NF_3$, $Cl_2$, or $BCl_3$ can be employed. An inert gas such as He or argon or an $O_2$ gas may be appropriately added to the etching gas. For example, in the case where the layer to be processed 102 is formed of tungsten and the light absorption layers 116a to 116d are formed of chromium, a mixed gas of $CF_4$, $Cl_2$, and $O_2$ is used as an etching gas.

In the case of using the dry etching method, an uppermost layer portion, which is upper layer portions of the light absorption layers 116a to 116d here, may sometimes be etched, so that the film thicknesses thereof are reduced (referred to as film reduction).

In the case of using the wet etching method, a solution, which can obtain a high etching selectivity between the layer to be processed 102 and the light absorption layers 116a to 116d, is used as an etchant. For example, an acidic solution of hydrofluoric acid, phosphoric acid, nitric acid, acetic acid, sulfuric acid, or the like or an alkaline solution of potassium hydroxide, hydrazine, ethylenediamine, or the like can be used. Further, pure water or a buffering agent may be appropriately added to the etchant. For example, in the case where the layer to be processed 102 is formed of molybdenum and the light absorption layer 104 is formed of chromium, an acid, in which phosphoric acid, acetic acid, nitric acid, and pure water are mixed at a ratio of 85:5:5:5 by vol % (in this specification, also referred to as an aluminum mixed acid solution), can be used as an etchant. Further, in the case of forming the layer to be processed 102 using tungsten, a solution, in which a 28 wt % ammonia solution, a 31 wt % hydrogen peroxide solution, and pure water are mixed at a ratio of 3:5:2 by vol % (in this specification, hereinafter also referred to as an ammonia hydrogen peroxide mixture), can be used. For example, tungsten (W) has an etching speed of about 24 nm/min in using the ammonia hydrogen peroxide mixture. Further, tungsten nitride has an etching speed of about 250 nm/min in using the ammonia hydrogen peroxide mixture.

FIG. 1C shows an example in which a part of the layer to be processed 102 is removed by anisotropic etching, so that the layers to be processed 120a to 120d are formed. Side surfaces (sidewalls) of the layers to be processed 120a to 120d, which are etched by anisotropic etching, each have a perpendicular shape.

Figure 2A:
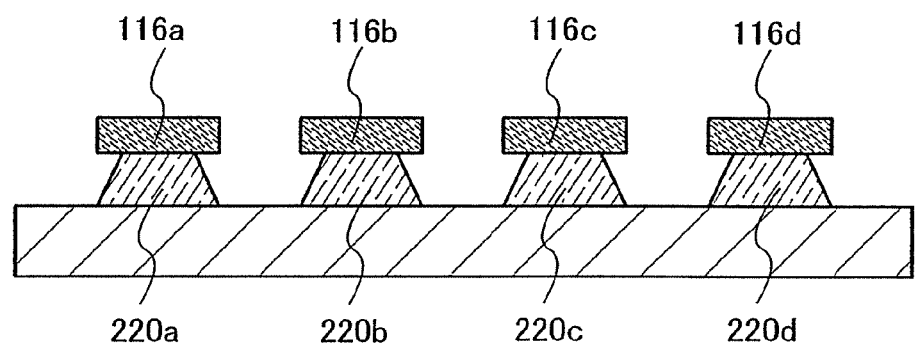
FIGS. 2A and 2B are conceptual diagrams for explaining the present invention.

FIG. 2A shows an example in which a part of the layer to be processed 102 is removed by isotropic etching, so that a layer to be processed 220a, a layer to be processed 220b, a layer to be processed 220c, and a layer to be processed 220d are formed. The process up to the step for forming the light absorption layers 116a to 116d to be serve as etching masks is the same as that of FIG. 1B. Side surfaces (sidewalls) of the layers to be processed 220a to 220d, which are etched by isotropic etching, each have a tapered shape.

In forming a mask from a light absorption layer by laser ablation, an influence to a layer to be processed, which exists in a lower layer, is worried. However, since the layer to be processed existing below an irradiated region of a laser beam is removed at the time of etching, there is no particular problem.

Figure 1D:
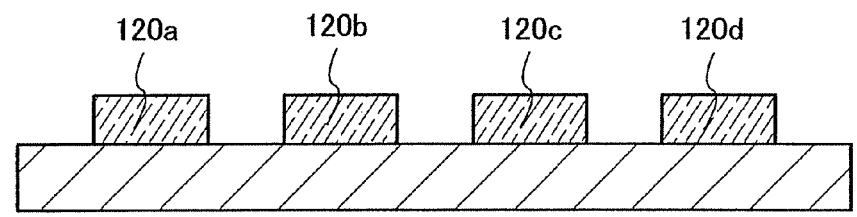
Figure 2B:
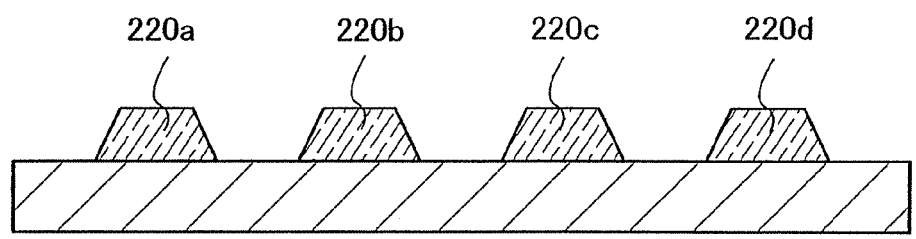

Next, the light absorption layers 116a to 116d are removed (FIG. 1D and FIG. 2B). The light absorption layers 116a to 116d may be removed by appropriately using an etching method utilizing a dry etching method or a wet etching method, or a method that utilizes laser ablation by laser beam irradiation. In the case of removing the light absorption layers 116a to 116d by laser ablation, jet of a gas such as $N_2$ or air or washing using a liquid may be conducted from the laser beam irradiation side. In the above-described manner, the layers to be processed 120a to 120d forming a desired pattern shape can be obtained.

Further, by applying the present invention, a conductive layer formed over a wiring substrate or a conductive layer functioning as an antenna used for an RF tag or the like can be formed as well.

By employing the present invention, a layer having a desired pattern shape can be formed without using a lithography process that uses a photoresist. Accordingly, a lithography process can be simplified, which improves throughput.

Further, when a linear laser beam or a planar laser beam having a large area such as a rectangular laser beam or a circular laser beam is used, a plurality of regions can be irradiated with a laser beam in a short time. Accordingly, by employing the present invention to a large-area substrate, many patterns can be formed in a short time, which improves mass productivity.

Embodiment Mode 2

Embodiment Mode 2 will describe a manufacturing method of a plurality of conductive layers, which function as gate electrode layers or wiring layers, using the present invention, with reference to FIGS. 4A1 to 4D2.

First, a substrate 400, over which a conductive layer 402 and a light absorption layer 404 are sequentially formed to be stacked, is prepared. Then, irradiation with a laser beam 414 is conducted through a photomask 408 to a side of the light absorption layer 404 (FIG. 4A).

The substrate 400 may be a glass substrate, a quartz substrate, a sapphire substrate, a ceramic substrate, a semiconductor substrate, or the like. Over the substrate 400, a base insulating layer may be formed using an insulating material such as silicon oxide, silicon nitride, silicon oxynitride, or silicon nitride oxide.

The conductive layer 402 is formed of a conductive material such as an element selected from silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), or copper (Cu) or an alloy material or a compound material containing the element as its main component. Further, the conductive layer 402 may have a single layer structure or a stacked structure. For example, a single layer structure using a tungsten layer; a two-layer structure in which a tantalum nitride layer and a tungsten layer are stacked or a tungsten nitride layer and a molybdenum layer are stacked; a three-layer structure in which a molybdenum layer, an aluminum layer, and a molybdenum layer are stacked; or the like can be formed.

The conductive layer 402 is formed by a sputtering method, a physical vapor deposition (PVD) method, a chemical vapor deposition (CVD) method such as a low pressure CVD (LPCVD) method or a plasma CVD method, or the like.

The light absorption layer 404 is formed by using a material which can absorb the laser beam 414. For the light absorption layer 404, it is preferable to use a material having a boiling point or a sublimation point lower than a melting point of the conductive layer 402, which is placed below the light absorption layer 404. For example, the light absorption layer 404 can be formed using a conductive material, a semiconductor material, or an insulating material. For the light absorption layer 404, a conductive material such as any element of Cr, Mo, Ni, Ti, Co, Cu, or Al; an alloy material or a compound containing the element as its main component can be used. As the compound, a nitrogen compound, an oxygen compound, a carbon compound, a halogen compound, or the like can be used, and for example, aluminum nitride, tungsten nitride, tantalum nitride, or the like can be used. Alternatively, a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Further alternatively, an organic resin material such as polyimide, acrylic, polyamide, polyimideamide, resist, or benzocyclobutene; or an insulating material such as siloxane or polysilazane can be used. Further, zinc sulfide, silicon nitride, mercury sulfide, aluminum chloride, or the like can be used. The light absorption layer 404 can be formed with a single layer structure or a stacked structure.

The light absorption layer 404 is formed by an evaporation method, a sputtering method, a CVD method, or the like. In the case where the light absorption layer 404 is formed using the insulating material, it can be formed by a coating method. Further, hydrogen or an inert gas (rare gas such as helium (He), argon (Ar), krypton (Kr), neon (Ne), or xenon (Xe)) may be added to the light absorption layer 404. When hydrogen or an inert gas is added to the light absorption layer 404, release of a gas from the light absorption layer 404 or evaporation of the light absorption layer 404 can be easily caused in subsequent laser beam irradiation.

The photomask 408 includes a light-transmitting region 410, which transmits the laser beam 414, and a light-blocking region 412, and a desired pattern is formed by the light-transmitting region 410 and the light-blocking region 412. For example, the photomask 408, in which a desired pattern is formed using a light-blocking material, on a surface of a light-transmitting substrate, is used. Note that a material for forming the light-blocking region 412 needs to be a material superior in a light-blocking property and resistant to energy of the laser beam 114. For example, in the case of using an excimer laser beam, tungsten, molybdenum, or aluminum can be used.

For the laser beam 414, a laser beam having such energy that can be absorbed by the light absorption layer 404 may be appropriately selected. Typically, a laser beam in an ultraviolet region, a visible light region, or an infrared region may be appropriately selected.

As a laser oscillator which can produce such laser beams, the following can be used: an excimer laser such as a KrF, ArF, or XeCl laser; a gas laser such as a He, He—Cd, Ar, He—Ne, or HF laser; a solid-state laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, which is doped with one or more of Nd, Yb, Cr, Ti, Ho, Er, Tm, and Ta as a dopant; or a semiconductor laser such as a GaN, GaAs, GaAlAs, or InGaAsP laser. Note that in the case of using a solid-state laser, it is preferable to use a wave that is appropriately selected from the fundamental wave to the fifth harmonic.

For the laser beam 414, a continuous wave laser beam or a pulsed laser beam can appropriately be used. For the pulsed laser beam, a repetition rate of several tens of Hz to several KHz is usually used. Alternatively, a pulsed laser, which can emit a laser beam at a repetition rate of 10 MHz or more, that is much higher than the usual, and with a pulse width in the range of picoseconds or in the range of femtoseconds ($10^{-15}$ seconds), may be used.

A cross section of the laser beam 414 may be a circular shape, an elliptical shape, a rectangular shape, or a linear shape (strictly, a narrow rectangular shape) as appropriate. The laser beam 414 is preferably processed into such a cross sectional shape by an optical system. Energy of the laser beam 414 is preferably in such a level that release of a gas in the light absorption layer 404 or evaporation of the light absorption layer 404 are caused.

FIG. 4E is a schematic top diagram of FIG. 4A. FIG. 4A corresponds to a cross sectional view taken along a line OP of FIG. 4E. Note that in the top diagram, the photomask 408 and the laser beam 414 are omitted.

In FIG. 4A, the laser beam 414 passes through the light-transmitting region 410 of the photomask 408 and is absorbed by the light absorption layer 404. An irradiated region of the light absorption layer 404, which is irradiated with the laser beam 414, is laser-ablated and removed. Then, a light absorption layer 416a, a light absorption layer 416b, a light absorption layer 416c, and a light absorption layer 416d remain (FIG. 4B and FIG. 4F). Note that a pattern of the remaining absorption layers 416a to 416d corresponds to the pattern formed in the photomask 408, specifically the pattern formed by the light-blocking region 412.

The laser ablation which occurs here indicates evaporation and removal (or dispersal) of the irradiated region of the light absorption layer 404 by energy of the laser beam 414 absorbed by the light absorption layer 404.

After irradiation with the laser beam 414, a gas such as $N_2$ or air may be jetted to the side of the substrate 400, which is irradiated with the laser beam 414. Alternatively, the substrate 400 may be washed using a liquid which is an unreactive matter such as water. Thus, by jetting a gas or washing with a liquid, a dust, a residue, or the like caused by ablation can be reduced.

Next, using the light absorption layers 416a to 416d as masks, the conductive layer 402 is etched to form a conductive layer 420a, a conductive layer 420b, a conductive layer 420c, and a conductive layer 420d (FIG. 4C and FIG. 4G). The pattern of the conductive layers 420a to 420d corresponds to the pattern formed in the photomask 408.

The conductive layers 420a to 420d can be formed by using the light absorption layers 416a to 416d as etching masks, and conducting anisotropic etching or isotropic etching to the conductive layer 402. Etching may be conducted by appropriately selecting an etching method, an etching gas, an etchant, and the like under the condition where a etching selectivity between the conductive layer 402 and the light absorption layers 416a to 416d is high.

In this embodiment mode, anisotropic etching is conducted, so that the conductive layers 420a to 420d each having a perpendicular side surface are formed (FIG. 4C). For the anisotropic etching, a dry etching method can be used. As an etching gas, a fluorine-based gas or a chlorine-based gas such as $CF_4$, $CHF_3$, $NF_3$, $Cl_2$, or $BCl_3$ can be employed. An inert gas such as He or Ar, an $O_2$ gas, or the like may be appropriately added to the etching gas.

Figure 34A:
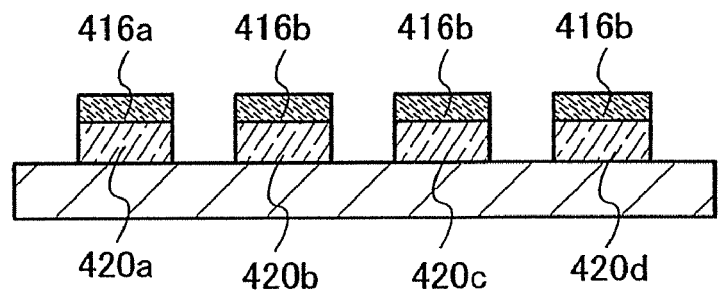
FIGS. 34A to 34C are conceptual diagrams for explaining the present invention.
Figure 34B:
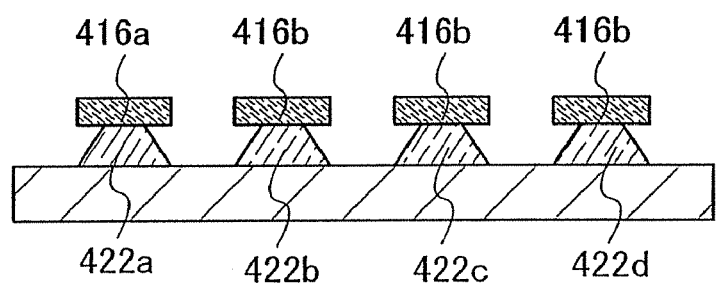
Figure 34C:
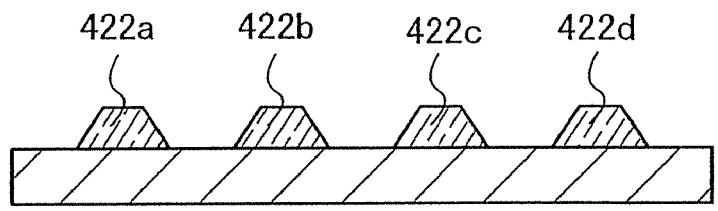

After the anisotropic etching, isotropic etching may be continuously conducted, so that conductive layers each having a tapered side surface (sidewall) are formed (FIG. 34). For example, the conductive layers 420a to 420d each having a perpendicular side surface are formed by a dry etching method (FIG. 34A), and then a conductive layer 422a, a conductive layer 422b, a conductive layer 422c, and a conductive layer 422d, each of which has a tapered side surface, are continuously formed by a wet etching method (FIG. 34B). By the wet etching method, an etchant goes into a portion below the light absorption layers 416a to 416d serving as masks, thereby forming the side surfaces of the conductive layers 420a to 420d into tapered shapes. Accordingly, the conductive layers 422a to 422d as shown in FIG. 34C can be formed. As the etchant used for wet etching, an acidic solution of HF, $H_3PO_4$, $HNO_3$, $CH_3COOH$, $H_2SO_4$, or the like or an alkaline solution of KOH, $N_2H_2$, $NH_2(CH_2)_2NH_2$, or the like can be used. Further, pure water or a buffering agent may be appropriately added to the etchant.

Alternatively, only wet etching may be conducted to form the conductive layers each having the tapered side surface.

For example, in the case where the conductive layer 402 is formed of tungsten and the light absorption layer 404 (416a to 416d) is formed of chromium, dry etching using a mixed gas of $CF_4$, $Cl_2$, and $O_2$ can be conducted.

In the case where the conductive layer 402 is formed of molybdenum and the light absorption layer 404 (416a to 416d) is formed of chromium, wet etching can be conducted using an aluminum mixed acid solution. In the case of forming the conductive layer using tungsten, etching can be conducted using an ammonia hydrogen peroxide mixture.

Note that in the case of using a dry etching method for etching, upper layer portions of the light absorption layers 416a to 416d serving as masks may sometimes be etched, so that the film thicknesses thereof are reduced (referred to as film reduction).

Next, the light absorption layers 416a to 416d, which have been used as the masks, are removed (FIG. 4D and FIG. 4H). The light absorption layers 416a to 416d may be removed by a removing method utilizing a dry etching method or a wet etching method, or a method that utilizes laser ablation by laser beam irradiation. In the case where the light absorption layers 416a to 416d are removed by utilizing laser ablation, it is preferable that a dust, a residue, or the like be removed by jetting a gas such as $N_2$ or air or washing using a liquid, which is an unreactive matter such as water, after the laser ablation. In the above-described manner, the conductive layers 420a to 420d forming a desired pattern shape can be obtained.

Note that when the light absorption layers 416a to 416d (light absorption layer 404) are formed using a conductive material and these layers are not removed, conductive layers having a stacked structure of the light absorption layers 416a to 416d and the conductive layers 420a to 420d can be formed (FIG. 4C).

Further, by applying the present invention, a conductive layer formed over a wiring substrate or a conductive layer functioning as an antenna used for an RF tag or the like can be formed as well.

By employing the present invention, a layer having a desired pattern shape can be formed without using a lithography process that uses a photoresist. Accordingly, a lithography process can be simplified, which improves throughput.

Further, when a linear laser beam or a planar laser beam having a large area such as a rectangular laser beam or a circular laser beam is used, a plurality of regions can be irradiated with a laser beam in a short time. Accordingly, by employing the present invention to a large-area substrate, many patterns can be formed in a short time, which improves mass productivity.

Embodiment Mode 3

Embodiment Mode 3 will describe a structural example of a laser irradiation apparatus which is used in employing the present invention.

Figure 3:
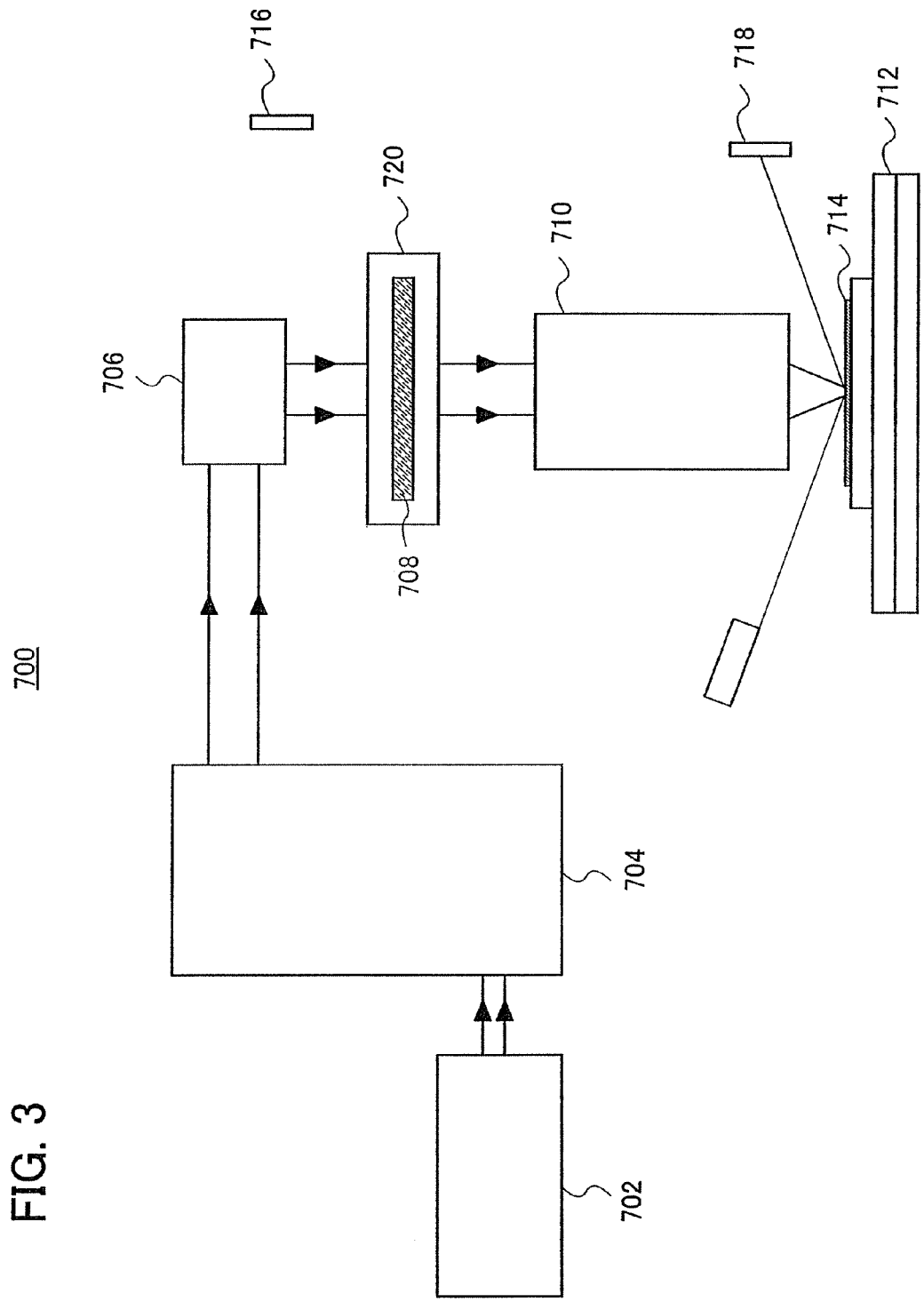
FIG. 3 shows a structural example of a laser irradiation apparatus which can be applied to the present invention.

FIG. 3 is a schematic diagram of a laser irradiation apparatus. In FIG. 3, a laser irradiation apparatus 700 includes a laser oscillation device 702; a first optical system 704, which shapes a laser beam; a second optical system 706, which homogenizes a laser beam; a mask holder 720; a third optical system 710; and a stage 712. A photomask 708 is provided in the mask holder 720. A substrate 714 is provided on the stage 712.

A laser beam obtained by being emitted from an oscillator of the laser oscillation device 702 is shaped by passing through the first optical system 704. The shaped laser beam is homogenized by passing through the second optical system 706. Then, the shaped and homogenized laser beam passes through the photomask 708, it is reduced in size to a desired magnification in the third optical system 710, and an image of a pattern is formed on the substrate 714 held on the stage 712.

The laser oscillation device 702 includes a laser oscillator with high output. For example, an excimer laser oscillator, a gas laser oscillator, a solid laser oscillator, a semiconductor laser oscillator, or the like is included. A laser oscillator which can produce a continuous wave laser beam or a pulsed laser beam can be appropriately used. Specifically, the laser oscillator exemplified in Embodiment Mode 1 or the like can be used.

The first optical system 704 is an optical system for shaping a laser beam obtained from the laser oscillation device 702 into a desired shape. Specifically, a cross section of the laser beam is formed into a planar shape such as a circular shape, an elliptical shape, or a rectangular shape; a linear shape (strictly, a narrow rectangular shape); or the like. For example, the beam diameter of the laser beam is preferably adjusted using an expander or the like for the first optical system 704. Further, a polarizer, which aligns a polarization direction of a laser beam; an attenuator, which adjusts energy of a laser beam; a spectrometer; or the like may be used.

The second optical system 706 is an optical system for homogenizing energy distribution of the laser beam shaped by the first optical system 704. Specifically, the second optical system 706 homogenizes energy distribution of the laser beam, with which the photomask 708 is irradiated. For example, using a homogenizer or the like, energy distribution of the laser beam may be homogenized. Further, in order to efficiently irradiate the photomask 708 with the laser beam, a field lens or the like may be provided between a homogenizer and the photomask 708 so that the laser beam may be condensed.

The photomask 708 is a mask used when applying the present invention and corresponds to the photomask used in Embodiment Modes 1 and 2, and the like. That is, the photomask 708 is a mask, a pattern of which is formed of a light-transmitting region and a light-blocking region. For the light-blocking region, a material, which is superior in a light-blocking property and has resistant to energy of the laser beam used for irradiation, is used. For the light-transmitting region, a light-transmitting material may be used, or a slit may be provided there.

The third optical system 710 is an optical system for reducing the laser beam in size which is patterned by passing through the photomask 708. Since the laser beam passes through only the light-transmitting region of the photomask 708, the laser beam having passed through the photomask 708 corresponds to a pattern formed of the light-transmitting region. The third optical system 710 is an optical system which reduces the laser beam in size, which is formed by the photomask 708, while maintaining the pattern shape of the laser beam and forms an image on the substrate 714. For example, a reducing glass, which reduces a pattern shape of a laser beam to a size of ⅕, ⅒, or the like may be used.

As the substrate 714, as described in Embodiment Modes 1 and 2, a substrate, over which a layer to be processed (such as a semiconductor layer or a conductive layer) and a light absorption layer are formed to be stacked, is used. A material or the like of the light absorption layer conforms to the description in Embodiment Modes 1 and 2. A material which absorbs energy of a laser beam is used for the light absorption layer. The substrate 714 is held on the stage 712 and can move in XYZθ directions.

The laser irradiation apparatus 700 may be provided with a light receiving element 716 for monitoring whether the photomask 708 is uniformly irradiated with a laser beam and controlling the uniformity. Further, a light receiving element 718 may be provided as an autofocus mechanism for focusing the laser beam on the substrate. As the light receiving elements 716 and 718, a CCD camera or the like may be used.

Further, a mirror or the like may be appropriately provided for the laser irradiation apparatus 700, so that a traveling direction of the laser beam may be controlled.

One feature of the present invention is to form a mask for forming a pattern of a layer such as a semiconductor layer, a wiring layer, or an electrode layer by utilizing laser ablation. By using the laser irradiation apparatus described in this embodiment mode, a mask having a finer pattern shape can be manufactured.

Further, when a laser beam is processed into a linear laser beam or a planar laser beam having a large area such as a rectangular laser beam or a circular laser beam using an optical system, a plurality of regions can be irradiated with a laser beam in a short time. Accordingly, many patterns can be formed over a large-area substrate in a short time, which improves mass productivity.

This embodiment mode can be appropriately combined with Embodiment Mode 1 or 2.

Embodiment Mode 4

Embodiment Mode 4 will describe a manufacturing method of an inverted staggered transistor using the present invention, with reference to FIG. 5 to FIG. 9B.

Figure 5:
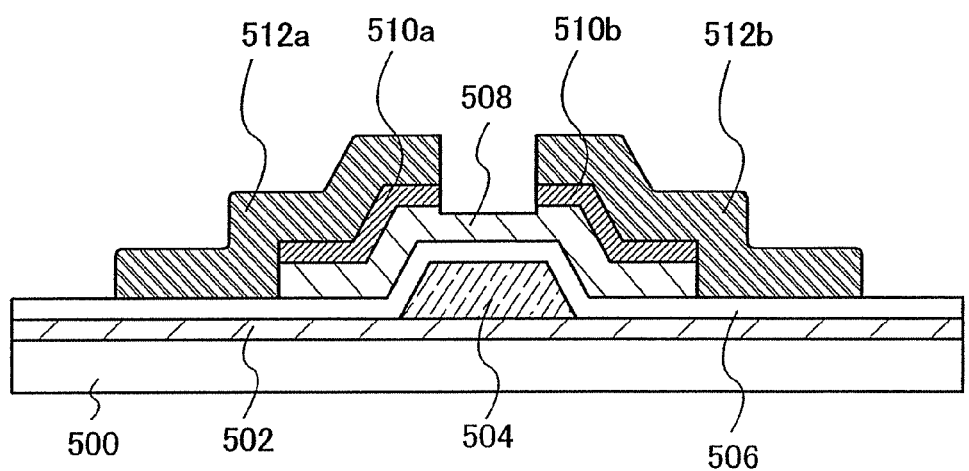
FIG. 5 shows an example of a semiconductor device of the present invention.

First, one mode of an inverted staggered transistor manufactured by employing the present invention is shown in FIG. 5. The transistor shown in FIG. 5 is provided with a conductive layer 504 functioning as a gate electrode over a substrate 500 with a base insulating layer 502 interposed between the substrate 500 and the conductive layer 504. Over the conductive layer 504, a semiconductor layer 508 and semiconductor layers 510*a* and 510*b* each having one conductivity type are provided with a gate insulating layer 506 interposed between the conductive layer 504, and the semiconductor layer 508 and the semiconductor layers 510*a* and 510*b*. The semiconductor layers 510*a* and 510*b* each having one conductivity type are separated from each other. Further, over the semiconductor layers 510*a* and 510*b*, a conductive layer 512*a* and a conductive layer 512*b*, each of which functions as a source electrode or a drain electrode, are provided. The conductive layers 512*a* and 512*b* are separated from each other. The conductive layer 512*a* is provided in contact with the semiconductor layer 510*a*, and the conductive layer 512*b* is provided in contact with the semiconductor layer 510*b*. A specific manufacturing method is described below.

Figure 6A:
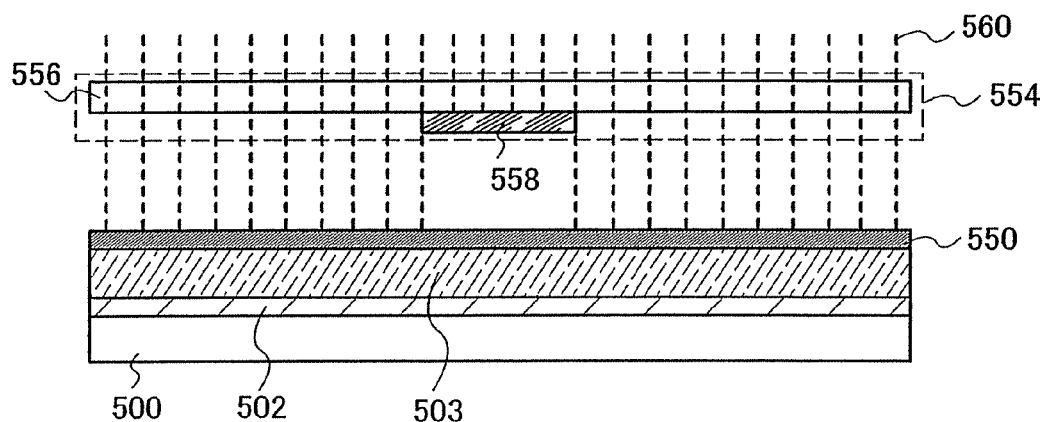
FIGS. 6A to 6C show an example of a manufacturing method of a semiconductor device of the present invention.

The base insulating layer 502 is formed over the substrate 500, and a conductive layer 503 is formed over the base insulating layer 502 (FIG. 6A). As the substrate 500, a glass substrate of barium borosilicate glass, aluminoborosilicate glass, or the like; a quartz substrate; a sapphire substrate; a ceramic substrate; or a plastic substrate having heat resistance which can withstand processing temperature in the present manufacturing process is used. Further, in order to planarize a surface of the substrate 500, the substrate may be polished by a CMP method or the like.

The base insulating layer 502 is formed with a single layer structure or a stacked structure using an insulating material such as silicon oxide, silicon nitride, silicon oxynitride, or silicon nitride oxide by various methods such as a CVD method, a sputtering method, and a spin coating method. It is not always necessary to form the base insulating layer 502, but it has an effect of blocking a contamination substance from the substrate 500.

The conductive layer 503 may be formed of an element selected from Ag, Au, Ni, Pt, Pd, Ir, Rh, Ta, W, Ti, Mo, Al, or Cu or an alloy material or a compound material containing the above element as its main component. Alternatively, a semiconductor material typified by polycrystalline silicon doped with an impurity element such as phosphorus, or an AgPdCu alloy may be used. Either a single layer structure or a stacked structure may be used. For example, a two-layer structure of a tungsten nitride film and a molybdenum (Mo) film or a three-layer structure in which a tungsten film having a thickness of 50 nm, an alloy film of aluminum and silicon (Al—Si) having a thickness of 500 nm, and a titanium nitride film having a thickness of 30 nm are sequentially stacked may be used. Further, in the case of the three-layer structure, tungsten nitride may be used instead of tungsten for a first conductive layer, an alloy film of aluminum and titanium (Al—Ti) may be used instead of the alloy film of aluminum and silicon (Al—Si) for a second conductive layer, and a titanium film may be used instead of the titanium nitride film for a third conductive layer.

The conductive layer 503 is formed by a sputtering method, a physical vapor deposition (PVD) method, a chemical vapor deposition (CVD) method such as a low pressure CVD (LPCVD) method or a plasma CVD method, or the like.

A light absorption layer 550 is formed over the conductive layer 503. Then, irradiation with a laser beam 560 is conducted through a photomask 554 to the side of the light absorption layer 550, which is for laser ablation. The laser beam 560 passes through a light-transmitting region 556 of the photomask 554 and is blocked at a light-blocking region 558 of the photomask 554 (FIG. 6A).

The light absorption layer 550 is formed using a material which can absorb a laser beam. For example, the light absorption layer 550 can be formed using a conductive material, a semiconductor material, or an insulating material. Specifically, a conductive material such as any element of chromium (Cr), molybdenum (Mo), nickel (Ni), titanium (Ti), cobalt (Co), copper (Cu), or aluminum (Al); or an alloy material or a compound containing the element as its main component (nitrogen compound, oxygen compound, carbon compound, halogen compound, or the like) may be used. Alternatively, a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Further alternatively, an organic resin material such as polyimide, acrylic, polyamide, polyimide-amide, resist, or benzocyclobutene; or an insulating material such as siloxane or polysilazane can be used. Further, zinc sulfide, silicon nitride, mercury sulfide, aluminum chloride, or the like can be used. The light absorption layer 550 may have either a single layer structure or a stacked structure, and for example, a chromium (Cr) film, zinc oxide film, or aluminum nitride film having a thickness of 20 nm can be used.

The light absorption layer 550 is formed by an evaporation method, a sputtering method, a CVD method, or the like. In the case where the light absorption layer 550 is formed using an insulating material, it can be formed by a coating method. Further, hydrogen or an inert gas (rare gas such as helium (He), argon (Ar), krypton (Kr), neon (Ne), or xenon (Xe)) can be added to the light absorption layer 550.

The photomask 554 includes the light-transmitting region 556 which transmits the laser beam 560 and the light-blocking region 558 which blocks the laser beam 560, and a desired pattern is formed by the light-transmitting region 556 and the light-blocking region 558. In more detail, the conductive layer 503 is processed correspondingly to a pattern of the light-blocking region 558 and a part of the conductive layer 503 remains. For the photomask 554, a material in which the pattern is formed of a light-blocking material on a surface of a light-transmitting substrate, may be used. Note that the light-blocking region 558 for forming the photomask 554 is formed of a material superior in a light-blocking property and resistant to energy of the laser beam 560.

For the laser beam 560, a laser beam having such energy that can be absorbed by the light absorption layer 550 is appropriately selected. Typically, a laser beam in an ultraviolet region, a visible light region, or an infrared region can be appropriately selected to conduct irradiation.

As a laser oscillator which can produce the laser beam 560, the following can be used: an excimer laser such as a KrF, ArF, or XeCl laser; a gas laser such as a He, He—Cd, Ar, He—Ne, or HF laser; a solid-state laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, which is doped with one or more of Nd, Yb, Cr, Ti, Ho, Er, Tm, and Ta as a dopant; or a semiconductor laser such as a GaN, GaAs, GaAlAs, or InGaAsP laser. Note that in the case of using a solid-state laser, it is preferable to use a wave that is appropriately selected from the fundamental wave to the fifth harmonic.

For the laser beam 560, a continuous wave laser beam or a pulsed laser beam can appropriately be used. For the pulsed laser beam, a repetition rate of several tens of Hz to several KHz is usually used. Alternatively, a pulsed laser, which can emit a laser beam at a repetition rate of 10 MHz or more, that is much higher than the usual, and with a pulse width in the range of picoseconds or in the range of femtoseconds ($10^{-15}$ seconds), may be used.

A cross section of the laser beam 560 may be a circular shape, an elliptical shape, a rectangular shape, or a linear shape (strictly, a narrow rectangular shape) as appropriate. The laser beam 560 is preferably processed into such a cross sectional shape by an optical system.

Energy of the laser beam 560 is preferably in such a level that release of a gas in the light absorption layer 550, evaporation of the light absorption layer 550, or the like is caused.

Figure 6B:
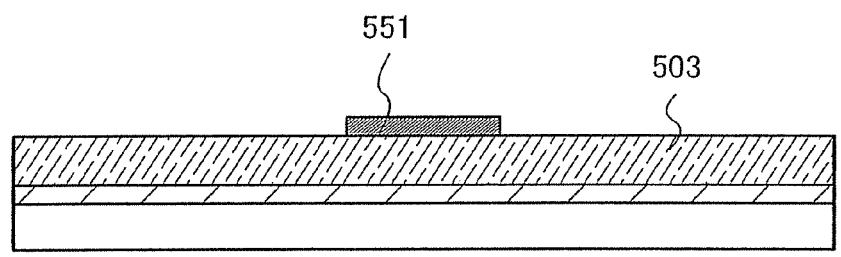

The laser beam 560, which passes through the photomask 554, is absorbed by the light absorption layer 550. The light absorption layer 550 is laser-ablated and removed in an irradiated region of the laser beam 560. That is, by energy of the laser beam 560 absorbed by the light absorption layer 550, the irradiated region of the light absorption layer 550 is laser-ablated, and the light absorption layer 550 in the irradiated region is removed. Accordingly, a light absorption layer 551 remains (FIG. 6B).

After irradiation with the laser beam 560, a gas such as N$_2$ or air may be jetted from the laser beam irradiation side, or washing using a liquid or the like which is an unreactive matter such as water may be conducted. Thus, by jetting a gas or washing with a liquid, a dust, a residue, or the like caused by ablation can be removed.

Figure 6C:
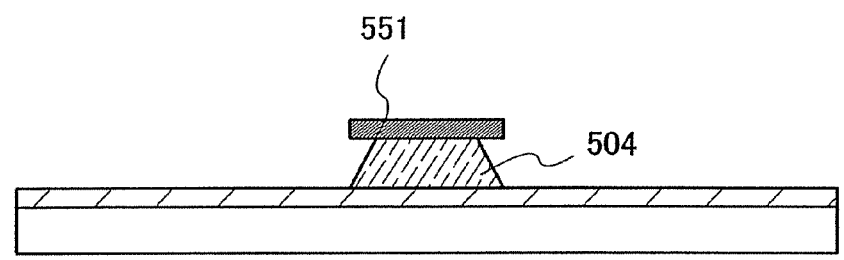

Next, a part of the conductive layer 503 is etched and removed using the light absorption layer 551 as an etching mask, so that the conductive layer 504 is formed (FIG. 6C). The conductive layer 504 may be formed by anisotropic etching or isotropic etching using a dry etching method or a wet etching method appropriately.

In this embodiment mode, the conductive layer 504 is formed by isotropic etching. The formed conductive layer 504 has a tapered side surface. For the isotropic etching, a wet etching method may be employed. A solution, which can obtain a high etching selectivity between the conductive layer 503 and the light absorption layer 551, is used as an etchant. For example, an acidic solution of hydrofluoric acid, phosphoric acid, nitric acid, acetic acid, sulfuric acid, or the like or an alkaline solution of potassium hydroxide, hydrazine, ethylenediamine, or the like can be used. Further, pure water or a buffering agent may be appropriately added to the etchant.

The side surface of the conductive layer can be etched into a tapered shape by using an ICP (Inductively Coupled Plasma) etching method and appropriately adjusting the etching condition (e.g., the amount of electric power applied to a coiled electrode, the amount of electric power applied to an electrode on a substrate side, or the temperature of the electrode on the substrate side). As the etching gas, a chlorine-based gas typified by $Cl_2$, $BCl_3$, $SiCl_4$, $CCl_4$, or the like; a fluorine-based gas typified by $CF_4$, $CHF_3$, $SF_6$, $NF_3$, or the like; or $O_2$ can be appropriately used. Further, an inert gas such as He or argon; an $O_2$ gas; or the like may appropriately be added to the etching gas.

For example, in the case of forming the conductive layer 503 using molybdenum, a wet etching method using an aluminum mixed acid solution can be conducted. In the case of forming the conductive layer 503 using tungsten, a wet etching method using an ammonia hydrogen peroxide mixture can be conducted.

The conductive layer 504 having a perpendicular side surface (sidewall) may also be formed by anisotropic etching. The base insulating layer 502 has an effect of preventing the substrate 500 from being etched in the case of using a dry etching method.

After forming the conductive layer 504 having a desired shape by etching, the light absorption layer 551 used as the mask is removed. The light absorption layer 551 may be removed by a removing method utilizing a dry etching method or a wet etching method, or a method that utilizes laser ablation by laser beam irradiation. In the case of utilizing laser ablation, it is preferable that a dust, a residue, or the like caused by ablation is removed by jetting a gas such as $N_2$ or washing using a liquid after the ablation.

Without using the method of forming a mask by utilizing laser ablation as described in Embodiment Mode 1 or the like, the conductive layer 504 may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. When using any of these methods, a conductive layer can be selectively formed in a desired place.

The conductive layer 504 may also be formed by a lithography technique that uses a photoresist.

The formed conductive layer 504 functions as a gate electrode layer of a completed transistor.

Figure 7A:
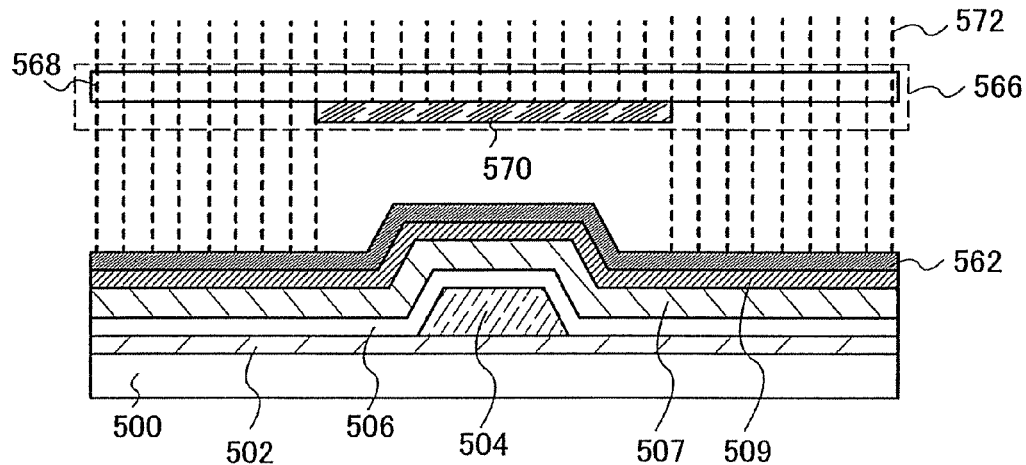
FIGS. 7A to 7C show an example of a manufacturing method of a semiconductor device of the present invention.

Next, the gate insulating layer 506 is formed over the conductive layer 504 (FIG. 7A).

The gate insulating layer 506 is formed of an insulating material such as silicon oxide, silicon nitride, silicon oxynitride, or silicon nitride oxide by a CVD method, a sputtering method, or the like. The gate insulating layer 506 may have a single layer structure or a stacked structure. For example, for the gate insulating layer 506, a single layer structure of a silicon oxynitride layer or a two-layer structure of a silicon nitride layer and a silicon oxide layer may be used. Alternatively, a stacked structure including three or more layers may be employed. Preferably, silicon nitride, which enables a dense film, is used. In the case where the conductive layer 504 positioned in a lower layer is formed using silver or copper by a droplet discharge method, the gate insulating layer 506 is preferably formed using silicon nitride or NiB. These films have an effect of preventing diffusion of an impurity and planarizing a surface. Note that a rare gas element such as argon may be included in a reaction gas when forming the gate insulating layer 506. When a rare gas element is included in a reaction gas, a dense insulating layer with little leakage current can be obtained at a low film formation temperature.

Then, a semiconductor layer is formed over the gate insulating layer 506 (FIG. 7A). In this embodiment mode, a stacked structure of a semiconductor layer 507 and a semiconductor layer 509 having one conductivity type is formed. The semiconductor layer 509 having one conductivity type may be formed according to need. It is preferable to form the semiconductor layer 509 having one conductivity type because favorable ohmic contact between the semiconductor layer forming a channel and a conductive layer functioning as a source electrode or a drain electrode can be obtained.

For example, an NMOS structure of an n-channel transistor can be manufactured by forming the semiconductor layer 509 having n-type conductivity over the semiconductor layer 507, or a PMOS structure of a p-channel transistor can be manufactured by forming the semiconductor layer 509 having p-type conductivity over the semiconductor layer 507. When an element imparting conductivity is added to the semiconductor layer 507 by doping to form an impurity region, an n-channel transistor or a p-channel transistor can be formed. Instead of forming the semiconductor layer 509 having n-type conductivity, plasma treatment with a $PH_3$ gas may be performed, so that conductivity may be imparted to the semiconductor layer 507.

A material for forming the semiconductor layer can be an amorphous semiconductor (hereinafter also referred to as "AS") formed by a vapor deposition method using a semiconductor source gas typified by silane or germane or a sputtering method, a polycrystalline semiconductor formed by crystallizing the amorphous semiconductor using light energy or thermal energy, a semi-amorphous semiconductor (also referred to as microcrystal and hereinafter also referred to as "SAS"), or the like. The semiconductor layer can be formed by various methods (a sputtering method, an LPCVD method, a plasma CVD method, and the like).

An SAS is a semiconductor having an intermediate structure between amorphous and crystalline (including single crystalline and polycrystalline) structures and a third state which is stable in terms of free energy. Moreover, an SAS includes a crystalline region with a short-distance order and lattice distortion. A crystal region having a diameter of 0.5 to 20 nm can be observed at least in a portion of the film. In a case where silicon is contained as a main component, Raman spectrum is shifted to the low wave number side that is lower than 520 $cm^{-1}$. The diffraction peaks of (111) and (220), which are believed to be derived from silicon crystal lattice, are observed by X-ray diffraction. An SAS contains hydrogen or halogen by at least 1 atomic % or more for terminating dangling bonds. An SAS is formed by glow discharge decomposition (plasma CVD) of a gas containing silicon. As the gas containing silicon, $SiH_4$ can be used, and alternatively, $Si_2H_6$, $SiH_2Cl_2$, $SiHCl_3$, $SiCl_4$, $SiF_4$, or the like can also be used. Further, $F_2$ or $GeF_4$ may be mixed. The gas containing silicon may be diluted with $H_2$, or $H_2$ and one or a plurality of kinds of rare gas elements of He, Ar, Kr, and Ne. The dilution ratio is 1:2 to 1:1000, pressure is approximately 0.1 to 133 Pa, and a power source frequency is 1 to 120 MHz, preferably, 13 to 60 MHz. A temperature for heating the substrate is preferably less than or equal to 300° C., and an SAS can also be formed at 100 to 200° C. It is preferable that the concentration of impurities of atmospheric components such as oxygen, nitrogen, and carbon as impurity elements entering the film in forming the film be less than or equal to $1 \times 10^{20}$ cm$^{-3}$. In particular, an oxygen concentration is preferably less than or equal to $5 \times 10^{19}$ cm$^{-3}$, and more preferably, less than or equal to $1 \times 10^{19}$ cm$^{-3}$. Further, when a rare gas element such as helium, argon, krypton, or neon is contained to further promote the lattice distortion, stability can be enhanced, and a favorable SAS can be obtained. Further, as the semiconductor layer, an SAS layer formed by using a hydrogen-based gas may be stacked over an SAS layer formed by using a fluorine-based gas.

As an example of a typical amorphous semiconductor, hydrogenated amorphous silicon can be given while polysilicon or the like can be given as an example of a typical crystalline semiconductor. Polysilicon (polycrystalline silicon) includes so-called high-temperature polysilicon formed using polysilicon which is formed at processing temperatures of greater than or equal to 800° C. as a main material, so-called low-temperature polysilicon formed using polysilicon which is formed at processing temperatures of less than or equal to 600° C. as a main material, polysilicon crystallized by being provided with an element which promotes crystallization or the like, and the like. Of course, as described above, a semi-amorphous semiconductor or a semiconductor which includes a crystalline phase in a portion of the film can also be used.

When a crystalline semiconductor such as a polycrystalline semiconductor or a semi-amorphous semiconductor is used for the semiconductor layer, the semiconductor layer may be formed by various methods such as a laser crystallization method, a thermal crystallization method, and a thermal crystallization method using an element such as nickel which promotes crystallization. Further, a microcrystalline semiconductor that is an SAS may be crystallized by laser irradiation to enhance crystallinity. In a case where silicon is used and an element which promotes crystallization is not added, before the amorphous silicon layer is irradiated with a laser beam, the amorphous silicon layer is heated at 500° C. for one hour in a nitrogen atmosphere to discharge hydrogen so that a hydrogen concentration in the amorphous silicon layer becomes less than or equal to $1 \times 10^{20}$ atoms/cm$^3$. This is because, if the amorphous silicon layer contains much hydrogen, the amorphous silicon layer may be broken by laser beam irradiation.

A method for introducing a metal element into the amorphous semiconductor layer is not particularly limited as long as it is a method for introducing the metal element to a surface or inside of the amorphous semiconductor layer. For example, a sputtering method, a CVD method, a plasma treatment method (including a plasma CVD method), an adsorption method, or a method for applying a solution of metal salt can be used. Among them, a method using a solution is simple and advantageous in that the concentration of the metal element can be easily controlled. At this time, it is desirable to form an oxide film on the surface of the amorphous semiconductor layer by UV light irradiation in an oxygen atmosphere, a thermal oxidation method, treatment with ozone water containing hydroxyl radical or a hydrogen peroxide solution, or the like to improve wettability of the surface of the amorphous semiconductor layer so that an aqueous solution can be diffused on the entire surface of the amorphous semiconductor layer.

In order to crystallize the amorphous semiconductor layer, heat treatment may be combined with crystallization by laser beam irradiation, or one of heat treatment and laser beam irradiation may be carried out multiple times.

Moreover, the crystalline semiconductor layer may be directly formed over the substrate by a plasma method. Furthermore, the crystalline semiconductor layer may be selectively formed over the substrate by a linear plasma method.

The semiconductor layer 507 can be formed of an organic semiconductor material. As the organic semiconductor material, a low-molecular material, a high-molecular material, or the like can be used. In addition, a material such as a conductive high-molecular material can also be used. For example, a π-electron conjugated high-molecular material of which skeletal structure includes a conjugated double bond can be used and specifically, polythiophene, polyfluorene, poly(3-alkylthiophene), a polythiophene derivative, or a soluble high-molecular material can be used. In addition, as the organic semiconductor material, there is a material which can form a semiconductor layer by forming a soluble precursor of the material and then performing a process thereon. As the organic semiconductor material, polythienylenevinylene, poly(2,5-thienylenevinylene), polyacetylene, a polyacetylene derivative, polyallylenevinylene, and the like can be used.

The precursor is changed into the organic semiconductor not only by heat treatment but also by addition of a reaction catalyst such as a hydrogen chloride gas. Moreover, as a typical solvent for dissolving the soluble organic semiconductor material, toluene, xylene, chlorobenzene, dichlorobenzene, anisole, chloroform, dichloromethane, γbutyllactone, butylcellosolve, cyclohexane, N-methyl-2-pyrrolidone (NMP), cyclohexanone, 2-butanon, dioxane, dimethylformamide (DMF), tetrahydrofuran (THF), or the like can be used.

In this embodiment mode, amorphous semiconductor layers are formed for the semiconductor layer 507 and the semiconductor layer 509 having one conductivity type. As the semiconductor layer 509 having one conductivity type, an n-type semiconductor layer, which contains phosphorus (P) that is an impurity element imparting n-type conductivity, is formed. The semiconductor layer 509 having one conductivity type functions as a source region and a drain region, and favorable ohmic contact between the semiconductor layer 507 and the conductive layer functioning as a source electrode or a drain electrode can be obtained because of the semiconductor layer 509. The semiconductor layer 509 having one conductivity type may be formed according to need, and an n-type semiconductor layer containing an impurity element imparting n-type conductivity (P, As) or a p-type semiconductor layer containing an impurity element imparting p-type conductivity (B) can be formed.

Next, a light absorption layer 562 is formed over the semiconductor layer 509. Then, irradiation with a laser beam 572 is conducted through a photomask 566 to a side of the light absorption layer 562. The laser beam 572 passes through a light-transmitting region 568 of the photomask 566 and is blocked at a light-blocking region 570 of the photomask 566 (FIG. 7A).

The light absorption layer 562 may be formed similarly to the above-described light absorption layer 550.

The photomask 566 includes the light-transmitting region 568 which transmits the laser beam 572 and the light-blocking region 570 which blocks the laser beam 572, and a desired pattern is formed by the light-transmitting region 568 and the light-blocking region 570. The semiconductor layer 507 and the semiconductor layer 509 having one conductivity type are processed correspondingly to a pattern formed in the photomask 566, specifically, a pattern of the light-blocking region 570, and a part of the semiconductor layers remains. For the photomask 566, a material in which the pattern is formed of a light-blocking material on a surface of a light-transmitting substrate, may be used. Note that similarly to the photomask 554, the light-blocking region 570 included in the photomask 566 is formed of a material superior in a light-blocking property and resistant to energy of the laser beam 572.

For the laser beam 572, a laser beam having such energy that can be absorbed by the light absorption layer 562 is appropriately selected, similarly to the above-described laser beam 560. Energy of the laser beam 572 is preferably in such a level that release of a gas in the light absorption layer 562, evaporation of the light absorption layer 562, or the like is caused.

Figure 7B:
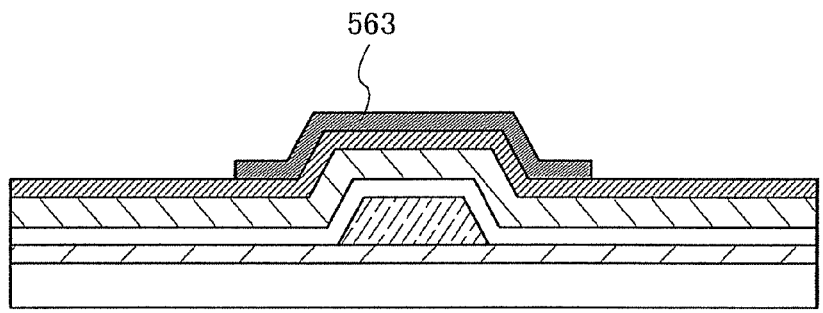

The laser beam 572, which passes through the photomask 566, is absorbed by the light absorption layer 562. The light absorption layer 562 is laser-ablated and removed in an irradiated region of the laser beam 572. That is, by energy of the laser beam 572 absorbed by the light absorption layer 562, the irradiated region of the light absorption layer 562 is laser-ablated and removed. Thus, a light absorption layer 563 remains (FIG. 7B). After irradiation with the laser beam 572, a gas such as $N_2$ may be jetted, or washing using a liquid may be conducted. Thus, a dust, a residue, or the like caused by ablation can be reduced.

Next, a part of the semiconductor layer 509 having one conductivity type and the semiconductor layer 507 is etched and removed using the light absorption layer 563 as a mask, so that a semiconductor layer 505 having one conductivity type and the semiconductor layer 508 are formed. The semiconductor layer 505 having one conductivity type and the semiconductor layer 508 may be formed by anisotropic etching or isotropic etching using a dry etching method or a wet etching method appropriately.

In this embodiment mode, the semiconductor layer 505 and the semiconductor layer 508 are formed by anisotropic etching. The semiconductor layer 505 and the semiconductor layer 508 each have a perpendicular side surface. For anisotropic etching, dry etching may be conducted using a chlorine-based gas typified by $Cl_2$, $BCl_3$, $SiCl_4$, $CCl_4$, or the like; a fluorine-based gas typified by $CF_4$, $CHF_3$, $SF_6$, $NF_3$, or the like; $O_2$; or the like.

Figure 7C:
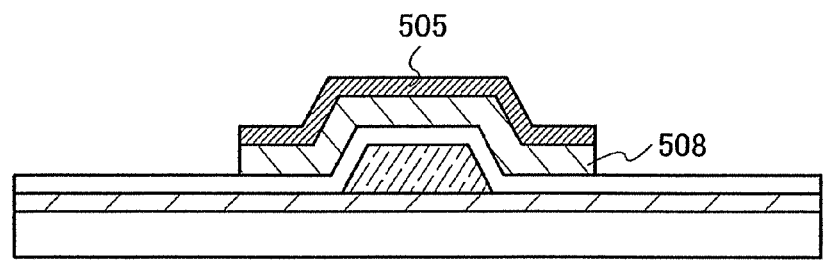

After forming the semiconductor layer 505 and the semiconductor layer 508 each having a desired shape, the light absorption layer 563 used as the mask is removed (FIG. 7C).

The light absorption layer 563 may be removed by a removing method utilizing a dry etching method or a wet etching method, or a method that utilizes laser ablation by laser beam irradiation. In the case of utilizing laser ablation, a dust, a residue, or the like caused by ablation can be reduced by jetting a gas such as $N_2$ or washing using a liquid.

Without using the method described in Embodiment Mode 1 or the like, the semiconductor layer 505 or the semiconductor layer 508 may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. When using any of these methods, the semiconductor layer can be selectively formed in a desired place.

The semiconductor layer 505 or the semiconductor layer 508 may also be formed by a lithography technique that uses a photoresist.

The semiconductor layer 508 forms a channel of a completed transistor. Further, the semiconductor layer 505 forms a source region and a drain region of the completed transistor.

Figure 8A:
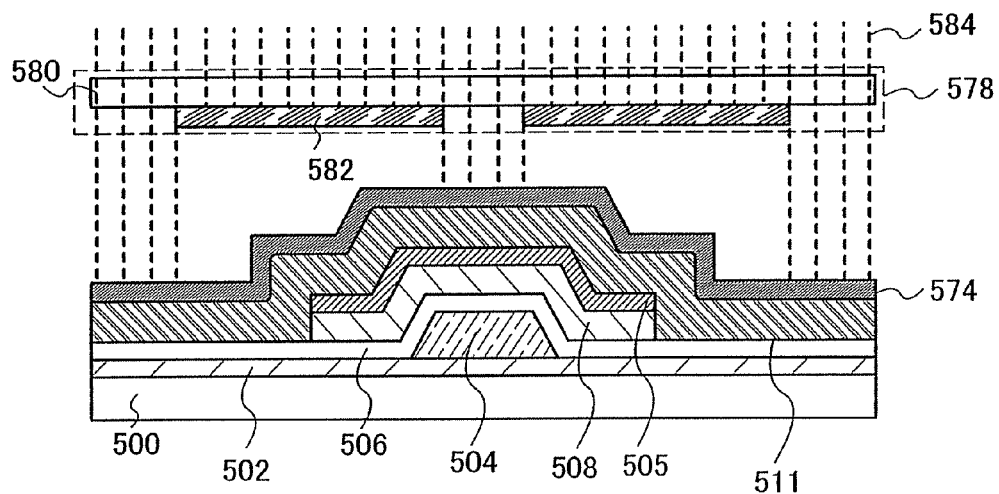
FIGS. 8A to 8C show an example of a manufacturing method of a semiconductor device of the present invention.

Then, a conductive layer 511 is formed over the semiconductor layer 505 (FIG. 8A). A part of the conductive layer 511 functions as a source electrode or a drain electrode of the completed transistor.

For the conductive layer 511, an element selected from silver (Ag), gold (Au), copper (Cu), tungsten (W), aluminum (Al), molybdenum (Mo), tantalum (Ta), or titanium (Ti); an alloy material or a compound material containing the element as its main component; or the like can be used. Further, light-transmitting indium tin oxide (ITO), indium tin oxide containing silicon oxide, organic indium, organic tin, zinc oxide, titanium nitride, or the like may be combined. Further, the conductive layer 511 may have either a single layer structure or a stacked structure.

The conductive layer 511 can be formed by a sputtering method, a physical vapor deposition (PVD) method, a chemical vapor deposition (CVD) method such as a low pressure CVD (LPCVD) method or a plasma CVD method, or the like.

Next, a light absorption layer 574 is formed over the conductive layer 511. Then, irradiation with a laser beam 584 is conducted through a photomask 578 to a side of the light absorption layer 574. The laser beam 584 passes through a light-transmitting region 580 of the photomask 578 and is blocked at a light-blocking region 582 of the photomask 578 (FIG. 8A).

The light absorption layer 574 may be formed similarly to the above-described light absorption layers 550 and 562.

The photomask 578 includes the light-transmitting region 580 which transmits the laser beam 584 and the light-blocking region 582 which blocks the laser beam 584, and a desired pattern is formed by the light-transmitting region 580 and the light-blocking region 582. In more detail, the conductive layer 511 and the semiconductor layer 505 having one conductivity type are processed correspondingly to a pattern of the light-blocking region 582 and a part of the layers remains. For the photomask 578, a material in which the pattern is formed of a light-blocking material on a surface of a light-transmitting substrate, may be used. Note that the light-blocking region 582 for forming the photomask 578 is formed of a material superior in a light-blocking property and resistant to energy of the laser beam 584, similarly to the photomask 554 or 566.

For the laser beam 584, a laser beam having such energy that can be absorbed by the light absorption layer 574 is appropriately selected, similarly to the above-described laser beams 560 and 572. Energy of the laser beam 584 is preferably in such a level that release of a gas in the light absorption layer 574, evaporation of the light absorption layer 574, or the like is caused.

Figure 8B:
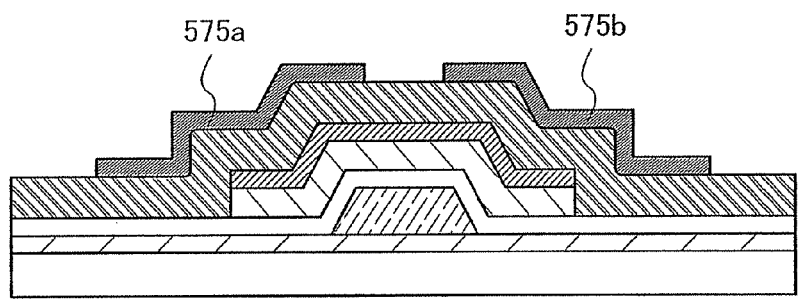

The laser beam 584, which passes through the photomask 578, is absorbed by the light absorption layer 574. The light absorption layer 574 is laser-ablated and removed in an irradiated region of the laser beam 584. That is, by energy of the laser beam 584 absorbed by the light absorption layer 574, the irradiated region of the light absorption layer 574 is laser-ablated and removed. Thus, a light absorption layer 575a and a light absorption layer 575b remain (FIG. 8B). After irradiation with the laser beam 584, a gas such as $N_2$ may be jetted, or washing using a liquid may be conducted. Thus, a dust, a residue, or the like caused by ablation can be reduced.

Figure 8C:
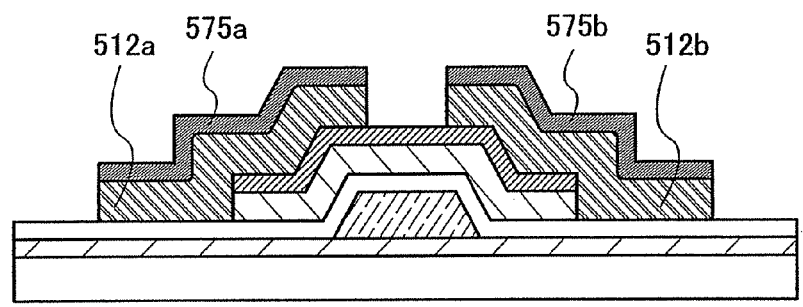

Next, a part of the conductive layer 511 is etched and removed using the light absorption layers 575a and 575b as masks (FIG. 8C). The semiconductor layer 511 may be formed by anisotropic etching or isotropic etching using a dry etching method or a wet etching method appropriately.

In this embodiment mode, the conductive layers 512a and 512b each having a perpendicular side surface are formed by anisotropic etching. For anisotropic etching, dry etching may be conducted using an etching gas such as a chlorine-based gas typified by $Cl_2$, $BCl_3$, $SiCl_4$, $CCl_4$, or the like; a fluorine-based gas typified by $CF_4$, $CHF_3$, $SF_6$, $NF_3$, or the like; $O_2$; or the like.

Figure 9A:
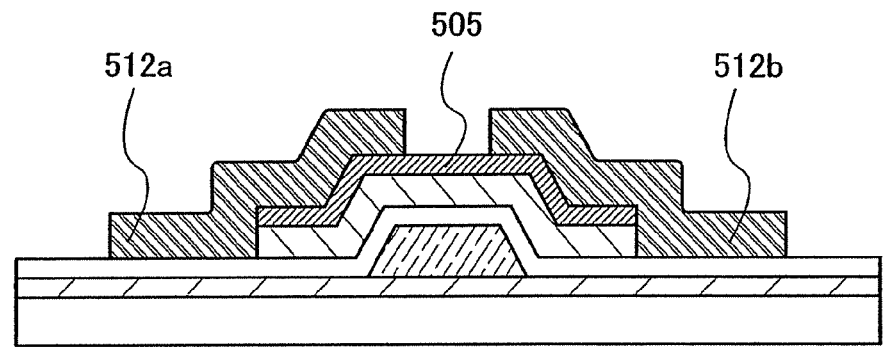
FIGS. 9A and 9B show an example of a manufacturing method of a semiconductor device of the present invention.

After forming the conductive layers 512a and 512b each having a desired shape, the light absorption layers 575a and 575b used as the masks are removed (FIG. 9A).

The light absorption layers 575a and 575b may be removed by a removing method utilizing a dry etching method or a wet etching method, or a method that utilizes laser ablation by laser beam irradiation. In the case of utilizing laser ablation, a dust, a residue, or the like caused by laser ablation can be reduced by jetting a gas such as $N_2$ or air or washing using a liquid.

Without using the method of forming a mask by utilizing laser ablation caused by laser beam irradiation as described in Embodiment Mode 1 or the like, the conductive layers 512a and 512b may be formed by various printing methods (a method by which a desired pattern is formed, such as screen (mimeograph) printing, offset (planographic) printing, relief printing, or gravure (intaglio) printing), a nanoimprint method, a droplet discharge method, a dispenser method, a selective coating method, or the like. When using any of these methods, the conductive layer can be selectively formed in a desired place.

The conductive layers 512a and 512b may also be formed by a lithography technique that uses a photoresist.

Each of the conductive layers 512a and 512b functions as a source region or a drain region of the completed transistor.

Figure 9B:
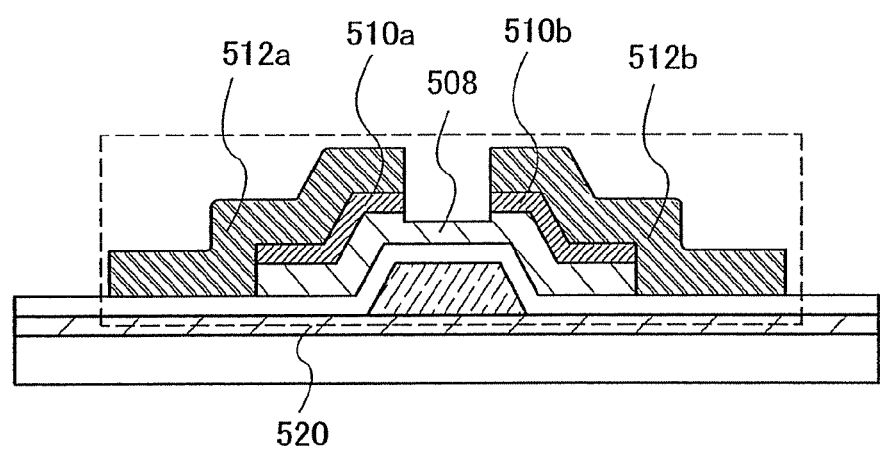

Next, using the conductive layers 512a and 512b as masks, a part of the semiconductor layer 505 having one conductivity type is etched and removed, so that a part of the semiconductor layer 508 is exposed (FIG. 9B). Etching of the semiconductor layer 505 having one conductivity type may be conducted by appropriately using a dry etching method or a wet etching method. In the case of employing a dry etching method, there is a case where a portion where the semiconductor layer 508 is exposed is also etched to some extent, thereby reducing the thickness thereof and the exposed portion becomes depressed relative to other portions of the semiconductor layer 508.

Through the above-described processes, a transistor 520, that is an inverted staggered transistor (also called a bottom gate transistor), can be manufactured (FIG. 9B).

In this embodiment mode, a pattern is formed utilizing ablation by laser beam irradiation in various processes. However, the present invention is not limited to this and a pattern may be formed by a lithography technique that uses a photoresist. Of course, other techniques which can selectively form a pattern may be used. One feature of the present invention is to use in at least one manufacturing process a method of obtaining a desired pattern by forming a mask by utilizing ablation by laser beam irradiation and conducting processing by etching using the mask.

By employing the present invention, a transistor can be manufactured while reducing the number of lithography processes that use a photoresist. Accordingly, a lithography process can be simplified, which improves throughput.

In addition, by employing the present invention, contamination due to an impurity included in a photoresist can be prevented and a characteristic deterioration of a transistor can be prevented. Accordingly, a highly reliable semiconductor device can be obtained.

Further, when a linear laser beam or a planar laser beam having a large area such as a rectangular laser beam or a circular laser beam is used, a plurality of regions can be irradiated with a laser beam in a short time. Accordingly, by employing the present invention to a large-area substrate, many patterns can be formed in a short time, and a semiconductor device can be manufactured with high productivity.

This embodiment mode can be freely combined with any of Embodiment Modes 1 to 3.

Embodiment Mode 5

In Embodiment Mode 5, a method for manufacturing an inverted staggered transistor, which is different from that of Embodiment Mode 4, will be described with reference to FIGS. 21A to 21D and 22A to 22D. It is to be noted that the same structures as in Embodiment Mode 4 are denoted by the same reference numerals, and explanation thereof will be partially omitted or simplified.

Over a substrate 500, a base insulating layer 502 and a conductive layer 504 are formed as shown in Embodiment Mode 4 (refer to FIG. 6C). The conductive layer 504 functions as a gate electrode.

Figure 21A:
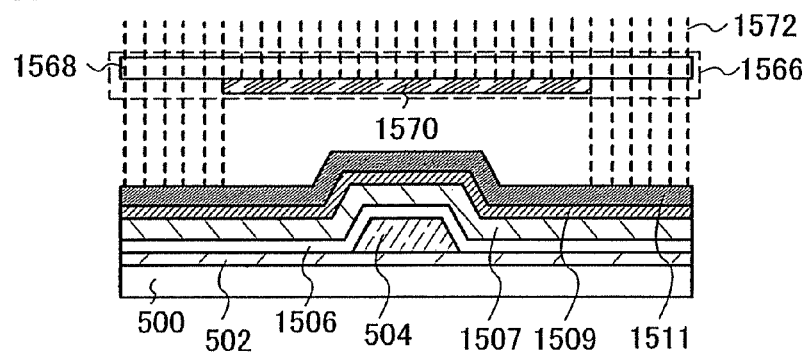
FIGS. 21A to 21D show an example of a manufacturing method of a semiconductor device of the present invention.
Figure 21B:
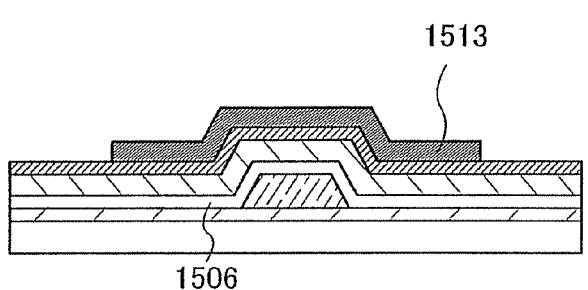

Over the conductive layer 504, a gate insulating layer 1506, a semiconductor layer 1507, a semiconductor layer 1509 having one conductivity type, and a light absorption layer 1511 are sequentially formed to be stacked (refer to FIG. 21A).

The gate insulating layer 1506 may be formed similarly to the gate insulating layer 506 shown in Embodiment Mode 4. For example, the gate insulating layer 1506 may be formed by a CVD method, a sputtering method, or the like using an insulating material such as silicon oxide, silicon nitride, silicon oxynitride, or silicon nitride oxide with a single layer structure or a stacked layer structure.

The semiconductor layer 1507 and the semiconductor layer 1509 having one conductivity type may be formed similarly to the semiconductor layer 507 and the semiconductor layer 509 having one conductivity type shown in Embodiment Mode 4. For example, the semiconductor layer 1507 and the semiconductor layer 1509 having one conductivity type may be formed by a sputtering method or a CVD method using a semiconductor material such as silicon or silicon-germanium with a single layer structure or a stacked layer structure. In addition, the semiconductor layer 1507 may be an amorphous semiconductor or a crystalline semiconductor. The crystalline semiconductor can be formed by crystallizing the amorphous semiconductor by a laser crystallization method, a thermal crystallization method, a thermal crystallization method using an element which promotes crystallization such as nickel, or the like.

The semiconductor layer 1509 having one conductivity type may be formed as needed. By providing the semiconductor layer 1509 having one conductivity type, ohmic contact between the semiconductor layer 1507 forming a channel and a conductive layer functioning as a source electrode or a drain electrode can be favorable.

The light absorption layer 1511 is formed using a conductive material which can absorb a laser beam 1572. For example, the light absorption layer 1511 is formed using a conductive material, a semiconductor material, or an insulating material. Specifically, the light absorption layer 1511 is formed by an evaporation method, a sputtering method, a CVD method, or the like using a conductive material such as an element, e.g. chromium (Cr), molybdenum (Mo), nickel (Ni), titanium (Ti), cobalt (Co), copper (Cu), or aluminum (Al), or an alloy material or a compound (such as a nitrogen compound, an oxygen compound, a carbon compound, or a halogen compound) containing the element as its main component. In addition, as the light absorption layer 1511, a semiconductor material such as silicon, germanium, silicon-germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate; an organic resin material such as polyimide, acrylic, polyamide, polyimide amide, resist, or benzocyclobutene; an insulating material such as siloxane or polysilazane can be used. Further, zinc sulfide, silicon nitride, mercury sulfide, aluminum chloride, or the like can also be used. When the light absorption layer 1511 is formed using an insulating material, a coating method may be used. Furthermore, the light absorption layer 1511 may have either a single layer structure or a stacked layer structure. In this embodiment mode, part of the light absorption layer 1511 is used as a source electrode or a drain electrode of a transistor which will be completed.

Then, the light absorption layer 1511 side of the substrate 500 is irradiated with the laser beam 1572 through a photomask 1566. The laser beam 1572 is transmitted through a light-transmitting region 1568 of the photomask 1566 and blocked in a light-blocking region 1570 (refer to FIG. 21A).

The photomask 1566 includes the light-transmitting region 1568 which transmits the laser beam 1572 and the light-blocking region 1570 which blocks the laser beam 1572, and the light-transmitting region 1568 and the light-blocking region 1570 form a desired pattern. For example, for the photomask 1566, a material in which the pattern is formed of a light-blocking material on a surface of a light-transmitting substrate, may be used. It is to be noted that the light-blocking region 1570 included in the photomask 1566 is formed using a material favorable in a light-blocking property and resistant to energy of the laser beam 1572.

As the laser beam 1572, a laser beam which has such energy that can be absorbed by the light absorption layer 1511 is appropriately selected. Typically, a laser beam of an ultraviolet region, a visible region, or an infrared region is appropriately selected for irradiation. Specific laser oscillators are based on those in Embodiment Mode 4.

A cross-sectional shape of the laser beam 1572 may be a circular shape, an elliptic shape, a rectangular shape, or a linear shape (in a strict sense, a narrow rectangular shape) appropriately, and the laser beam 1572 is preferably shaped to have such a cross-sectional shape with an optical system.

In addition, energy of the laser beam 1572 preferably has such a level that can cause a gas in the light absorption layer 1511 to be discharged or the light absorption layer 1511 to be evaporated.

The laser beam 1572 which is transmitted through the photomask 1566 is absorbed by the light absorption layer 1511. A region of the light absorption layer 1511 which is irradiated with the laser beam 1572 is laser-ablated and removed. Then, a light absorption layer 1513 remains (refer to FIG. 21B). It is to be noted that jetting of a gas such as $N_2$ or air or washing with a liquid may be performed after irradiation with the laser beam 1572.

Figure 21C:
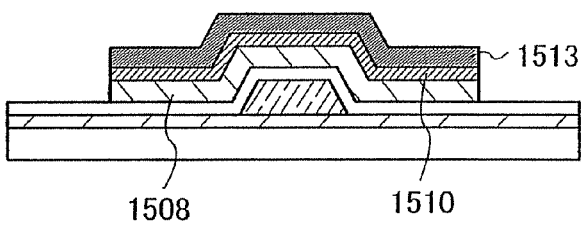
Figure 21D:
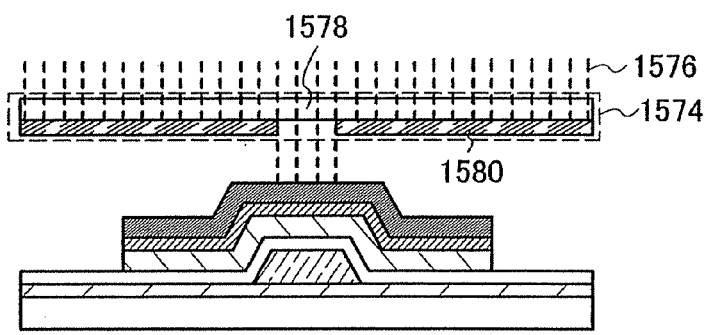

With the light absorption layer 1513 as a mask, parts of the semiconductor layer 1509 having one conductivity type and the semiconductor layer 1507 are removed by etching, and a semiconductor layer 1510 having one conductivity type and a semiconductor layer 1508 are formed (refer to FIG. 21C). The semiconductor layer 1510 having one conductivity type and the semiconductor layer 1508 may be subjected to anisotropic etching or isotropic etching by appropriately employing a dry etching method or a wet etching method.

In this embodiment mode, anisotropic etching is performed, so that the semiconductor layer 1508 and the semiconductor layer 1510 having one conductivity type with a perpendicular side surface are formed. Anisotropic etching may be performed by dry etching using a chlorine based gas typified by $Cl_2$, $BCl_3$, $SiC_4$, or $CCl_4$, a fluorine based gas typified by $CF_4$, $CHF_3$, $SF_6$, or $NF_3$, $O_2$, or the like.

Then, the light absorption layer 1513 side of the substrate 500 is irradiated with a laser beam 1576 through a photomask 1574. The laser beam 1576 is transmitted through a light-transmitting region 1578 of the photomask 1574 and blocked in a light-blocking region 1580 (refer to FIG. 21D).

In the photomask 1574, the light-transmitting region 1578 and the light-blocking region 1580 form a desired pattern. For the photomask 1574, a material in which the pattern is formed of a light-blocking material on a surface of a light-transmitting substrate, may be used. It is to be noted that the light-blocking region 1580 included in the photomask 1574 is formed using a material favorable in a light-blocking property and resistant to energy of the laser beam 1576, similarly to the photomask 1566.

As the laser beam 1576, similarly to the laser beam 1572, a laser beam which has such energy that can be absorbed by the light absorption layer 1513 (light absorption layer 1511) may be appropriately selected. In addition, the energy of the laser beam 1576 preferably has such a level that can cause a gas in the light absorption layer 1513 to be discharged or the light absorption layer 1513 to be evaporated.

The laser beam 1576 which is transmitted through the photomask 1574 is absorbed by the light absorption layer 1513. A region of the light absorption layer 1513 which is irradiated with the laser beam 1576 is laser-ablated and removed. Then, light absorption layers 1512a and 1512b remain (refer to FIG. 22A). The light absorption layers 1512a and 1512b are separated. Jetting of a gas such as $N_2$ or air or washing with a liquid may be performed after irradiation with the laser beam 1576. Accordingly, dusts, residues, and the like due to ablation can be reduced.

Figure 22A:
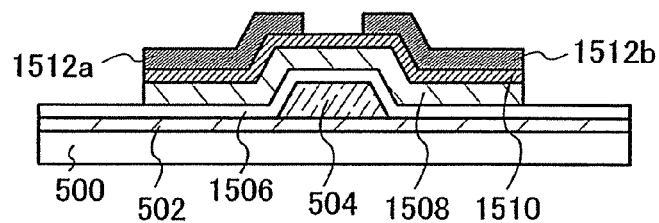
FIGS. 22A to 22D show an example of a manufacturing method of a semicondcutor device of the present invention.
Figure 22B:
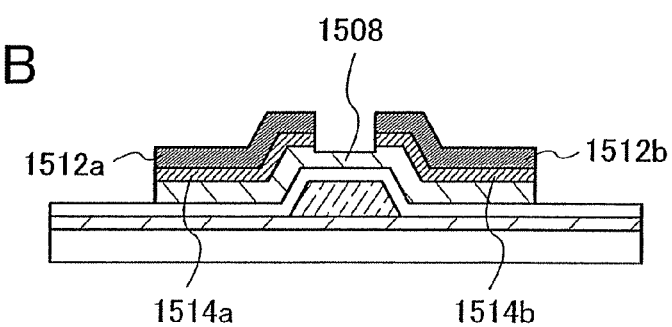

With the light absorption layers 1512a and 1512b as masks, the semiconductor layer 1510 having one conductivity type is etched so that part of the semiconductor layer 1508 is exposed, and semiconductor layers 1514a and 1514b having one conductivity type are formed (refer to FIG. 22B). Etching may be performed by anisotropic etching or isotropic etching utilizing a dry etching method or a wet etching method.

In this embodiment mode, anisotropic etching is performed, so that the light absorption layers 1512a and 1512b, and the semiconductor layers 1514a and 1514b having a perpendicular side surface are formed. For example, anisotropic etching may be performed by dry etching using an etching gas such as a chlorine based gas typified by $Cl_2$, $BCl_3$, $SiCl_4$, or $CCl_4$, a fluorine based gas typified by $CF_4$, $SF_6$, or $NF_3$, $O_2$, or the like. When dry etching is performed, a portion where the semiconductor layer 1508 is exposed is etched to some extent, thereby reducing the thickness thereof and the exposed portion becomes depressed relative to other portions of the semiconductor layer 1508.

Figure 22C:
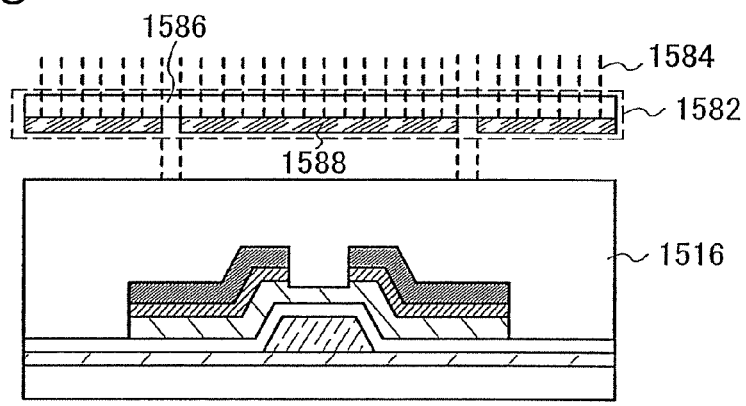

Next, an interlayer insulating layer 1516 is formed over the light absorption layers 1512*a* and 1512*b* (refer to FIG. 22C).

The interlayer insulating layer 1516 is formed of a material that can transmit a laser beam. For example, the insulating layer 1516 is formed by a sputtering method, a CVD method, or the like using a light-transmitting inorganic insulating material such as silicon oxide, silicon nitride, silicon oxynitride, or silicon nitride oxide. Alternatively, the insulating layer 1516 may be formed using a light-transmitting organic insulating material such as polyimide, acrylic, polyamide, polyimide amide, resist, or benzocyclobutene.

Then, the insulating layer 1516 side of the substrate 500 is irradiated with a laser beam 1584 through a photomask 1582. The laser beam 1584 is transmitted through a light-transmitting region 1586 of the photomask 1582 and blocked in a light-blocking region 1588 (refer to FIG. 22C).

In the photomask 1582, the light-transmitting region 1586 and the light-blocking region 1588 form a desired pattern. For example, for the photomask 1582, a material in which the pattern is formed of a light-blocking material on a surface of a light-transmitting substrate, may be used. It is to be noted that the light-blocking region 1588 included in the photomask 1582 is formed using a material favorable in a light-blocking property and resistant to energy of the laser beam 1584, similarly to the photomask 1566.

As the laser beam 1584, similarly to the laser beam 1572, a laser beam which has such energy that can be absorbed by the light absorption layers 1512*a* and 1512*b* (light absorption layer 1513) may be appropriately selected. In addition, energy of the laser beam 1584 preferably has such a level that can cause a gas in the light absorption layers 1512*a* and 1512*b* to be discharged or the light absorption layers 1512*a* and 1512*b* to be evaporated.

The laser beam 1584 which is transmitted through the photomask 1582 is transmitted through the insulating layer 1516 and absorbed by the light absorption layers 1512*a* and 1512*b*. The light absorption layers 1512*a* and 1512*b* are subjected to laser ablation in an irradiated region with the laser beam 1584, and the insulating layer 1516 in the irradiated region, that is located in an upper layer, is removed together with the light absorption layers 1512*a* and 1512*b*.

After irradiation with the laser beam 1584, jetting of a gas such as $N_2$ or air, or washing with a liquid may be performed. Accordingly, dusts, residues, and the like due to ablation can be reduced.

Note that an opening may be formed in the insulating layer 1516 by a lithography technique that uses a photoresist. In that case, the material of the insulating layer is not limited to a light-transmitting material that transmits a laser beam.

Figure 22D:
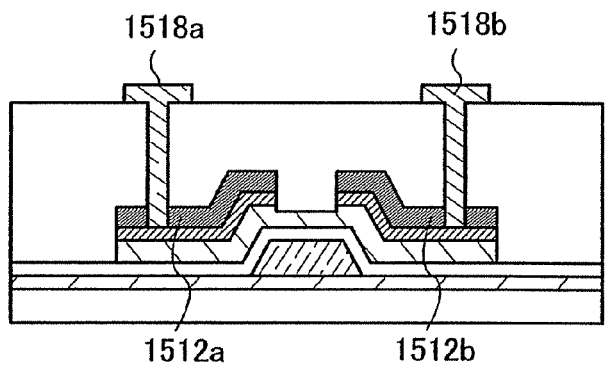

Next, conductive layers 1518*a* and 1518*b* are formed over the insulating layer 1516 and in openings formed in the insulating layer 1516 and the light absorption layers 1512*a* and 1512*b* (refer to FIG. 22D). The conductive layer 1518*a* is electrically connected to the light absorption layer 1512*a* and the semiconductor layer 1514*a*, and the conductive layer 1518*b* is electrically connected to the light absorption layer 1512*b* and the semiconductor layer 1514*b*.

The conductive layers 1518*a* and 1518*b* may be formed using a conductive material such as an element, e.g. silver (Ag), gold (Au), aluminum (Al), titanium (Ti), molybdenum (Mo), tungsten (W), chromium (Cr), or copper (Cu), or an alloy material or a compound containing the element as its main component. In addition, indium tin oxide (ITO), indium tin oxide containing silicon oxide (ITSO), organic indium, organic tin, zinc oxide, titanium nitride, or the like may also be combined.

Through the above processes, an inverted staggered transistor can be manufactured.

Although a pattern is formed utilizing ablation by laser beam irradiation in various processes in this embodiment mode, the present invention is not limited thereto, and a lithography technique using a photoresist material may also be used. Of course, other techniques by which a pattern can be selectively formed may be used. The present invention has a feature that a method in which a mask is formed utilizing ablation by laser beam irradiation and a desired pattern is obtained by etching using the mask is used in at least one manufacturing process.

By employing the present invention, a transistor can be manufactured with the reduced number of lithography processes using a photoresist. Therefore, a lithography process can be simplified, and the throughput can be improved.

Further, by employing the present invention, contamination due to impurities contained in a photoresist can be prevented, and deterioration in transistor characteristics can be prevented. As a result, a highly reliable semiconductor device can be manufactured.

In addition, with the use of a linear laser beam or a planar laser beam having a large area such as a rectangular laser beam or a circular laser beam, a plurality of regions can be irradiated with a laser beam in a short time. Therefore, by applying the present invention to a large-area substrate, a lot of patterns can be formed in a short time, whereby a semiconductor device can be manufactured with high productivity.

This embodiment mode can be appropriately combined with any of Embodiment Modes 1 to 4.

Embodiment Mode 6

A structure of a display panel according to the present invention will be described in this embodiment mode.

Figure 17A:
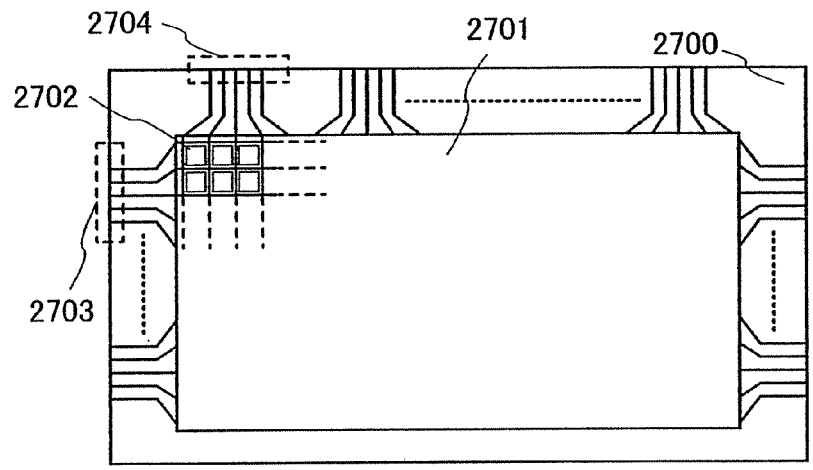
FIGS. 17A to 17C are top views of display devices of the present invention.

FIG. 17A is a top view showing a structure of a display panel according to the present invention. A pixel portion 2701 in which pixels 2702 are arranged in a matrix, a scanning line input terminal 2703, and a signal line input terminal 2704 are formed over a substrate 2700 having an insulating surface. The number of pixels may be determined in accordance with various standards. In the case of XGA full-color display using RGB, the number of pixels may be 1024×768×3 (RGB). In the case of UXGA full-color display using RGB, the number of pixels may be 1600×1200×3 (RGB), and in the case of full-spec, high-definition, and full-color display using RGB, the number of pixels may be 1920×1080×3 (RGB).

The pixels 2702 are arranged in a matrix by intersections of scanning lines extended from the scanning line input terminal 2703 and signal lines extended from the signal line input terminal 2704. Each pixel 2702 in the pixel portion 2701 is provided with a switching element and a pixel electrode connected to the switching element. A typical example of the switching element is a transistor. A gate electrode side of the transistor is connected to the scanning line, and a source or drain electrode side of the transistor is connected to the signal line, which enables each pixel to be independently controlled by a signal inputted from an external portion.

Figure 18A:
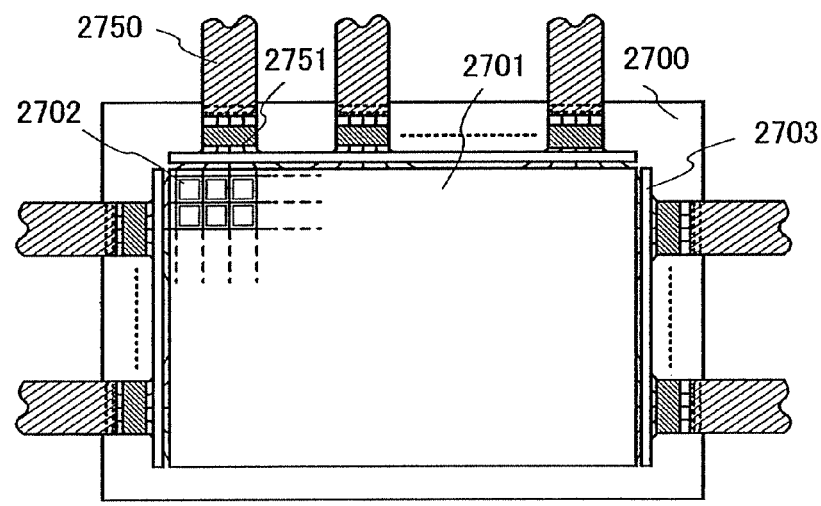
FIGS. 18A and 18B are top views of display devices of the present invention.
Figure 18B:
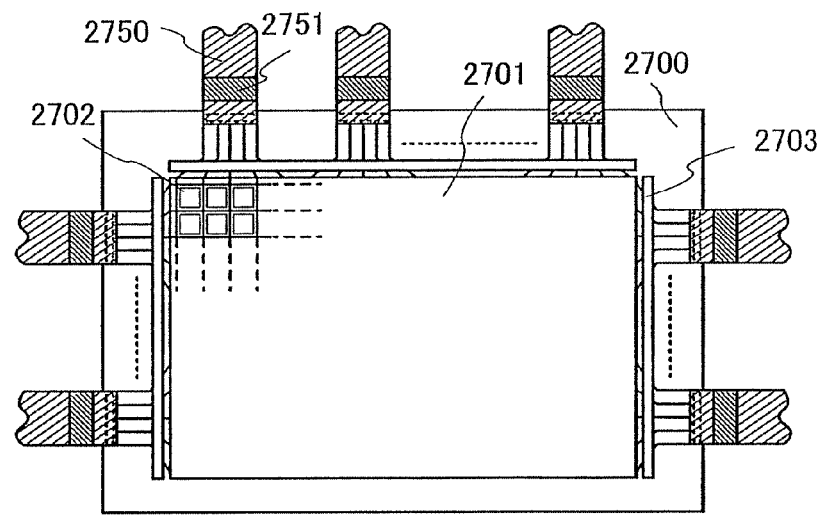

FIG. 17A shows a structure of a display device in which a signal to be inputted to the scanning line and the signal line is controlled by an external driver circuit. Alternatively, a driver IC 2751 may be mounted on the substrate 2700 by a COG (Chip On Glass) method as shown in FIG. 18A. As another mounting mode, a TAB (Tape Automated Bonding) method may be used as shown in FIG. 18B. The driver IC may be formed using a single crystalline semiconductor substrate or may be formed using a transistor over a glass substrate. In each of FIGS. 18A and 18B, the driver IC 2751 is connected to an FPC (Flexible Printed Circuit) 2750.

Figure 17B:
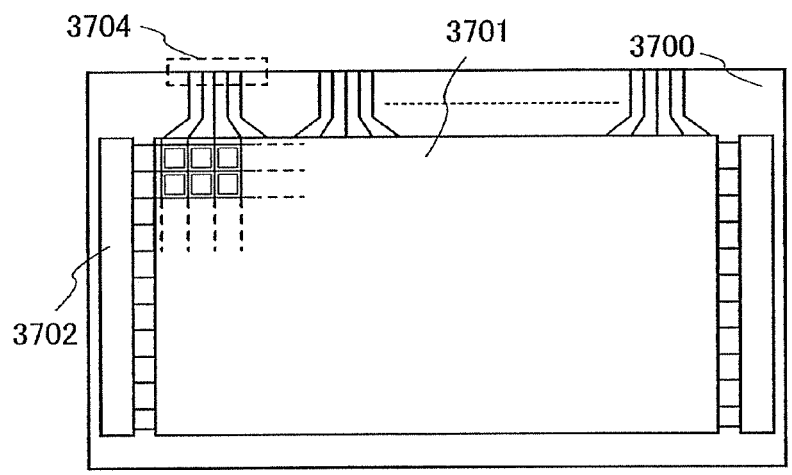
Figure 17C:
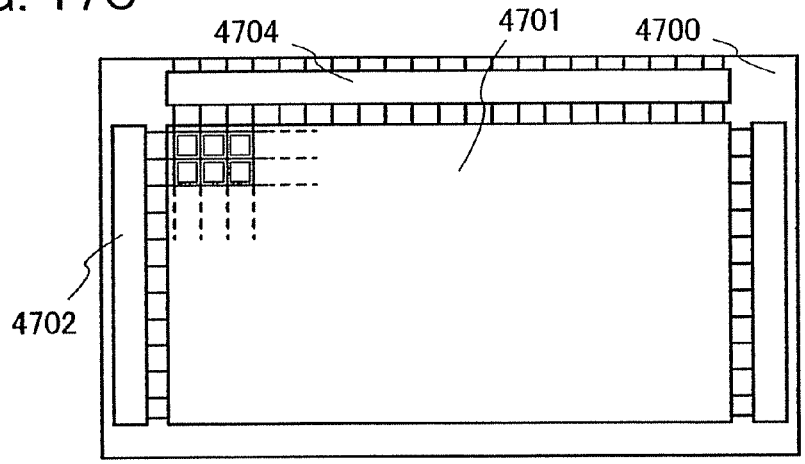

When a transistor provided in a pixel is formed of a polycrystalline (microcrystalline) semiconductor with high crystallinity, a scanning line driver circuit 3702 can be formed over a substrate 3700 as shown in FIG. 17B. In FIG. 17B, reference numeral 3701 denotes a pixel portion, and a signal line driver circuit is controlled by an external driver circuit, similarly to FIG. 17A. When the transistor provided in a pixel is formed of a polycrystalline (microcrystalline) semiconductor, a single crystalline semiconductor, or the like having high mobility, a pixel portion 4701, a scanning line driver circuit 4702, and a signal line driver circuit 4704 can all be formed over a glass substrate 4700 as shown in FIG. 17C. In this embodiment mode, the present invention utilizing laser ablation for forming a desired pattern as shown in Embodiment Modes 1 to 5 can be applied to the transistor provided in the pixel and the like.

By employing the present invention, a transistor can be manufactured with the reduced number of lithography processes using a photoresist. Therefore, a lithography process can be simplified, and the throughput in manufacturing a display panel can be improved.

Further, since processes using photoresists can be reduced, contamination due to impurities contained in the photoresist can be prevented, whereby a highly reliable display panel can be manufactured.

Embodiment Mode 7

In Embodiment Mode 7, one mode of a method for manufacturing a display device, which includes an inverted staggered transistor manufactured by employing the present invention, will be described with reference to FIGS. 11A to 11C, and 12A to 12C. In particular, a method for manufacturing a display device including a light-emitting element will be described. It is to be noted that the same structures as in the above embodiment modes are denoted by the same reference numerals, and explanation thereof will be partially omitted or simplified.

First, the transistor 520 shown in Embodiment Mode 4 is formed over a substrate 5000 with a base insulating layer 5002 interposed. Next, an insulating layer 5010 is formed so as to cover the transistor 520 (refer to FIG. 11A).

As the substrate 5000, a glass substrate made of barium borosilicate glass, aluminoborosilicate glass, or the like; a quartz substrate; a sapphire substrate; a ceramic substrate; or a plastic substrate which can withstand the process temperature of the manufacturing process of this embodiment mode is used. The surface of the substrate 5000 may be polished by a CMP method or the like so as to be planarized.

The base insulating layer 5002 is formed by various methods such as a CVD method, a sputtering method, and a spin coating method using an insulating material such as silicon oxide, silicon nitride, silicon oxynitride, or silicon nitride oxide with a single layer structure or a stacked layer structure. The base insulating layer 5002 is not necessarily formed; however, it has an effect of blocking contamination substances from the substrate 5000.

The insulating layer 5010 can be formed by a sputtering method, a PVD (Physical Vapor Deposition) method, a CVD (Chemical Vapor Deposition) method such as a low pressure CVD (LPCVD) method or a plasma CVD method, a spin coating method, or the like.

The insulating layer 5010 can also be formed using a material such as silicon oxide, silicon nitride, silicon oxynitride, aluminum oxide, aluminum nitride, aluminum oxynitride, diamond-like carbon (DLC), nitrogen-containing carbon, polysilazane, or other substances containing an inorganic insulating material. A material containing siloxane may also be used. Further, an organic insulating material such as polyimide, acrylic, polyamide, polyimide amide, resist, or benzocyclobutene can also be used. In addition, an oxazole resin can be used, and for example, photo-curable type polybenzoxazole or the like can be used.

Figure 11A:
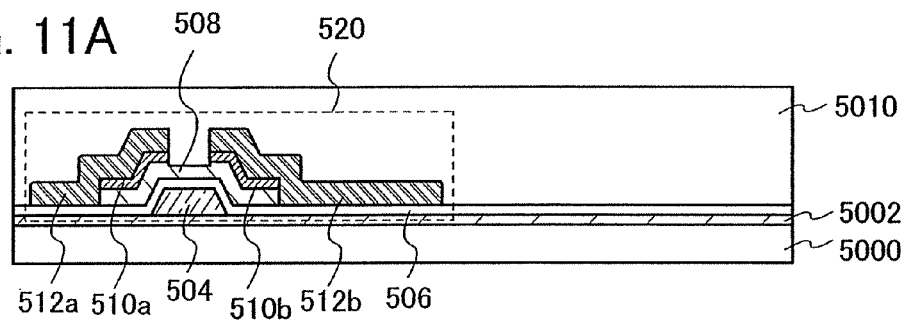
FIGS. 11A to 11C show an example of a manufacturing method of a display device of the present invention.
Figure 11B:
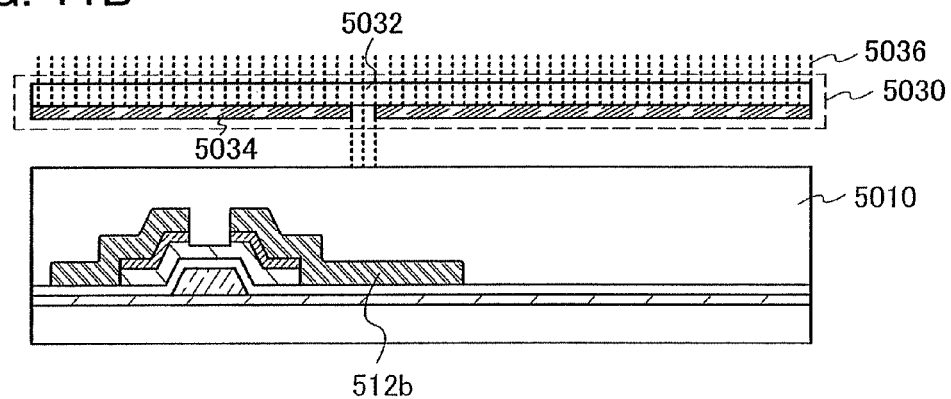
Figure 11C:
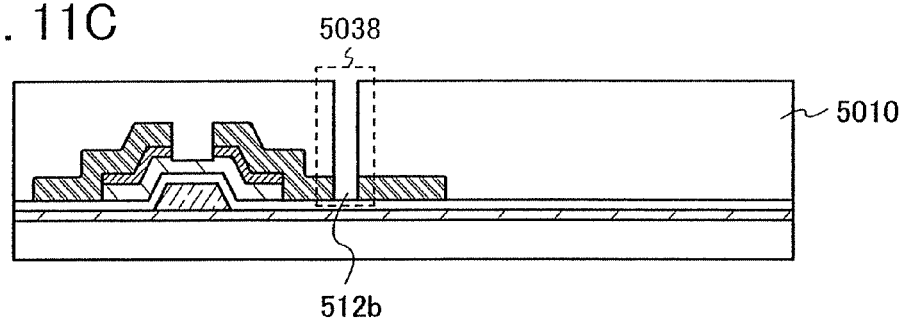

Next, an opening 5038 which reaches a conductive layer 512b is formed in the insulating layer 5010 (refer to FIG. 11C). Hereinafter, an example of a method for forming the opening 5038 will be described.

As shown in FIG. 11B, irradiation with a laser beam 5036 through a photomask 5030 is performed. The photomask 5030 has a light-transmitting region 5032 which transmits the laser beam 5036 and a light-blocking region 5034 which blocks the laser beam 5036, and the light-transmitting region 5032 and the light-blocking region 5034 form a desired opening pattern. For example, the photomask 5030 is formed of a substrate obtained by forming a desired opening pattern using a light-blocking material on a surface of a light-transmitting substrate. It is to be noted that a material forming the light-blocking region 5034 needs to be favorable in a light-blocking property and resistant to energy of the laser beam 5036.

In this case, the conductive layers 512b and 512a are formed using a material which can absorb the laser beam 5036, and the insulating layer 5010 is formed using a material which can transmit the laser beam 5036. The conductive layers 512b and 512a are specifically formed using a conductive material that can be used for the light absorption layer shown in Embodiment Modes 1 to 6.

As the laser beam 5036, similarly to the laser beam shown in Embodiment Modes 1 to 6, a laser beam which has such energy that can be absorbed by the conductive layer 512b corresponding to the light absorption layer shown in the above embodiment modes may be appropriately selected. In addition, the energy of the laser beam 5036 preferably has such a level that can cause a gas in the conductive layer 512b to be discharged or the conductive layer 512b to be evaporated.

In FIG. 11B, the laser beam 5036 is transmitted through the light-transmitting region 5032 of the photomask 5030 and reaches the surface of the insulating layer 5010. Further, the laser beam 5036 is transmitted through the insulating layer 5010 and absorbed by the conductive layer 512b. A region of the conductive layer 512b irradiated with the laser beam 5036 is laser-ablated and removed together with an irradiated region of the insulating layer 5010 that is located in an upper layer, and the opening 5038 is formed (refer to FIG. 11C). The opening 5038 is formed based on the opening pattern formed on the photomask 5030. At this time, the conductive layer 512b in the irradiated region is removed by laser ablation so as to be penetrated.

In addition, the insulating layer 5010 can be formed by a droplet discharge method, a printing method (a method for forming a pattern, such as screen printing or offset printing), a dipping method, a dispenser method, or the like. With the use of such a method, the opening 5038 can be formed at the same time as formation of the insulating layer 5010.

Next, a light-emitting element 5020 electrically connected to the transistor 520 is formed. As the light-emitting element

5020, an element which emits light of red (R), green (G), or blue (B) may be formed. Alternatively, an element which emits light of white (W) may be formed as the light-emitting element 5020 and combined with a color filter to obtain light of R, G, or B. Hereinafter, a method for forming the light-emitting element 5020 will be described.

First, a first electrode layer 5012 functioning as a pixel electrode is formed in the opening 5038 where the conductive layer 512*b* is exposed. The conductive layer 512*b* and the first electrode layer 5012 are electrically connected (refer to FIG. 12A).

The first electrode layer 5012 can be manufactured utilizing laser ablation by laser beam irradiation through the photomask shown in Embodiment Modes 1 to 6. For example, a conductive layer, a light absorption layer, and an insulating layer are sequentially stacked over the insulating layer 5010.

A conductive layer to be the first electrode layer 5012 can be formed by a sputtering method, a PVD (Physical Vapor Deposition) method, a CVD (Chemical Vapor Deposition) method such as a low pressure CVD (LPCVD) method or a plasma CVD method, or the like. The conductive layer can be formed using a conductive material such as indium tin oxide (ITO), indium tin oxide containing silicon oxide (ITSO), or zinc oxide (ZnO). For example, the conductive layer can be formed of indium tin oxide containing silicon oxide by a sputtering method using a target of ITO containing silicon oxide at 2 wt % to 10 wt %. Besides, the conductive layer may be formed of a conductive material obtained by doping gallium (Ga) to ZnO, or indium zinc oxide (IZO) that is an oxide conductive material formed by using a target of ITO mixed with zinc oxide (ZnO) at 2 wt % to 20 wt %. Further, the conductive layer is electrically connected to the conductive layer 512*b*.

Then, the light absorption layer side of the substrate is irradiated with a laser beam through a photomask where a desired pattern is formed using a light-transmitting region and a light-blocking region. An irradiated region of the light absorption layer is removed by laser ablation due to energy of the laser beam absorbed by the light absorption layer. Next, the remaining insulating layer is used as a mask, and the conductive layer is etched, whereby the first electrode layer 5012 is formed. The conductive layer may be etched using a dry etching method or a wet etching method, appropriately.

After etching the conductive layer into a desired shape, the light absorption layer used as a mask may be removed by etching such as a dry etching method or a wet etching method or laser ablation by laser beam irradiation.

In addition, the first electrode layer 5012 can be selectively formed in a desired place by a droplet discharge method, a printing method (a method for forming a pattern, such as screen printing or offset printing), a dipping method, a dispenser method, or the like.

The first electrode layer 5012 may be cleaned or polished by a CMP method or with the use of a polyvinyl alcohol based porous material, so that the surface thereof is planarized. In addition, after polishing using a CMP method, ultraviolet ray irradiation, oxygen plasma treatment, or the like may be performed on the surface of the first electrode layer 5012.

Figure 12A:
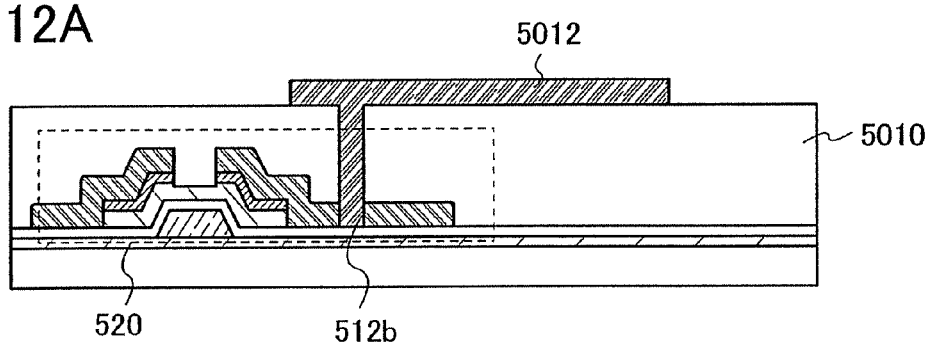
FIGS. 12A to 12C show an example of a manufacturing method of a display device of the present invention.
Figure 12B:
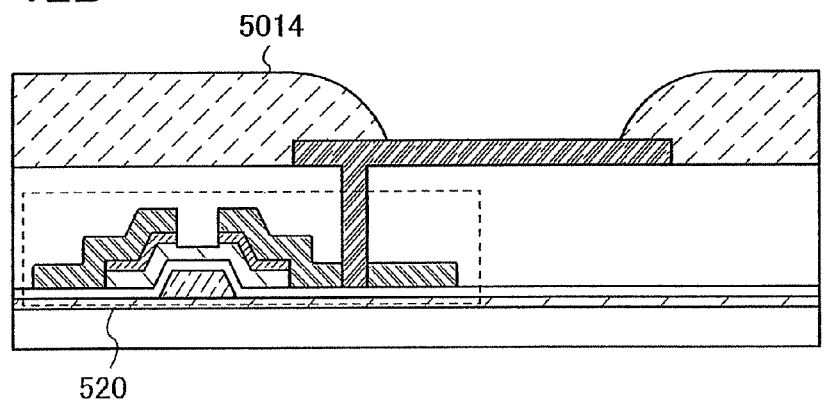

Next, a partition layer 5014 is formed so as to have an opening over the first electrode layer 5012 (refer to FIG. 12B). The partition layer 5014 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high-molecular material such as polyimide, aromatic polyamide, or polybenzimidazole; an insulating material of inorganic siloxane which includes a Si—O—Si bond among compounds which are formed using a siloxane-based material as a starting material and which include silicon, oxygen, and hydrogen; or an insulating material of organic siloxane of which hydrogen bonded to silicon is substituted by an organic group such as methyl or phenyl. A photosensitive or nonphotosensitive material such as acrylic or polyimide may also be used.

The partition layer 5014 can be selectively formed using a droplet discharge method, a printing method, a disperser method, or the like. Alternatively, the partition layer may be formed over the entire surface using an insulating material, a resist mask or the like may be formed using a lithography process, and the partition layer may be etched to form the partition layer 5014 having a desired shape. Besides, the partition layer 5014 having a desired shape can also be formed by the steps of forming the partition layer over the entire surface using a photosensitive material and exposing the partition layer formed of a photosensitive material to light to develop it. It is preferable that the partition layer 5014 have a shape of which a radius of curvature continuously changes. By such a shape of the partition layer, coverage by a layer 5016 and a second electrode layer 5018 formed thereover is improved.

After the partition layer 5014 is formed by discharging a composition by a droplet discharge method, its surface may be planarized by pressing with pressure to enhance a level of planarity. As a pressing method, concavity and convexity of the surface may be reduced by scanning the surface by a roller-shaped object, or the surface may be pressed perpendicularly by a flat plate-shaped object. Alternatively, concavity and convexity of the surface may be removed with an air knife after the surface is softened or melted with a solvent or the like. A CMP method may also be used for polishing the surface. This process can be employed for planarizing the surface when the surface becomes uneven by a droplet discharge method. When a level of planarity is enhanced by this process, irregular display of the display device can be prevented, and thus, a high definition image can be displayed.

Next, the layer 5016 and the second electrode layer 5018 are stacked over the first electrode layer 5012 and the partition layer 5014. Then, the light-emitting element 5020 having a structure in which the layer 5016 is interposed between the first electrode layer 5012 and the second electrode layer 5018 is obtained (refer to FIG. 12C). The layer 5016 includes at least a layer containing a light-emitting material by which a desired light-emission wavelength can be obtained (hereinafter referred to as a light-emitting layer). Specifically, the layer 5016 includes a layer containing an organic compound, a layer containing an inorganic compound, or a layer containing both organic and inorganic compounds.

Through the above processes, a display device including the light-emitting element 5020 can be obtained.

Although a pattern is formed utilizing ablation by laser beam irradiation in various processes in this embodiment mode, the present invention is not limited thereto, and a lithography technique using a photoresist may also be used. Of course, other techniques by which a pattern can be selectively formed may be used. This embodiment mode has a feature that a method in which a pattern is formed utilizing ablation by laser beam irradiation is used in at least one manufacturing process.

By employing the present invention, a transistor and a display device provided with the transistor can be manufactured with the reduced number of lithography processes using a photoresist. Therefore, a lithography process can be simplified, and the throughput can be improved.

Further, by employing the present invention, contamination due to impurities contained in a photoresist can be prevented, whereby a highly reliable display device can be manufactured.

In addition, with the use of a linear laser beam or a planar laser beam having a large area such as a rectangular laser beam or a circular laser beam, a plurality of regions can be irradiated with a laser beam in a short time. Therefore, by applying the present invention to a large-area substrate, a lot of patterns can be formed in a short time, whereby a display device can be manufactured with high productivity.

This embodiment mode can be appropriately combined with any of Embodiment Modes 1 to 6.

Embodiment Mode 8

In Embodiment Mode 8, an example of a display device according to the present invention will be described with reference to FIGS. 19A and 19B.

Figures 19A, 19B:
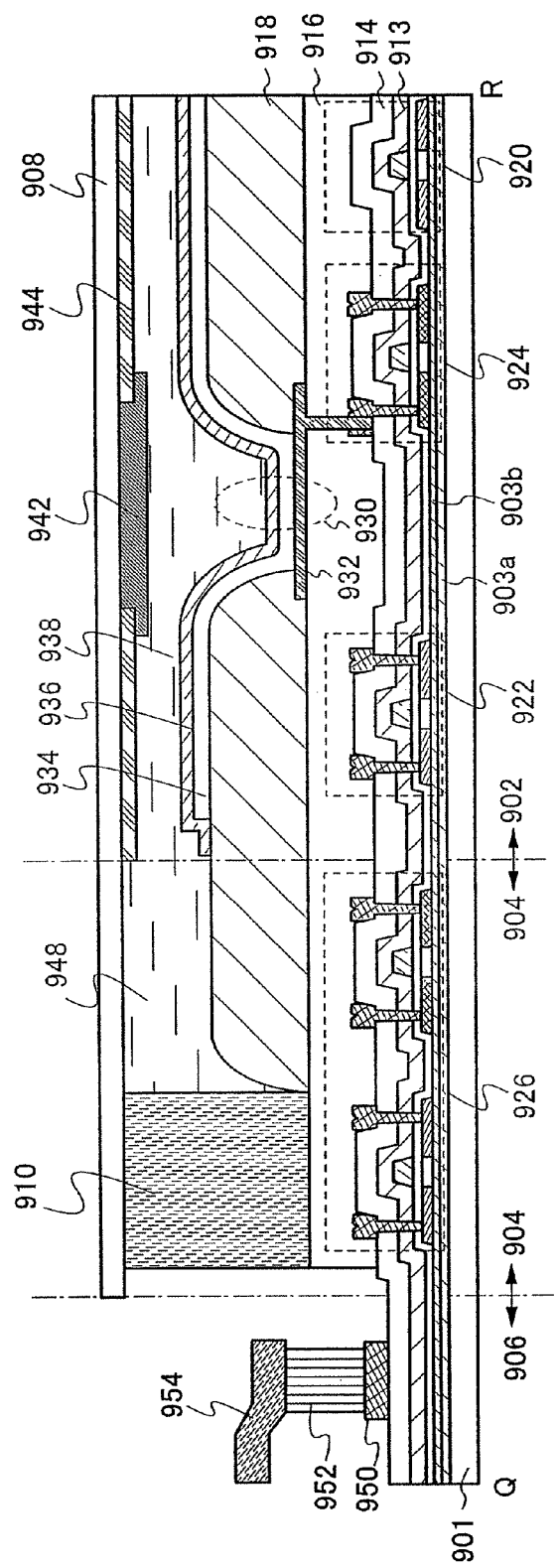
FIGS. 19A and 19B show an example of a display device of the present invention.

FIG. 19A shows a top schematic view of a display device shown in this embodiment mode. In addition, FIG. 19B shows a cross-sectional view of FIG. 19A along a line Q-R.

A display device 900 shown in FIGS. 19A and 19B includes, over a substrate 901, a pixel portion 902 and a driver circuit portion 904. A sealing substrate 908 is provided over the substrate 901 with a sealant 910 interposed therebetween. Moreover, a terminal portion 906 is provided over the substrate 901. Signals and power source potentials for controlling operations of plural elements included in the pixel portion 902 are inputted from an external portion through the terminal portion 906.

The pixel portion 902 is provided with a light-emitting element 930, a driving transistor 924, a switching transistor 922, and a capacitor element 920. In the light-emitting element 930, at least a layer including a light-emitting layer is interposed between a pair of electrode layers. The light-emitting element 930 is electrically connected to the driving transistor 924.

Edge portions of an electrode layer in a lower layer of the light-emitting element 930 (the electrode layer electrically connected to the driving transistor 924) are covered with a partition layer 918. The partition layer 918 is formed of an inorganic insulating material such as silicon oxide or silicon nitride; an organic insulating material such as acrylic, polyimide, or resist; a siloxane material; or the like. The partition layer 918 can separate light-emitting elements provided adjacent to each other. When the partition layer 918 has an edge portion with a rounded shape of which a radius of curvature continuously changes as shown in this embodiment mode, coverage by a film stacked thereover is improved, which is preferable.

The driver circuit portion 904 is provided with a plurality of transistors 926, which form a driver circuit for controlling the operation of the pixel portion 902. The driver circuit portion 904 is provided with, for example, a shift register, a decoder, a buffer, a sampling circuit, a latch, and the like.

The substrate 901 and the sealing substrate 908 are attached to each other with the sealant 910 interposed therebetween so as to seal the pixel portion 902 and the driver circuit portion 904. The sealing substrate 908 is provided with a color filter 942 and a light-blocking layer 944. The present invention is not particularly limited thereto, and the color filter 942 or the light-blocking layer 944 may also be omitted.

This embodiment mode and the above embodiment modes are greatly different in that a gate electrode layer of the transistor is provided below or over the semiconductor layer. Other structures are based on those in Embodiment Mode 7.

Next, an example of a specific manufacturing method will be described.

As a base insulating layer, a base insulating layer 903a is formed using silicon nitride oxide with a thickness of 10 nm to 200 nm (preferably 50 nm to 150 nm) over a substrate 901, and a base insulating layer 903b is formed thereover using silicon oxynitride with a thickness of 50 nm to 200 nm (preferably 100 nm to 150 nm), by a sputtering method, a PVD (Physical Vapor Deposition) method, a CVD (Chemical Vapor Deposition) method such as a low-pressure CVD (LPCVD) method or a plasma CVD method, or the like. Alternatively, an acrylic acid, a methacrylic acid, or a derivative thereof; a heat-resistant high molecular material such as polyimide, aromatic polyamide, or polybenzimidazole; or a siloxane resin may be used. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. Moreover, an oxazole resin can be used, and for example, photo-curing polybenzoxazole or the like can be used.

A droplet discharge method, a printing method (a method for forming a pattern such as screen printing or offset printing), a coating method such as a spin coating method, a dipping method, a dispenser method, or the like can also be used. In this embodiment mode, the base insulating layers 903a and 903b are formed by a plasma CVD method. As the substrate 901, a glass substrate, a quartz substrate, a silicon substrate, a metal substrate, or a stainless steel substrate provided with an insulating layer on the surface may be used. In addition, a plastic substrate having heat resistance sufficient to withstand the process temperature of this embodiment mode may be used, or a flexible film-like substrate may be used. As the plastic substrate, a substrate made of PET (polyethylene terephthalate), PEN (polyethylenenaphthalate), or PES (polyethersulfone) can be used, and as the flexible substrate, a substrate made of a synthetic resin such as acrylic can be used.

The base insulating layer can be formed using silicon oxide, silicon nitride, silicon oxynitride, silicon nitride oxide, or the like and may have either a single layer structure or a stacked layer structure such as a two-layer or three-layer structure.

Next, a semiconductor layer is formed over the base insulating layer. The semiconductor layer may be formed with a thickness of 25 nm to 200 nm (preferably, 30 nm to 150 nm) by any of various methods (such as a sputtering method, an LPCVD method, or a plasma CVD method). In this embodiment mode, it is preferable to use a crystalline semiconductor layer which is obtained by crystallizing an amorphous semiconductor layer with a laser beam.

The semiconductor layer obtained in this manner may be doped with a slight amount of an impurity element (boron or phosphorus) to control a threshold voltage of a transistor. This doping with an impurity element may be performed to the amorphous semiconductor layer before the crystallization step. When the doping with an impurity element is performed to the amorphous semiconductor layer, activation of the impurity element can be performed by heat treatment which will be performed later for crystallization. In addition, defects and the like caused by doping can be improved.

Next, the crystalline semiconductor layer is patterned into a desired shape to form a semiconductor layer.

In this embodiment mode, laser ablation by laser beam irradiation shown in the above embodiment modes is utilized to pattern the semiconductor layer. In this case, a mask having a desired shape formed of a light absorption layer may be formed, and etching may be performed using the mask. A material, a method, and the like may be appropriately selected.

Alternatively, the semiconductor layer may also be formed by a lithography technique using a photoresist material. A resist mask for forming a desired shape may be formed and etching may be performed using the resist mask. Alternatively, various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like may also be used.

The etching may be performed by either plasma etching (dry etching) or wet etching; however, plasma etching is suitable for treating a large-area substrate. As an etching gas, a fluorine-based gas such as $CF_4$, $CHF_3$, or $NF_3$, or a chlorine-based gas such as $Cl_2$ or $BCl_3$ is used, to which an inert gas such as He or Ar may be appropriately added. Alternatively, electric discharge machining can be performed locally when the etching is performed using atmospheric pressure discharge, and in such a case, a mask layer does not need to be formed over the entire surface of the substrate. At this time, a lower electrode layer forming a capacitor element completed later is also formed. The lower electrode layer is formed in the same layer as the semiconductor layer forming the transistor.

A gate insulating layer is formed to cover the semiconductor layer. The gate insulating layer is formed using an insulating layer containing silicon with a thickness of 10 nm to 150 nm by a plasma CVD method, a sputtering method, or the like. The gate insulating layer may be formed using an inorganic insulating material such as silicon nitride, silicon oxide, silicon oxynitride, or silicon nitride oxide with a single layer structure or a stacked layer structure. The gate insulating layer may be formed to have a three-layer structure of a silicon nitride layer, a silicon oxide layer, and a silicon nitride layer. Alternatively, a single layer or a two-layer structure of a silicon oxynitride layer may be used.

Next, a gate electrode layer is formed over the gate insulating layer. The gate electrode layer can be formed by the steps of forming a conductive layer by a sputtering method, an evaporation method, a CVD method, or the like and patterning the conductive layer into a desired shape. The gate electrode layer may be formed using an element such as tantalum (Ta), tungsten (W), titanium (Ti), molybdenum (Mo), aluminum (Al), copper, (Cu), chromium (Cr), or neodymium (Nd), or an alloy material or a compound material containing the above element as its main component. Alternatively, the gate electrode layer may be formed using a semiconductor layer typified by polycrystalline silicon doped with an impurity element such as phosphorus, or an AgPdCu alloy. The gate electrode layer may have a single layer structure or a stacked layer structure.

The gate electrode layer can be obtained by patterning the conductive layer into a desired shape. Ablation by laser beam irradiation shown in the above embodiment modes is utilized to pattern the conductive layer. In this case, a mask having a desired shape formed of a light absorption layer may be formed, and etching may be performed using the mask. A material, a method, and the like may be appropriately selected. At this time, an upper electrode layer of a capacitor element completed later is also formed. The upper electrode layer is formed using the same material as that of the gate electrode layer.

The gate electrode layer is formed to have a tapered side surface in this embodiment mode. The gate electrode layer can be formed into a tapered shape by using a wet etching method for an etching step. Alternatively, a wet etching method may be sequentially performed after a dry etching method. It is to be noted that the present invention is not particularly limited thereto, and the gate electrode layer having a perpendicular side surface may be formed by a dry etching method. Further, the gate electrode layer may have a two-layer structure in which the layers have different taper angles. When the gate electrode layer has a tapered side surface, the coverage thereof by a film to be stacked thereover can be improved.

Alternatively, the gate electrode layer may also be formed by a lithography technique using a photoresist material. In a lithography technique, a resist mask may be formed and etching may be performed. Alternatively, various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like may also be used.

Through the etching step for forming the gate electrode layer, there is a case where a portion where the gate insulating layer is exposed is etched to some extent and the thickness thereof is reduced (so-called film reduction).

An impurity element is added to the semiconductor layer to form a pair of impurity regions. The impurity region formed in the semiconductor layer functions as a source region or a drain region. As the impurity element to be added, an impurity element which imparts n-type conductivity or an impurity element which imparts p-type conductivity may be appropriately selected. As the impurity element which imparts n-type conductivity, phosphorus (P), arsenic (As), or the like can be used. As the impurity element which imparts p-type conductivity, boron (B), aluminum (Al), gallium (Ga), or the like can be used. At this time, a channel formation region is formed between a pair of impurity regions.

It is to be noted that, in the semiconductor layer, an impurity region called an LDD (Lightly Doped Drain) region may be formed between an impurity region functioning as a source region or a drain region and a channel formation region. The LDD region is an impurity region with a low concentration of impurities than a source region or a drain region. The LDD region may overlap with the gate electrode layer or may not overlap with the gate electrode layer.

Heat treatment, intense light irradiation, or laser beam irradiation may be performed to activate the impurity element. At the same time as the activation, plasma damage to the gate insulating layer and the interface between the gate insulating layer and the semiconductor layer can be repaired.

Then, a first interlayer insulating layer is formed to cover the gate electrode layer and the gate insulating layer. In this embodiment mode, the first interlayer insulating layer has a stacked layer structure of insulating layers 913 and 914. The insulating layers 913 and 914 can be formed using a silicon nitride layer, a silicon nitride oxide layer, a silicon oxynitride layer, a silicon oxide layer, or the like by a sputtering method or a plasma CVD method, or another insulating layer containing silicon may be used as a single layer structure or a stacked layer structure of three or more layers.

In addition, heat treatment is performed in a nitrogen atmosphere at 300° C. to 550° C. for 1 to 12 hours to hydrogenate the semiconductor layer. Preferably, it is performed at 400° C.

to 500° C. This step is a step of terminating dangling bonds of the semiconductor layer with hydrogen which is contained in the insulating layer 913 that is the interlayer insulating layer. In this embodiment mode, heat treatment is performed at 410° C.

The insulating layers 913 and 914 can be formed using a material such as aluminum nitride, aluminum oxynitride, aluminum nitride oxide having a higher content of nitrogen than that of oxygen, aluminum oxide, diamond-like carbon (DLC), nitrogen-containing carbon, polysilazane, or other substances including an inorganic insulating material. Alternatively, a material containing siloxane may be used. An organic insulating material may also be used, and polyimide, acrylic, polyamide, polyimide amide, resist, or benzocyclobutene can be used. Moreover, an oxazole resin can be used, and for example, photo-curing polybenzoxazole or the like can be used.

Next, an opening is formed in the insulating layers 913 and 914 and the gate insulating layer so as to reach the semiconductor layer.

The opening is formed by a lithography technique using a photoresist material. A resist mask having a desired opening pattern may be formed, and etching may be performed using the mask.

Alternatively, the opening may be formed utilizing laser ablation by laser beam irradiation. For example, the source region and the drain region of the semiconductor layer are irradiated with a laser beam from the side of the insulating layers 913 and 914 through a photomask. By the energy of the laser beam absorbed by the source region and the drain region, the insulating layers 913 and 914 and the gate insulating layer over irradiated regions of the source region and the drain region are removed, whereby the opening can be formed.

In the photomask, a light-transmitting region and a light-blocking region form a desired opening pattern. A material forming the light-blocking region is favorable in light-blocking property and resistant to energy of the laser beam. The laser beam has such energy that can be absorbed by the source region or the drain region of the semiconductor layer and preferably has such an energy level that can cause a gas in the source region or the drain region to be discharged or the source region or the drain region to be evaporated. By appropriately selecting energy of the laser beam, it is also possible to remove only the insulating layers 913 and 914, and the gate insulating layer. A region where the laser beam is transmitted through the photomask is to be an irradiated region, and the insulating layer and the like are removed to form the opening there.

A source electrode layer or a drain electrode layer is formed in the opening that reaches the source region or the drain region of the semiconductor layer, and the source region or the drain region of the semiconductor layer can be electrically connected to the source electrode layer or the drain electrode layer.

The source electrode layer or the drain electrode layer can be formed by the steps of forming a conductive layer by a PVD method, a CVD method, an evaporation method, or the like and then patterning the conductive layer into a desired shape. The source electrode layer or the drain electrode layer is formed using an element such as Ag, Au, Cu, Ni, Pt, Pd, Ir, Rh, W, Al, Ta, Mo, Cd, Zn, Fe, Ti, Si, Ge, Zr, or Ba, or an alloy material or a metal nitride containing the element as its main component. In addition, the source electrode layer or the drain electrode layer may have a single layer structure or a stacked layer structure.

The source electrode layer or the drain electrode layer can be obtained by pattering a conductive layer into a desired shape. The conductive layer can be patterned utilizing ablation by laser beam irradiation shown in the above embodiment modes.

For example, a light absorption layer is stacked over the conductive layer and irradiated with a laser beam through a photomask. By utilizing ablation by energy of a laser beam absorbed by the light absorption layer, a mask formed of the light absorption layer is formed. Then, the conductive layer is etched using the mask, whereby the source electrode layer or the drain electrode layer is formed.

In the photomask, a light-transmitting region and a light-blocking region form a desired pattern. A material forming the light-blocking region is favorable in light-blocking property and resistant to energy of the laser beam. The laser beam has such energy that can be absorbed by the light absorption layer and preferably has such an energy level that can cause a gas in the light absorption layer to be discharged or the light absorption layer to be evaporated. A region where the laser beam is transmitted through the photomask is to be an irradiated region, the light absorption layer in the irradiated region is removed, and a part of the light absorption layer remains based on the pattern formed on the photomask. Then, with the remaining light absorption layer as an etching mask, the conductive layer is etched by a dry etching method or a wet etching method to obtain the source electrode layer or the drain electrode layer. It is to be noted that details of the insulating layer, the light absorption layer, the laser beam, the photomask, and the like are based on those in the above embodiment modes.

Alternatively, the source electrode layer or the drain electrode layer may be formed by the steps of forming a resist mask by a lithography technique using a photoresist material and etching the conductive layer.

Alternatively, the source electrode layer or the drain electrode layer may also be formed by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like. A reflow method or a damascene method may also be used. With such a method, the conductive layer can be selectively formed in a desired place. It is to be noted that a terminal electrode layer 950 of the terminal portion 906 is also formed in forming the source electrode layer or the drain electrode layer.

Through the above processes, an active matrix substrate including the transistors 922 and 924 in the pixel portion 902 and plural transistors 926 in the driver circuit portion 904 can be manufactured.

The present invention is not particularly limited thereto, and a transistor may have a single-gate structure in which one channel formation region is formed, a double-gate structure in which two channel formation regions are formed, or a triple-gate structure in which three channel formation regions are formed.

Next, an insulating layer 916 is formed as a second interlayer insulating layer. The insulating layer 916 can be formed of a material such as silicon oxide, silicon nitride, silicon oxynitride, silicon nitride oxide, aluminum nitride, aluminum oxide containing nitrogen (also referred to as aluminum oxynitride), aluminum nitride containing oxygen (also referred to as aluminum nitride oxide), aluminum oxide, diamond-like carbon (DLC), nitrogen-containing carbon, PSG (phosphosilicate glass), BPSG (borophosphosilicate glass), alumina, or other substances including an inorganic insulating material. Alternatively, a siloxane resin may be used. Furthermore, an organic insulating material may be used; an organic material may be either photosensitive or non-photosensitive; and polyimide, acrylic, polyamide, polyimide amide, resist, benzocyclobutene, polysilazane, or a low-dielectric constant (Low-k) material can be used. Moreover, an oxazole resin can be used, and for example, photo-curing polybenzoxazole or the like can be used. Since an interlayer insulating layer provided for planarization needs to have high heat resistance, a high insulating property, and a high level of planarity, the insulating layer 916 is preferably formed by a coating method typified by a spin coating method.

The insulating layer 916 can also be formed by a dipping method, spray coating, a doctor knife, a roll coater, a curtain coater, a knife coater, a CVD method, an evaporation method, or the like. The insulating layer 916 may also be formed by a droplet discharge method. In the case of using a droplet discharge method, a material liquid can be saved. Alternatively, a method like a droplet discharge method by which a pattern can be transferred or drawn, such as a printing method (a method for forming a pattern such as screen printing or offset printing), a dispenser method, or the like can be used.

An opening which reaches the source electrode layer or the drain electrode layer of the transistor 924 is formed in the insulating layer 916 of the pixel portion 902. The opening may be formed similarly to the opening for electrically connecting the source electrode layer or the drain electrode layer and the source region or the drain region of the semiconductor layer. In the case of utilizing ablation by laser beam irradiation, the insulating layer 916 side is irradiated with a laser beam, and an irradiated region of the source electrode or the drain electrode and the insulating layer 916 in an upper layer thereof are removed by energy of the laser beam absorbed by the source electrode layer or the drain electrode layer, whereby the opening can be formed. A photomask provided with a desired opening pattern is used for laser beam irradiation. When ablation by laser beam irradiation is utilized, a low-melting point metal which can be relatively easily evaporated (chromium in this embodiment mode) is preferably used for the source electrode layer or the drain electrode layer.

A light-emitting element 930 is formed over the insulating layer 916 in the pixel portion 902. The light-emitting element 930 is electrically connected to the transistor 924.

First, a first electrode layer 932 is formed in the opening, which is provided in the insulating layer 916 and exposes the source electrode layer or the drain electrode layer of the transistor 924.

Next, a partition layer 918 is formed so as to have an opening over the first electrode layer 932 and cover the edge portions of the first electrode layer 932. The partition layer 918 can be formed using silicon oxide, silicon nitride, silicon oxynitride, silicon nitride oxide, or the like and may have a single layer structure or a stacked layer structure of two or three layers. The partition layer 918 can alternatively be formed using a material such as aluminum nitride, aluminum oxynitride having a higher content of oxygen than that of nitrogen, aluminum nitride oxide having a higher content of nitrogen than that of oxygen, aluminum oxide, diamond-like carbon (DLC), nitrogen-containing carbon, polysilazane, or other substances including an inorganic insulating material. Alternatively, a material containing siloxane may be used. Furthermore, an organic insulating material may be used; an organic material may be either photosensitive or non-photosensitive; and polyimide, acrylic, polyamide, polyimide amide, resist, benzocyclobutene, or polysilazane can be used. Moreover, an oxazole resin can be used, and for example, photo-curing polybenzoxazole or the like can be used.

The partition layer 918 can be formed by a droplet discharge method by which a pattern can be selectively formed, a printing method by which a pattern can be transferred or drawn (a method for forming a pattern, such as screen printing or offset printing), a dispenser method, a coating method such as a spin coating method, a dipping method, or the like. Alternatively, the partition layer is formed over the entire surface using a photosensitive material, and the partition layer formed of a photosensitive material is exposed to light and developed, whereby the partition layer 918 can be patterned into a desired shape. Further, the partition layer may be formed over the entire surface by a sputtering method, a PVD (Physical Vapor Deposition) method, a CVD (Chemical Vapor Deposition) method such as a low-pressure CVD (LPCVD) method or a plasma CVD method; a mask of a resist or the like is formed using a lithography technique; and the partition layer may be etched into a desired shape.

The etching into a desired shape may be performed by either a dry etching method or a wet etching method; however, plasma etching (one kind of a dry etching method) is suitable for treating a large-area substrate. As an etching gas, a fluorine-based gas such as $CF_4$, $CHF_3$, or $NF_3$ or a chlorine-based gas such as $Cl_2$ or $BCl_3$ is used, to which an inert gas such as He or Ar may be appropriately added. Alternatively, electric discharge machining can be performed locally when the etching process is performed using atmospheric pressure discharge, and in such a case, a mask layer does not need to be formed over the entire surface of the substrate.

The partition layer 918 preferably has a shape of which a radius of curvature continuously changes. By such a shape of the partition layer, coverage by a layer stacked thereover is improved.

Next, a layer 934 and a second electrode layer 936 are stacked over the first electrode layer 932 and the partition layer 918, and the light-emitting element 930 having a structure in which the layer 934 is interposed between the first electrode layer 932 and the second electrode layer 936 is obtained. The layer 934 includes at least a layer containing a light-emitting material by which a desired light-emission wavelength can be obtained.

One of the first electrode layer 932 and the second electrode layer 936 functions as an anode and the other functions as a cathode. The first electrode layer 932 and the second electrode layer 936 can be formed using indium tin oxide (ITO), indium tin oxide containing silicon oxide, indium zinc oxide (IZO) that is formed by using a target of ITO mixed with zinc oxide at 2 wt % to 20 wt %, gold (Au), platinum (Pt), nickel (Ni), tungsten (W), chromium (Cr), molybdenum (Mo), iron (Fe), cobalt (Co), copper (Cu), palladium (Pd), or the like. In addition, aluminum, an alloy of magnesium and silver, an alloy of aluminum and lithium, or the like can be used.

In order to take out light emitted in the layer 934 to an external portion, one or both of the first electrode layer 932 and the second electrode layer 936 are preferably formed using indium tin oxide, or alternatively, silver, aluminum, or the like that is formed to have a thickness of several nm to several tens of nm so as to transmit visible light.

The first electrode layer 932 can be obtained by the steps of forming the material over the entire surface and pattering the material into a desired shape. The first electrode layer 932 may be patterned utilizing ablation by laser beam irradiation shown in the above embodiment modes.

For example, a conductive layer to be the first electrode layer is formed over the entire surface, and a light absorption layer is stacked over the conductive layer and irradiated with a laser beam through a photomask. By utilizing ablation by energy of the laser beam absorbed by the light absorption layer, a mask is formed of the light absorption layer. Then, the conductive layer is etched using the mask, whereby the first electrode layer 932 is obtained.

In the photomask, a light-transmitting region and a light-blocking region form a desired pattern. A material forming the light-blocking region is favorable in light-blocking property and resistant to energy of the laser beam. The laser beam has such energy that can be absorbed by the light absorption layer and preferably has such an energy level that can cause a gas in the light absorption layer to be discharged or the light absorption layer to be evaporated. A region where the laser beam is transmitted through the photomask is to be an irradiated region, the light absorption layer in the irradiated region is removed, and a part of the light absorption layer remains based on the pattern formed on the photomask. Then, with the remaining light absorption layer as an etching mask, the conductive layer is etched by a dry etching method or a wet etching method to obtain the first electrode layer 932. It is to be noted that details of the light absorption layer, the laser beam, the photomask, and the like are based on those in the above embodiment modes.

Alternatively, the first electrode layer 932 may also be formed by the steps of forming a resist mask by a lithography technique using a photoresist material and etching the conductive layer. Further alternatively, the first electrode layer 932 may be formed by various printing methods (a method for forming a desired pattern, such as screen (mimeograph) printing, offset (planograph) printing, relief printing, or gravure (intaglio) printing), a nanoimprint method, a droplet discharge method, a dispenser method, a selective coating method, or the like. A reflow method or a damascene method may also be used. With such a method, the conductive layer can be selectively formed in a desired place.

The first electrode layer 932 may be cleaned or polished by a CMP method or with the use of a polyvinyl alcohol based porous material, so that the surface thereof is planarized. In addition, after polishing using a CMP method, ultraviolet ray irradiation, oxygen plasma treatment, or the like may be performed on the surface of the first electrode layer 932.

After the first electrode layer 932 is formed, heat treatment may be performed. Through this heat treatment, moisture included in the first electrode layer 932 is released. Therefore, degasification or the like is not caused in the first electrode layer 932. Even when a light-emitting material which is easily deteriorated by moisture is formed over the first electrode layer 932, the light-emitting material is not deteriorated. Accordingly, a highly reliable display device can be manufactured.

The second electrode layer 936 can be formed by an evaporation method, a sputtering method, or the like. In addition, an insulating layer may be provided as a passivation layer (protective layer) over the second electrode layer 936. It is effective to provide a passivation layer to cover the second electrode layer 936 in this manner. The passivation layer can be formed using a single layer structure or a stacked layer structure of an insulating layer including silicon nitride, silicon oxide, silicon oxynitride, silicon nitride oxide, aluminum nitride, aluminum oxynitride, aluminum nitride oxide having a higher content of nitrogen than that of oxygen, aluminum oxide, diamond-like carbon (DLC), or nitrogen-containing carbon. Alternatively, the passivation layer may be formed using a siloxane resin.

In this case, a film providing good coverage is preferably used as the passivation layer. A carbon film, especially, a DLC film is effective. The DLC film can be formed at a temperature in the range of room temperature to 100° C.; therefore, the DLC film can be easily formed over the layer 934 having low heat resistance. The DLC film can be formed by a plasma CVD method (typically, an RF plasma CVD method, a microwave CVD method, an electron cyclotron resonance (ECR) CVD method, a thermal filament CVD method, or the like), a combustion flame method, a sputtering method, an ion beam evaporation method, a laser evaporation method, or the like. A hydrogen gas and a hydrocarbon-based gas (for example, $CH_4$, $C_2H_2$, $C_6H_6$, or the like) are used as a reaction gas for forming a DLC film. The reaction gas is ionized by glow discharge, and the ions are accelerated to collide with a negatively self-biased cathode; accordingly, a DLC film is formed. A nitrogen-containing carbon film may be formed using a $C_2H_4$ gas and an $N_2$ gas as a reaction gas. The DLC film has a high blocking effect on oxygen and can suppress oxidation of the layer 934. Accordingly, the layer 934 can be prevented from being oxidized during a sealing step later.

The layer 934 formed over the first electrode layer 932 includes at least a light-emitting layer containing a light-emitting material. The light-emitting layer includes a layer containing an organic compound, a layer containing an inorganic compound, or a layer containing both organic and inorganic compounds. The light-emitting element 930 in which the layer 934 is provided between the first electrode layer 932 and the second electrode layer 936 can be obtained.

The substrate 901 provided with the light-emitting element 930 and the sealing substrate 908 are fixed to each other with the sealant 910 to seal the light-emitting element 930. As the sealant 910, it is typically preferable to use a visible light curable resin, an ultraviolet curable resin, or a thermosetting resin. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type (Epichlorohydrin-Bisphenol) epoxy resin, a glycidyl ester resin, a glycidyl amine resin, a heterocyclic epoxy resin, or a modified epoxy resin can be used. It is to be noted that a region 948 surrounded by the sealant may be filled with a filler, or nitrogen or the like may be enclosed by sealing the region in a nitrogen atmosphere. In a structure in which light is taken out through the filler, the filler needs to have a light-transmitting property. Typically, a visible light curable, ultraviolet curable, or thermosetting epoxy resin may be used. Through the above processes, a display device having a display function with the use of a light-emitting element is completed. Alternatively, the filler can be dripped in a liquid state to fill inside the display device. When a substance having a hygroscopic property such as a drying agent is used as the filler, a higher water-absorbing effect can be obtained, and deterioration of the light-emitting element 930 can be prevented.

In order to prevent element deterioration due to moisture, a drying agent may be provided so as to surround the pixel portion 902. For example, the drying agent may be provided in a depressed portion formed in the sealing substrate, so that it does not interfere with reduction in thickness. Further, since the drying agent is formed in a region corresponding to a gate wiring layer so that a large water-absorbing area is provided, a high water-absorbing effect can be obtained. In addition, since the drying agent is formed over the gate wiring layer which does not contribute to light-emission, reduction in light-extraction efficiency can be prevented.

This embodiment mode describes the case where the light-emitting element is sealed with a glass substrate. Sealing treatment is treatment for protecting the light-emitting element from moisture. Therefore, any of the following methods can be used: a method in which a light-emitting element is mechanically sealed with a cover material, a method in which a light-emitting element is sealed with a thermosetting resin or an ultraviolet curable resin, and a method in which a light-emitting element is sealed with a thin film of metal oxide, metal nitride, or the like having high barrier capability. As the cover material, glass, ceramics, plastic, or a metal can be used. However, when light is emitted to the cover material side, the cover material needs to have a light-transmitting property. The cover material is attached to the substrate over which the above-mentioned light-emitting element is formed, with a sealant such as a thermosetting resin or an ultraviolet curable resin, and a sealed space is formed by curing the resin with heat treatment or ultraviolet ray irradiation treatment. It is also effective to provide a moisture-absorbing material typified by barium oxide in the sealed space. The moisture-absorbing material may be provided on the sealant or over the partition layer or a peripheral portion so as not to block light emitted from the light-emitting element. Further, a space between the cover material and the substrate over which the light-emitting element is formed can also be filled with a thermosetting resin or an ultraviolet curable resin. In this case, it is effective to add a moisture-absorbing material typified by barium oxide in the thermosetting resin or the ultraviolet curable resin.

Further, the source electrode layer or the drain electrode layer and the first electrode layer 932 may not be directly in contact to be electrically connected and may be connected through a wiring layer.

In this embodiment mode, an FPC 954 is connected to the terminal electrode layer 950 through an anisotropic conductive layer 952 in the terminal portion 906 so as to have electrical connection to an external portion.

Moreover, as shown in FIG. 19A, the display device manufactured in this embodiment mode includes the driver circuit portion 904 over the same substrate as the pixel portion 902. It is to be noted that the present invention is not limited thereto and an IC chip may be mounted as a peripheral driver circuit by a COG method or a TAB method as described above.

In the display device of the present invention, a driving method for image display is not particularly limited, and for example, a dot sequential driving method, a line sequential driving method, an area sequential driving method, or the like may be used. Typically, the line sequential driving method is used, and a time division gray scale driving method or an area gray scale driving method may be appropriately used. Further, a video signal inputted to the source line of the display device may be either an analog signal or a digital signal. The driver circuit and the like may be appropriately designed in accordance with the video signal.

Although a pattern is formed utilizing ablation by laser beam irradiation in various processes in this embodiment mode, the present invention is not limited thereto, and a lithography technique using a photoresist may also be used. Of course, other techniques by which a pattern can be selectively formed may be used. This embodiment mode has a feature that a method in which a pattern is formed utilizing ablation by laser beam irradiation is used in at least one manufacturing process.

By employing the present invention, a layer such as a wiring included in the display device can be formed into a desired shape. Further, the number of lithography processes using a photoresist can be reduced, and the display device can be manufactured through a simplified process. Therefore, the throughput can be improved.

Further, by employing the present invention, contamination due to impurities contained in a photoresist can be prevented, whereby a highly reliable display device can be manufactured.

In addition, with the use of a linear laser beam or a planar laser beam having a large area such as a rectangular laser beam or a circular laser beam, a plurality of regions can be irradiated with a laser beam in a short time. Therefore, by applying the present invention to a large-area substrate, a lot of patterns can be formed in a short time, whereby a display device can be manufactured with high productivity.

This embodiment mode can be appropriately combined with any of Embodiment Modes 1 to 7.

Embodiment Mode 9

Various element structures can be applied to a light-emitting element that has a display function of a display device. The light-emitting element is generally distinguished by whether a light-emitting material is an organic compound or an inorganic compound. The former is referred to as an organic EL element, and the latter is referred to as an inorganic EL element. Here, examples of a light-emitting element that can be applied to the present invention will be described with reference to FIG. 13, FIGS. 14A to 14C, and FIGS. 15A to 15C.

Figure 13:
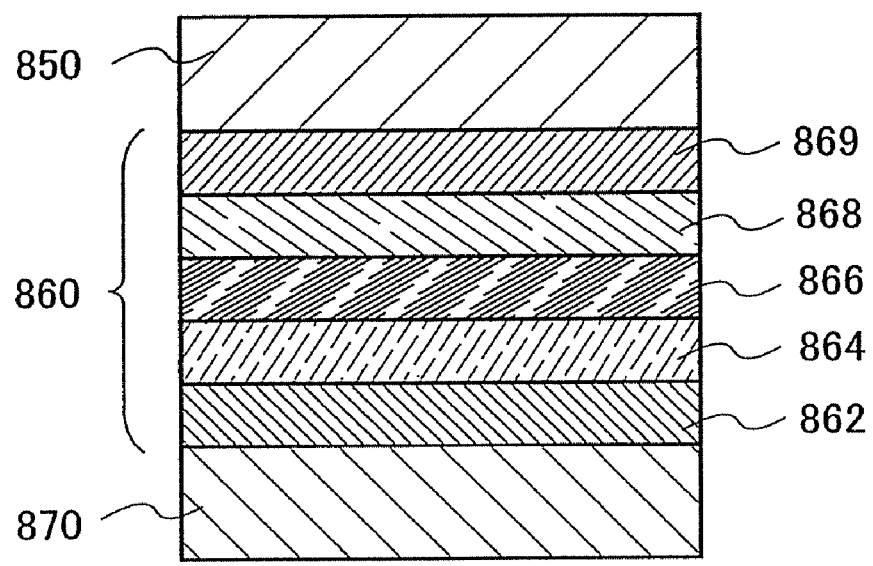
FIG. 13 shows a structure of a light emitting element which can be applied to the present invention.

FIG. 13 shows an organic EL element. In the light-emitting element shown in FIG. 13, a layer 860 is interposed between a first electrode layer 870 and a second electrode layer 850. Either the first electrode layer 870 or the second electrode layer 850 is an anode, and the other is a cathode. Note that the anode indicates an electrode for injecting holes to a light-emitting layer, and the cathode indicates an electrode for injecting electrons to the light-emitting layer. In this embodiment mode, the first electrode layer 870 is an anode and the second electrode layer 850 is a cathode. Further, the layer 860 has a structure in which a hole-injecting layer 862, a hole-transporting layer 864, a light-emitting layer 866, an electron-transporting layer 868, and an electron-injecting layer 869 are sequentially stacked.

The first electrode layer 870 and the second electrode layer 850 can be formed using gold (Au), platinum (Pt), nickel (Ni), tungsten (W), chromium (Cr), molybdenum (Mo), iron (Fe), cobalt (Co), copper (Cu), palladium (Pd), or the like as well as indium tin oxide (ITO), indium tin oxide containing silicon oxide, indium zinc oxide formed by using a target in which ITO and zinc oxide of 2 wt % to 20 wt % are mixed. Moreover, in addition to aluminum, an alloy of magnesium and silver, an alloy of aluminum and lithium, or the like can also be used for forming the first electrode layer 870. A method for forming the first electrode layer 870 is the same as that of the above first electrode layer 5012. A method for forming the second electrode layer 850 is not particularly limited, and for example, a sputtering method, an evaporation method, or the like can be used for forming the second electrode layer 850.

Note that, in order to extract emitted light to outside, it is preferable to form either the first electrode layer 870 or the second electrode layer 850, or both of them by using indium tin oxide or the like or by depositing silver, aluminum, or the like to have a thickness of several nm to several tens of nm so that visible light can be transmitted.

The hole-injecting layer 862 is a layer having a function for supporting injection of holes from the first electrode layer 870 to the hole-transporting layer 864. When the hole-injecting layer 862 is provided, an ionization potential difference between the first electrode layer 870 and the hole-transporting layer 864 is relieved; thus, holes are easily injected. The hole-injecting layer 862 is preferably formed using a substance ionization potential of which is lower than that of a substance forming the hole-transporting layer 864 and higher than that of a substance forming the first electrode layer 870. The hole-injecting layer 862 is also preferably formed using a substance energy band of which is bent by being provided as a thin film having a thickness of 1 nm to 2 nm between the hole-transporting layer 864 and the first electrode layer 870. As a specific example of a substance that can be used for forming the hole-injecting layer 862, a phthalocyanine-based compound such as phthalocyanine (abbreviation: $H_2Pc$) or copper phthalocyanine (CuPc), a high molecular material such as poly(ethylenedioxythiophene)/poly(styrenesulfonic acid) solution (PEDOT/PSS), and the like can be given. Thus, a substance is selected from hole-transporting substances, so that ionization potential in the hole-injecting layer 862 is relatively lower than that in the hole-transporting layer 864, whereby the hole-injecting layer 862 can be formed. In the case of providing the hole-injecting layer 862, it is preferable to form the first electrode layer 870 using a substance with a high work function such as indium tin oxide. Note that the present invention is not particularly limited, and the hole-injecting layer 862 is not necessarily provided.

The hole-transporting layer 864 is a layer having a function for transporting holes that are injected from the first electrode layer 870 to the light-emitting layer 866. The hole-transporting layer 864 is provided as described above, whereby a distance between the first electrode layer 870 and the light-emitting layer 866 can be created. As a result, quenching of light emission caused by metal included in the first electrode layer 870 and the like can be prevented. The hole-transporting layer 864 is preferably formed using a hole-transporting substance, particularly using a substance that has a hole mobility of $1 \times 10^{-6}$ $cm^2/Vs$ or more. Note that the hole-transporting substance is a substance whose hole mobility is higher than electron mobility and whose value of a ratio of hole mobility with respect to electron mobility (=hole mobility/electron mobility) is preferably larger than 100. As a specific example of a substance that can be used for the hole-transporting layer 864, the following can be given: 4,4'-bis[N-(1-napthyl)-N-phenylamino]biphenyl (abbreviation: NPB), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4''-tris(N-carbazolyl)triphenylamine (abbreviation: TCTA), phthalocyanine (abbreviation: $H_2Pc$), copper phthalocyanine (abbreviation: CuPc), vanadyl phthalocyanine (abbreviation: VOPc), 4,4'-bis[N-(4-biphenylyl)-N-phenylamino]biphenyl (abbreviation: BBPB), or the like. Note that the hole-transporting layer 864 may have a single-layer structure or a stacked structure.

The light-emitting layer 866 is a layer having a light-emitting function, which contains a light-emitting material formed of an organic compound. Alternatively, the light-emitting layer 866 may contain an inorganic compound. The organic compound contained in the light-emitting layer 866 is not particularly limited as long as it is an organic compound with a light-emitting property. Various low molecular organic compounds and high molecular organic compounds can be used. Further, either a fluorescent light-emitting material or a phosphorescent light-emitting material may be used for the organic compound with a light-emitting property. The light-emitting layer 866 may be a layer containing only an organic compound with a light-emitting property or may be a layer that has a structure in which an organic compound with a light-emitting property is dispersed in a host material having a larger energy gap than the organic compound. In a case where the light-emitting layer 866 is a layer in which a plurality of compounds are mixed as a layer containing a light-emitting material formed of the organic compound and the host material, the light-emitting layer 866 can be formed by a co-evaporation method. Here, a co-evaporation method is an evaporation method in which materials are vaporized from a plurality of evaporation sources that are provided in one treatment chamber, and the vaporized materials are mixed in a vapor phase state and then deposited on the object to be processed.

The electron-transporting layer 868 is a layer having a function for transporting electrons that are injected from the second electrode layer 850 to the light emitting layer 866. The electron-transporting layer 868 is provided as described-above, whereby a distance between the second electrode layer 850 and the light-emitting layer 866 can be created. As a result, quenching of light emission caused by metal included in the second electrode layer 850 and the like can be prevented. The electron-transporting layer 868 is preferably formed using an electron-transporting substance, particularly using a substance that has an electron mobility of $1 \times 10^{-6}$ $cm^2/Vs$ or more. Note that the electron-transporting substance is a substance whose electron mobility is higher than hole mobility and whose value of a ratio of electron mobility with respect to hole mobility (=electron mobility/hole mobility) is larger than 100. As a specific example of a substance that can be used for forming the electron-transporting layer 868, the following can be given: 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), 4,4-bis(5-methylbenzoxazol-2-yl)stilbene (abbreviation: BzOs), or the like as well as a metal complex such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), bis[2-(2-hydroxyphenyl)benzoxazolato]zinc (abbreviation: $Zn(BOx)_2$), or bis[2-(2-hydroxyphenyl)benzothiazolato]zinc (abbreviation: $Zn(BTZ)_2$). The electron-transporting layer 868 may have a single-layer structure or a stacked structure.

The electron-injecting layer 869 is a layer having a function for supporting injection of electrons form the second electrode layer 850 to the electron-transporting layer 868. The electron-injecting layer 869 can be formed using a substance having relatively higher electron affinity than that of a substance used for forming the electron-transporting layer 868, which is selected from substances that can be used for forming the electron-transporting layer 868, such as BPhen, BCP, p-EtTAZ, TAZ, and BzOs. When the electron-injecting layer 869 is formed in such a manner, a difference of electron affinity between the second electrode layer 850 and the electron-transporting layer 868 is relieved, and electrons are easily injected. In addition, the electron-injecting layer 869 may contain an inorganic substance such as alkali metal like lithium (Li), cesium (Cs), or the like; oxide of alkali metal like lithium oxide, potassium oxide, sodium oxide, or the like; oxide of alkaline earth metal like calcium oxide, magnesium oxide, or the like; fluoride of alkali metal like lithium fluoride, cesium fluoride, or the like; fluoride of alkaline earth metal like calcium fluoride or the like; or alkaline earth metal like magnesium (Mg), calcium (Ca), or the like. In addition, the electron-injecting layer 869 may have a structure containing the organic compound such as BPhen, BCP, p-EtTAZ, TAZ, or BzOs or may have a structure containing an inorganic compound such as fluoride of alkali metal such as LiF or fluoride of alkaline earth metal such as $CaF_2$. By providing the electron-injecting layer 869 as a thin film having a thickness of 1 nm to 2 nm by using an inorganic compound such as fluoride of alkali metal such as LiF or fluoride of alkaline earth metal such as $CaF_2$, an energy band of the electron-injecting layer 869 is bent, or a tunnel current flows through the electron-injecting layer 869; accordingly, electrons are easily injected from the second electrode layer 850 to the electron-transporting layer 868.

Note that a hole-generating layer may be provided instead of the hole-injecting layer 862, or an electron-generating layer may be provided instead of the electron-injecting layer 869.

Here, the hole-generating layer is a layer for generating holes. The hole-generating layer can be formed by mixing at least one substance selected from hole-transporting substances and a substance showing an electron accepting property with respect to the hole-transporting substance. As the hole-transporting substance, a similar substance to the substance that can be used for forming the hole-transporting layer 864 can be used. As the substance showing an electron accepting property, metal oxide such as molybdenum oxide, vanadium oxide, ruthenium oxide, or rhenium oxide is preferably used.

The electron-generating layer is a layer for generating electrons. The electron-generating layer can be formed by mixing at least one substance selected from electron-transporting substances and a substance showing an electron donating property with respect to the electron-transporting substance. Here, as the electron-transporting substance, a similar substance to the substance that can be used for forming the electron-transporting layer 868 can be used. As the substance showing an electron donating property, a substance selected from alkali metal or alkaline earth metal, specifically lithium (Li), calcium (Ca), sodium (Na), potassium (K), magnesium (Mg), or the like can be used.

The hole-injecting layer 862, the hole-transporting layer 864, the light-emitting layer 866, the electron-transporting layer 868, and the electron-injecting layer 869 may be each formed by an evaporation method, a droplet discharge method, a coating method, or the like. The first electrode layer 870 or the second electrode layer 850 may be formed by a sputtering method, an evaporation method, or the like.

In this embodiment mode, it is acceptable as long as the layer 860 includes at least the light-emitting layer 866, and the layers having other functions (the hole-injecting layer 862, the hole-transporting layer 864, the electron-transporting layer 868, the electron-injecting layer 869, and the like) may be provided as appropriate.

Further, the first electrode layer 870 may be a cathode, and the second electrode layer 850 may be an anode. In that case, the layer 860 has a structure in which an electron-injecting layer, an electron-transporting layer, a light-emitting layer, a hole-transporting layer, and a hole-injecting layer are sequentially stacked from the first electrode layer 870 side.

Next, an inorganic EL element will be described with reference to FIGS. 14A to 14C and FIGS. 15A to 15C. The inorganic EL element is classified into a dispersion-type inorganic EL element and a thin-film-type inorganic EL element, depending on its element structure. The former and the latter are different in that the former has a light-emitting layer in which particles of a light-emitting material are dispersed in a binder, whereas the latter has a light-emitting layer formed of a thin film of a light-emitting material. However, the former and the latter are in common in that they need electrons accelerated by a high electric field. Note that, as a mechanism of light emission that is obtained, there are donor-acceptor recombination-type light emission that utilizes a donor level and an acceptor level, and localized-type light emission that utilizes inner-shell electron transition of a metal ion. In general, a dispersion-type inorganic EL exhibits donor-acceptor recombination-type light emission and a thin-film-type inorganic EL element exhibits localized-type light emission. A light-emitting material that can be used in the present invention includes a base material and an impurity element. The impurity element serves as a luminescent center. By the change of the impurity element to be contained, light emission of various colors can be obtained. Various methods such as a solid-phase method or a liquid-phase method (a coprecipitation method) can be used for forming the light-emitting material. In addition, an evaporative decomposition method, a double decomposition method, a method by heat decomposition reaction of a precursor, a reversed micelle method, a method in which such a method and high temperature baking are combined, a liquid-phase method such as a freeze-drying method, or the like can be used.

A solid-phase method is a method in which a base material and an impurity element or a compound containing an impurity element are weighed, they are mixed in a mortar, and the mixture is heated and baked in an electronic furnace to be reacted, so that the impurity element is contained in the base material. The baking temperature is preferably 700° C. to 1500° C. This is because the solid reaction does not progress when the temperature is too low, whereas the base material is decomposed when the temperature is too high. Note that, although the baking may be carried out in a powder state, it is preferable that the baking be carried out in a pellet state. Although the solid-phase method needs baking at a comparatively high temperature, the solid-phase method is easy; therefore, high productivity is obtained and the solid-phase method is suitable for mass productivity.

A liquid-phase method (a coprecipitation method) is a method in which a base material or a compound containing a base material and an impurity element or a compound containing an impurity element are reacted in a solution, dried, and then baked. Particles of a light-emitting material are distributed uniformly, and the reaction can progress even when the grain size is small and the baking temperature is low.

As a base material used for a light-emitting material, sulfide, oxide, or nitride can be used. For the sulfide, for example, the following can be used: zinc sulfide, cadmium sulfide, calcium sulfide, yttrium sulfide, gallium sulfide, strontium sulfide, barium sulfide, or the like can be used. For the oxide, for example, zinc oxide, yttrium oxide, or the like can be used. For the nitride, for example, aluminum nitride, gallium nitride, indium nitride, or the like can be used. Furthermore, as the base material used for the light-emitting material, zinc selenide, zinc telluride, or the like can also be used. Alternatively, a ternary mixed crystal such as calcium gallium sulfide ($CaGa_2S_4$), strontium gallium sulfide ($SrGa_2S_4$), or barium gallium sulfide ($BaGa_2S_4$) may also be used.

For an impurity element of the localized-type light emission, manganese (Mn), copper (Cu), samarium (Sm), terbium (Th), erbium (Er), thulium (Tm), europium (Eu), cerium (Ce), praseodymium (Pr), or the like can be used. Note that a halogen element such as fluorine (F) or chlorine (Cl) may be added, which can serve as charge compensation.

On the other hand, for an impurity element of the donor-acceptor recombination-type light emission, a light-emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case where the light-emitting material of the donor-acceptor recombination-type light emission is synthesized by a solid-phase method, each of a base material, a first impurity element or a compound containing a first impurity element, and a second impurity element or a compound containing a second impurity element is weighed and mixed in a mortar, and then heated and baked in an electronic furnace. The above-described base material can be used for the base material. As the first impurity element or the compound containing the first impurity element, for example, fluorine (F), chlorine (Cl), aluminum sulfide, or the like can be used. As the second impurity element or the compound containing the second impurity element, for example, copper (Cu), silver (Ag), copper sulfide, silver sulfide, or the like can be used. The baking temperature is preferably 700° C. to 1500° C. This is because the solid reaction does not progress when the temperature is too low, whereas the base material is decomposed when the temperature is too high. Note that, although the baking may be carried out in a powder state, it is preferable that the baking be carried out in a pellet state.

As an impurity element in the case of utilizing solid-phase reaction, a compound including a first impurity element and a second impurity element may be used. In this case, the impurity element is easily diffused and solid-phase reaction easily progresses; thus, a uniform light-emitting material can be obtained. Moreover, since an unnecessary impurity element does not enter, a light-emitting material with high purity can be obtained. As the compound including the first impurity element and the second impurity element, for example, copper chloride, silver chloride, or the like can be used.

Note that these impurity elements may be contained at concentrations of 0.01 atom % to 10 atom %, preferably, 0.05 atom % to 5 atom % with respect to the base material.

In the case of the thin-film-type inorganic element, a light-emitting layer, which contains the above-described light-emitting material, can be formed by a vacuum evaporation method such as a resistance heating evaporation method or an electron beam evaporation (EB evaporation) method; a physical vapor deposition method (PVD) such as a sputtering method; a chemical vapor deposition method (CVD) such as a metal organic CVD method or a low-pressure hydride transport CVD method; an atomic layer epitaxy method (ALE); or the like.

Figure 14A:
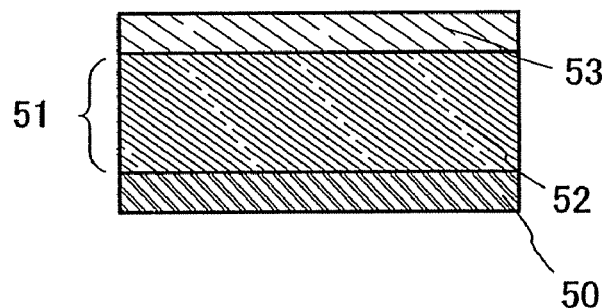
FIGS. 14A to 14C show structures of a light emitting element which can be applied to the present invention.
Figure 14B:
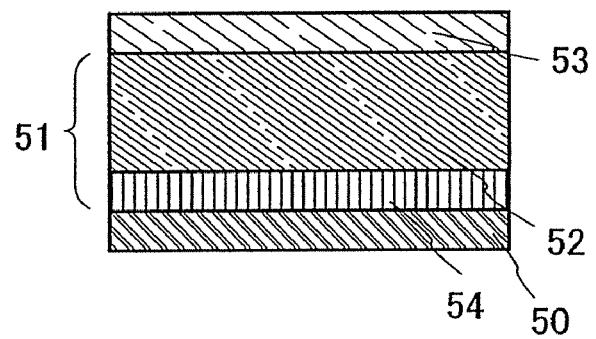
Figure 14C:
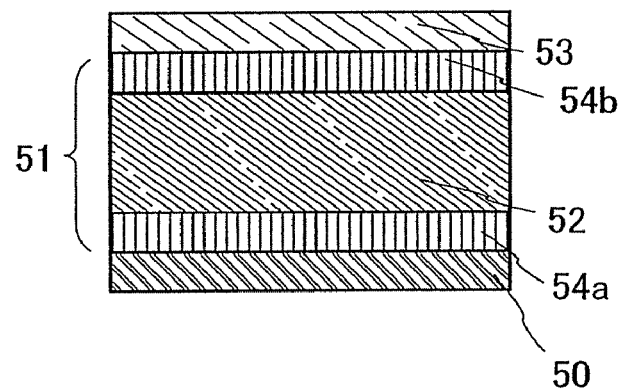

An example of a thin-film-type inorganic EL element that can be used as a light-emitting element is shown in FIGS. 14A to 14C. In FIGS. 14A to 14C, each light-emitting element includes a first electrode layer 50, a layer 51, and a second electrode layer 53. The layer 51 includes at least a light-emitting layer 52.

In the light-emitting element shown in FIG. 14A, the layer 51 including only the light-emitting layer 52 is interposed between the first electrode layer 50 and the second electrode layer 53. The light-emitting element shown in FIG. 14B has a structure in which an insulating layer 54 is provided between the first electrode layer 50 and the light-emitting layer 52 in the light-emitting element of FIG. 14A. The light-emitting element shown in FIG. 14C has a structure in which an insulating layer 54a is provided between the first electrode layer 50 and the light-emitting layer 52 and an insulating layer 54b is provided between the second electrode layer 53 and the light-emitting layer 52 in the light-emitting element of FIG. 14A. As the above, an insulating layer may be provided between the light-emitting layer and one of a pair of the electrode layers that sandwiches the light-emitting layer. Alternatively, an insulating layer may be provided between a light-emitting layer and one of a pair of electrode layers that sandwich the light-emitting layer and another insulating layer may be provided between the light-emitting layer and the other one of the pair of electrode layers. The insulating layer may have a single-layer structure or a stacked structure.

In FIG. 14B, the insulating layer 54 is provided to be in contact with the first electrode layer 50; however, the order of the insulating layer and the light-emitting layer may be reversed so that the insulating layer 54 is provided to be in contact with the second electrode layer 53.

Next, a dispersion-type inorganic EL element will be described. In the case of the dispersion-type inorganic EL element, particulate light-emitting materials are dispersed in a binder, so that a film-shaped light-emitting layer is formed. When particles having a desired size cannot be sufficiently obtained by a formation method of a light-emitting material, the light-emitting materials may be processed into particles by crushing in a mortar or the like. The binder is a substance for fixing the particulate light-emitting materials in a dispersion state and holding the light-emitting materials in a form of a light-emitting layer. The light-emitting materials are uniformly dispersed in the light-emitting layer by the binder and are fixed.

In the case of the dispersion-type inorganic EL element, as a formation method of a light-emitting layer, a droplet discharge method capable of selectively forming a light-emitting layer; a printing method (such as screen printing or offset printing); or a coating method such as a spin coating method; a dipping method; a dispenser method; or the like can be used. Although there is no particular limitation on the thickness of the light-emitting layer, the thickness thereof is preferably in a range of 10 nm to 1000 nm. The ratio of the light-emitting material in the light-emitting layer containing the light-emitting material and the binder may be greater than or equal to 50 wt % and less than or equal to 80 wt %.

Figure 15A:
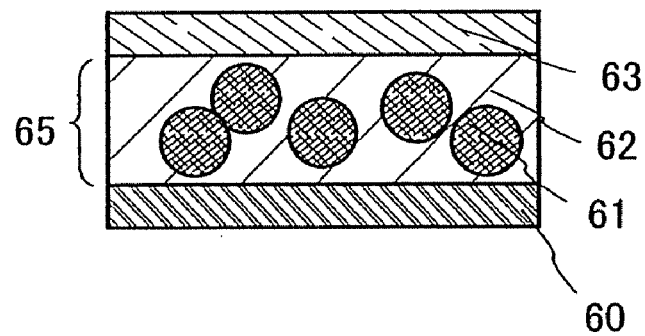
FIGS. 15A to 15C show structures of a light emitting element which can be applied to the present invention.
Figure 15B:
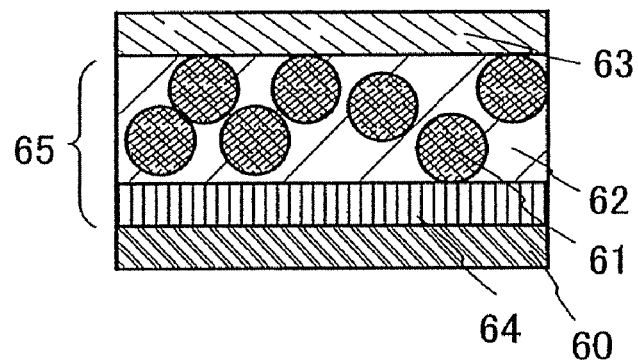
Figure 15C:
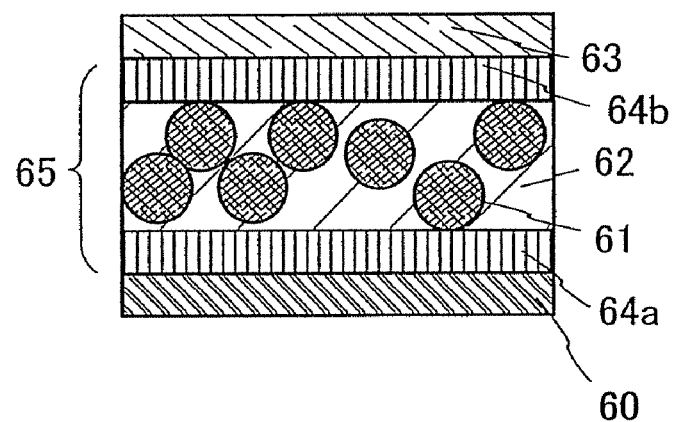

Examples of a dispersion-type inorganic EL element that can be used as a light-emitting element are shown in FIGS. 15A to 15C. In FIGS. 15A to 15C, each light-emitting element includes a first electrode layer 60, a layer 65, and a second electrode layer 63. The layer 65 includes at least a light-emitting layer.

The light-emitting element shown in FIG. 15A has a stacked structure of the first electrode layer 60, the light-emitting layer 62, and the second electrode layer 63. In the light-emitting layer 62, light-emitting materials 61 held by a binder are included.

As a binder that can be used in this embodiment mode, an insulating material can be used. Specifically, an organic insulating material or an inorganic insulating material can be used, and a mixture material of an organic insulating material and an inorganic insulating material may be used. As an organic insulating material, polymer that has relatively high dielectric constant like a cyanoethyl cellulose-based resin; or a resin such as polyethylene, polypropylene, a polystyrene-based resin, a silicone resin, an epoxy resin, or vinylidene fluoride can be used. Alternatively, a heat-resistant polymer such as aromatic polyamide or polybenzoimidazole, or a siloxane resin may be used. Note that the siloxane resin corresponds to a resin having Si—O—Si bonds. Siloxane has a skeleton structure formed from a bond of silicon (Si) and oxygen (O) and has an organic group containing at least hydrogen (for example, an alkyl group or aromatic hydrocarbon) as a substituent. Alternatively, as the substituent, a fluoro group may be used. Further alternatively, as the substituent, an organic group containing at least hydrogen, and a fluoro group may be used. A vinyl resin such as polyvinyl alcohol or polyvinyl butyral, or another resin material such as a phenol resin, a novolac resin, an acrylic resin, a melamine resin, a urethane resin, or an oxazole resin (polybenzoxazole) may also be used. A dielectric constant can also be controlled by mixing these resins with microparticles having a high dielectric constant such as barium titanate ($BaTiO_3$) or strontium titanate ($SrTiO_3$) as appropriate.

As the inorganic material contained in the binder, the following can be used: a material selected from silicon oxide, silicon nitride, silicon containing oxygen and nitrogen, aluminum nitride, aluminum containing oxygen and nitrogen, aluminum oxide, titanium oxide, $BaTiO_3$, $SrTiO_3$, lead titanate, potassium niobate, lead niobate, tantalum oxide, barium tantalate, lithium tantalate, yttrium oxide, zirconium oxide, and other substances containing an inorganic material. When an inorganic material having high dielectric constant is mixed with an organic material (by addition or the like), a dielectric constant of a light-emitting layer including a light-emitting material and a binder can be further controlled and increased. A mixed layer of an inorganic insulating material and an organic insulating material is used for a binder, and the high dielectric constant is obtained, whereby further high electric charge can be induced by the light-emitting material.

In the manufacturing process, the light-emitting materials are dispersed in a solution containing a binder. As a solvent of the solution containing a binder that can be used in this embodiment, it is acceptable as long as a solvent that dissolves a binder material and that can make a solution with the viscosity of which is appropriate for a method of forming a light-emitting layer (various wet processes) and for a desired thickness. When an organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting element shown in FIG. 15B has a structure in which an insulating layer 64 is provided between the first electrode layer 60 and the light-emitting layer 62 in the light-emitting element of FIG. 15A. The light-emitting element shown in FIG. 15C has a structure in which an insulating layer 64a is provided between the first electrode layer 60 and the light-emitting layer 62 and an insulating layer 64b is provided between the second electrode layer 63 and the light-emitting layer 62 in the light-emitting element of FIG. 15A. As described above, the insulating layer may be provided between the light-emitting layer and one of a pair of electrode layers that sandwiches the light-emitting layer. Alternatively, an insulating layer may be provided between the light-emitting layer and one of a pair of electrode layers that sandwiches the light-emitting layer and another insulating layer may be provided between the light-emitting layer and the other one of the pair of electrode layers. The insulating layer may have a single-layer structure or a stacked structure.

In FIG. 15B, the insulating layer 64 is provided to be in contact with the first electrode layer 60; however, the order of the insulating layer and the light-emitting layer may be reversed so that the insulating layer 64 is provided to be in contact with the second electrode layer 63.

Insulating layers such as the insulating layer 54 in FIGS. 14A to 14C and the insulating layer 64 in FIGS. 15A to 15C are not particularly limited; however, it is preferable that the insulating layer have high withstand voltage, be a dense film, and furthermore have high dielectric constant. For example, the insulating layer can be formed using silicon oxide, yttrium oxide, titanium oxide, aluminum oxide, hafnium oxide, tantalum oxide, barium titanate, strontium titanate, lead titanate, silicon nitride, zirconium oxide, or the like; a mixed layer thereof; or a stacked layer containing two or more kinds of these. These insulating layers can be formed by a sputtering method, an evaporating method, a CVD method, or the like. Alternatively, the insulating layer may be formed in such a manner that particles of these insulating materials are dispersed in a binder. A binder material may be formed of a material that is similar to that of a binder contained in a light-emitting layer and may be formed by a method that is similar thereto. Although there is no particular limitation on a thickness of the insulating layer, the thickness thereof is preferably in a range of 10 nm to 1000 nm.

The inorganic EL elements shown in FIGS. 14A to 14C and FIGS. 15A to 15C can obtain light emission by applying a voltage between a pair of electrode layers that sandwich the light-emitting layer; however, the light-emitting element can also operate by either DC driving or AC driving.

The light-emitting elements shown in this embodiment mode (FIG. 13, FIGS. 14A to 14C, and FIGS. 15A to 15C) can be provided as a display element of a display device shown in the above embodiment modes.

Figure 12C:
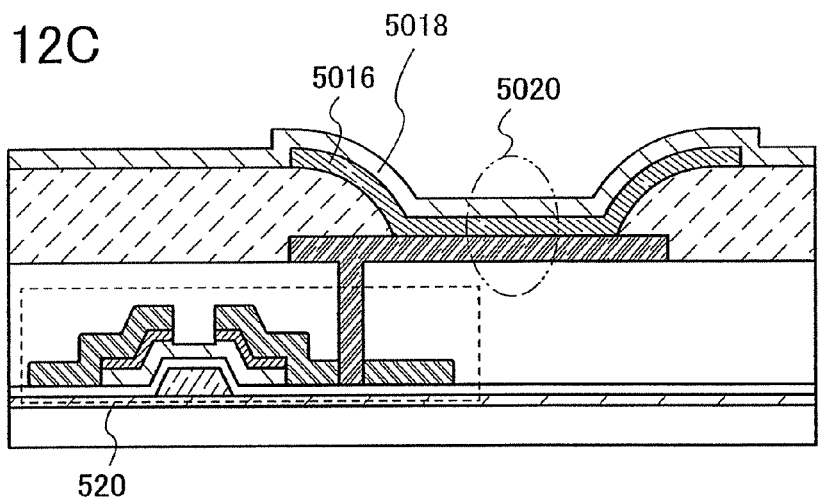

For example, in a case where the organic EL element shown in FIG. 13 is applied to the display device shown in FIGS. 12A to 12C, the first electrode layer 5012 or the second electrode layer 5018 corresponds to the first electrode layer 870 or the second electrode layer 850. The layer 5016 corresponds to the layer 860. In the case of the display device shown in FIGS. 19A and 19B, similarly, the first electrode layer 932 or the second electrode layer 936 corresponds to the first electrode layer 870 or the second electrode layer 850. The layer 934 corresponds to the layer 860.

Further, the case is similar to the above, in which the inorganic EL elements shown in FIGS. 14A to 14C and FIGS. 15A to 15C are applied to the display device shown in FIGS. 12A to 12C. The first electrode layer 5012 or the second electrode layer 5018 corresponds to the first electrode layer 50 or the second electrode layer 53 in FIGS. 14A to 14C, or the first electrode layer 60 or the second electrode layer 63 in FIGS. 15A to 15C. The layer 5016 corresponds to the layer 51 or the layer 65. In the case of the display device shown in FIGS. 19A and 19B, similarly, the first electrode layer 932 or the second electrode layer 936 corresponds to the first electrode layer 50 or the second electrode layer 53 in FIGS. 14A to 14C, or the first electrode layer 60 or the second electrode layer 63 in FIGS. 15A to 15C. The layer 934 corresponds to the layer 51 or the layer 65.

A layer of an electrode or the like used for forming an element can be formed with a desired shape according to the present invention. Further, the number of lithography processes using a photoresist can be reduced and simplified, and the throughput can be improved.

This embodiment mode can be freely combined with any of Embodiment Modes 1 to 8 as appropriate.

Embodiment Mode 10

In this embodiment mode, a liquid crystal display device will be described.

Figures 26A, 26B:
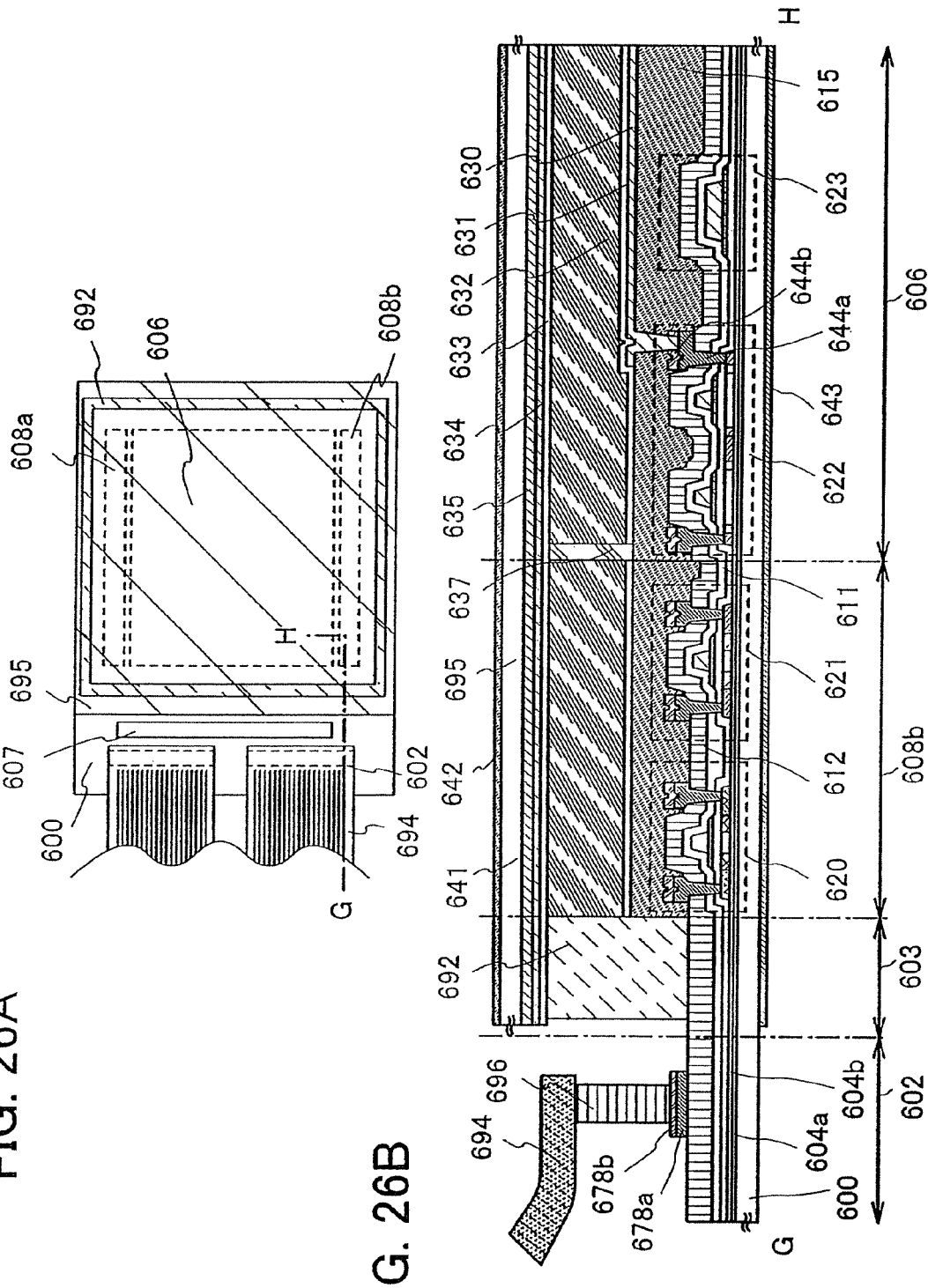
FIGS. 26A and 26B show an example of a display device of the present invention.

FIG. 26A is a top view of a liquid crystal display device, and FIG. 26 B is a cross-sectional view of FIG. 26A taken along a line G-H.

As shown in FIG. 26A, a pixel region 606, a driver circuit region 608a that is a scanning line driver circuit, and a driver circuit region 608b that is a scanning line driver region are sealed between a substrate 600 and a sealing substrate 695 with a sealant 692. A driver circuit region 607 that is a signal line driver circuit formed using an IC driver is provided over the substrate 600. In the pixel region 606, a transistor 622 and a capacitor 623 are provided, and in the driver circuit region 608b, a driver circuit including a transistor 620 and a transistor 621 is provided. A substrate similar to that in the above embodiment mode can be used as the substrate 600. Although there is concern that a substrate made of a synthetic resin generally has lower allowable temperature limit than other substrates, the substrate made of a synthetic resin can be employed by transfer after a manufacturing process using a high heat-resistant substrate.

In the pixel region 606, the transistor 622 functioning as a switching element is provided over the substrate 600 with a base insulating layer 604a and a base insulating layer 604b interposed therebetween. In this embodiment mode, the transistor 622 is a multi-gate thin film transistor, which includes a semiconductor layer including impurity regions that serve as a source region and a drain region, a gate insulating layer, a gate electrode layer having a stacked structure of two layers, and a source electrode layer and a drain electrode layer. The source electrode layer or drain electrode layer is in contact with and is electrically connected to the impurity region of the semiconductor layer and a pixel electrode layer 630.

The source electrode layer or drain electrode layer has a stacked structure. Source electrode or drain electrode layers 644a and 644b are electrically connected to the pixel electrode layer 630 in an opening formed in an insulating layer 615. The opening in the insulating layer 615 can be formed utilizing ablation by irradiation with a laser beam shown in the above embodiment mode. In this embodiment mode, a low-melting metal that is comparatively easy to evaporate (chromium in this embodiment mode) is used for the source electrode layer or drain electrode layer 644b, and a high-melting metal that is less easy to evaporate than the source electrode layer or drain electrode layer 644b (tungsten in this embodiment mode) is used for the source electrode layer or drain electrode layer 644a. The source electrode layer or drain electrode layer 644b is irradiated with a laser beam through a photomask from the insulating layer 615 side, and an irradiated region of the source electrode layer or drain electrode layer 644b and a part of the insulating layer 615 over the irradiated region are removed by the irradiation energy, so that an opening reaching the source electrode layer or drain electrode layer 644b can be formed. Moreover, the source electrode layer or drain electrode layer 644b is removed by etching with the use of the insulating layer 615 as a mask, so that an opening reaching the source electrode layer or drain electrode layer 644a is formed. In forming the opening by etching, a wet etching method, a dry etching method, or both of the methods may be used, and the method may be performed plural times.

The pixel electrode layer 630 is formed in the opening where the source electrode or drain electrode layers 644a and 644b are exposed, so that the source electrode or drain electrode layers 644a and 644b can be electrically connected to the pixel electrode layer 630. Note that the pixel electrode layer 630 may be formed without forming an opening in the source electrode layer or drain electrode layer 644b.

A thin film transistor can be manufactured by various methods. For example, a crystalline semiconductor layer is employed as an active layer. A gate electrode layer is provided over a crystalline semiconductor layer with a gate insulating layer interposed therebetween. An impurity element can be added to the active layer using the gate electrode layer. By addition of an impurity element using the gate electrode layer in this manner, a mask does not need to be formed for addition of an impurity element. The gate electrode layer can have a single-layer structure or a stacked structure. The impurity region can be formed into a high-concentration impurity region and a low-concentration impurity region by controlling the concentration thereof. A thin film transistor having a low-concentration impurity region in this manner is referred to as an LDD (Lightly Doped Drain) structure. The low-concentration impurity region can be formed to be overlapped with the gate electrode, and such a thin film transistor is referred to as a GOLD (Gate Overlapped LDD) structure. The thin film transistor is formed to have an n-type polarity by using phosphorus (P) in the impurity region. In a case of a p-type polarity, boron (B) or the like may be added. After that, an insulating film 611 and an insulating film 612 are formed to cover the gate electrode layer and the like. Dangling bonds of the crystalline semiconductor layer can be terminated by hydrogen mixed in the insulating layer 611 (and the insulating layer 612).

In order to further improve planarity, the insulating layer 615 may be formed as an interlayer insulating layer. The insulating layer 615 can be formed using an organic insulating material or an inorganic insulating material to have a single-layer structure or a stacked structure. For example, the insulating layer 615 can be formed of a material selected from substances including an inorganic insulating material such as silicon oxide, silicon nitride, silicon oxynitride, silicon nitride oxide, aluminum nitride, aluminum oxynitride, aluminum nitride oxide having a higher content of nitrogen than that of oxygen, aluminum oxide, diamond-like carbon (DLC), polysilazane, a nitrogen-containing carbon (CN), phosphosilicate glass (PSG), borophosphosilicate glass (BPSG), and alumina. Alternatively, an organic insulating material may be used; an organic material may be either photosensitive or non-photosensitive; and polyimide, acrylic, polyamide, polyimide amide, a resist, benzocyclobutene, a siloxane resin, or the like can be used. Note that the siloxane resin corresponds to a resin having Si—O—Si bonds. Siloxane has a skeleton structure formed from a bond of silicon (Si) and oxygen (O). As a substituent, an organic group containing at least hydrogen (for example, an alkyl group or aromatic hydrocarbon) is used. A fluoro group may be used as the substituent. Alternatively, an organic group containing at least hydrogen and a fluoro group may be used as the substituent.

By using a crystalline semiconductor layer, the pixel region and the driver circuit region can be formed over the same substrate. In that case, the transistor in the pixel region and the transistor in the driver circuit region 608b are formed simultaneously. The transistor used in the driver circuit region 608b constitutes a part of a CMOS circuit. Although the thin film transistor included in the CMOS circuit has a GOLD structure, it may have an LDD structure like the transistor 622.

Without limitation to this embodiment mode, the thin film transistor in the pixel region 606 may have a single-gate structure in which a single channel formation region is formed, a double-gate structure in which two channel formation regions are formed, or a triple-gate structure in which three channel formation regions are formed. In addition, the thin film transistor of a peripheral driver circuit region may also have a single-gate structure, a double-gate structure, or a triple-gate structure.

Note that without limitation to the formation method of a thin film transistor described in this embodiment mode, the present invention can be used in a top-gate structure (such as a staggered structure), a bottom-gate structure (such as an inverted staggered structure), a dual-gate structure including two gate electrode layers provided above and below a channel region each with a gate insulating film interposed therebetween, or another structure.

Next, an insulating layer 631 called an orientation film is formed by a printing method or a droplet discharge method to cover the pixel electrode layer 630. Note that the insulating layer 631 can be selectively formed by using a screen printing method or an offset printing method. After that, rubbing treatment is performed. The rubbing treatment is not necessarily performed when the mode of liquid crystal is, for example, a VA mode. An insulating layer 633 serving as an orientation film is similar to the insulating layer 631. Then, the sealant 692 is formed by a droplet discharge method in a peripheral region of the pixel region.

After that, the sealing substrate 695 provided with the insulating layer 633 serving as an orientation film, a conductive layer 634 serving as an opposite electrode, a colored layer 635 serving as a color filter, a polarizer 641 (also referred to as a polarizing plate), and a polarizer 642 is attached to the substrate 600 that is a TFT substrate with a spacer 637 interposed therebetween, and a liquid crystal layer 632 is provided in a gap therebetween. Since the liquid crystal display device of this embodiment mode is of transmissive type, a polarizer (polarizing plate) 643 is provided on a side of the substrate 600 opposite to the side of having elements. The polarizer can be provided over the substrate using an adhesive layer. The sealant may be mixed with a filler, and further, the sealing substrate 695 may be provided with a shielding film (black matrix), or the like. Note that the color filter or the like may be formed of materials exhibiting red (R), green (G), and blue (B) when the liquid crystal display device performs full color display. When performing monochrome display, the colored layer may be omitted or formed of a material exhibiting at least one color.

Note that the color filter is not provided in some cases where light-emitting diodes (LEDs) of RGB or the like are arranged as a backlight and a successive additive color mixing method (field sequential method) in which color display is performed by time division is employed. The black matrix is preferably provided so as to be overlapped with a transistor and a CMOS circuit for the sake of reducing reflection of external light by wirings of the transistor and the CMOS circuit. Note that the black matrix may be provided so as to be overlapped with a capacitor. This is because reflection by a metal film forming the capacitor can be prevented.

The liquid crystal layer can be formed by a dispenser method (dropping method), or an injecting method by which liquid crystal is injected using a capillary phenomenon after attaching the substrate 600 including an element to the sealing substrate 695. A dropping method is preferably employed when using a large-area substrate to which it is difficult to apply an injecting method.

Although the spacer may be provided in such a way that particles each having a size of several micrometers are sprayed, the spacer in this embodiment mode is formed by a method in which a resin film is formed over an entire surface of the substrate and then etched. A material of the spacer is applied by a spinner and then subjected to light exposure and development to form a predetermined pattern. Moreover, the material is heated at 150° C. to 200° C. in a clean oven or the like so as to be hardened. The thus manufactured spacer can have various shapes depending on the conditions of the light exposure and development. It is preferable that the spacer have a columnar shape with a flat top so that mechanical strength of the liquid crystal display device can be secured when the opposite substrate is attached. The shape can be conical, pyramidal, or the like, and there is no particular limitation on the shape.

Subsequently, terminal electrode layers 678a and 678b electrically connected to the pixel region is provided with an FPC 694 that is a wiring board for connection, through an anisotropic conductive layer 696. The FPC 694 functions to transmit external signals or potential. Through the above steps, a liquid crystal display device having a display function can be manufactured.

A wiring and a gate electrode layer which are included in the transistor, the pixel electrode layer 630, and the conductive layer 634 that is an opposite electrode layer can be formed using a material selected from indium tin oxide (ITO), indium zinc oxide (IZO) formed using a target in which indium oxide is mixed with zinc oxide (ZnO), a conductive material in which indium oxide is mixed with silicon oxide ($SiO_2$), organoindium, organotin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu) or silver (Ag); an alloy containing the above metal as its main component; or metal nitride thereof.

A retardation film may be stacked between the polarizing plate and the liquid crystal layer.

Although a TN liquid crystal panel is described in this embodiment mode, the above process can be similarly applied to a liquid crystal panel of another type. For example, this embodiment mode can be applied to a liquid crystal panel of a transverse electrical field type in which liquid crystal is orientated by applying an electric field parallel to a glass substrate. Further, this embodiment mode can be applied to a liquid crystal panel of a VA (Vertical Alignment) type.

Figure 23:
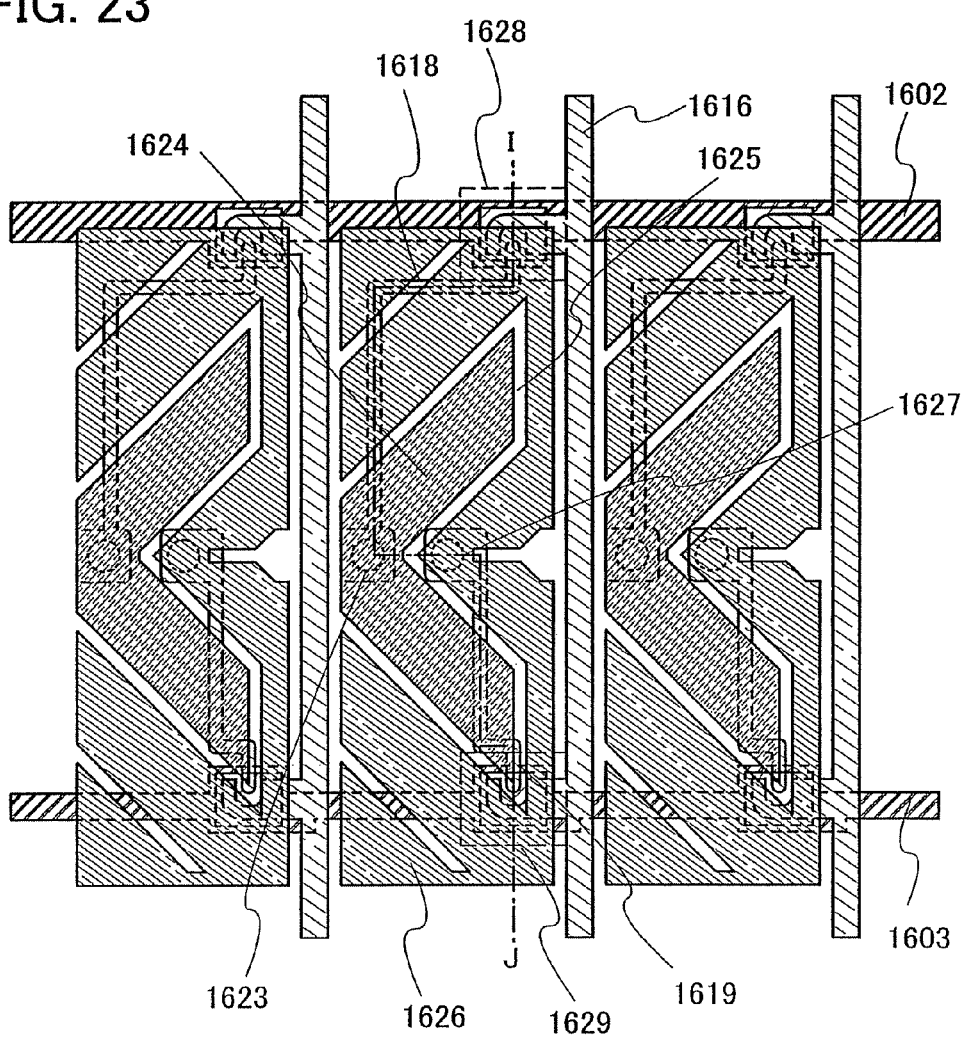
FIG. 23 shows an example of a display device of the present invention.
Figure 24:
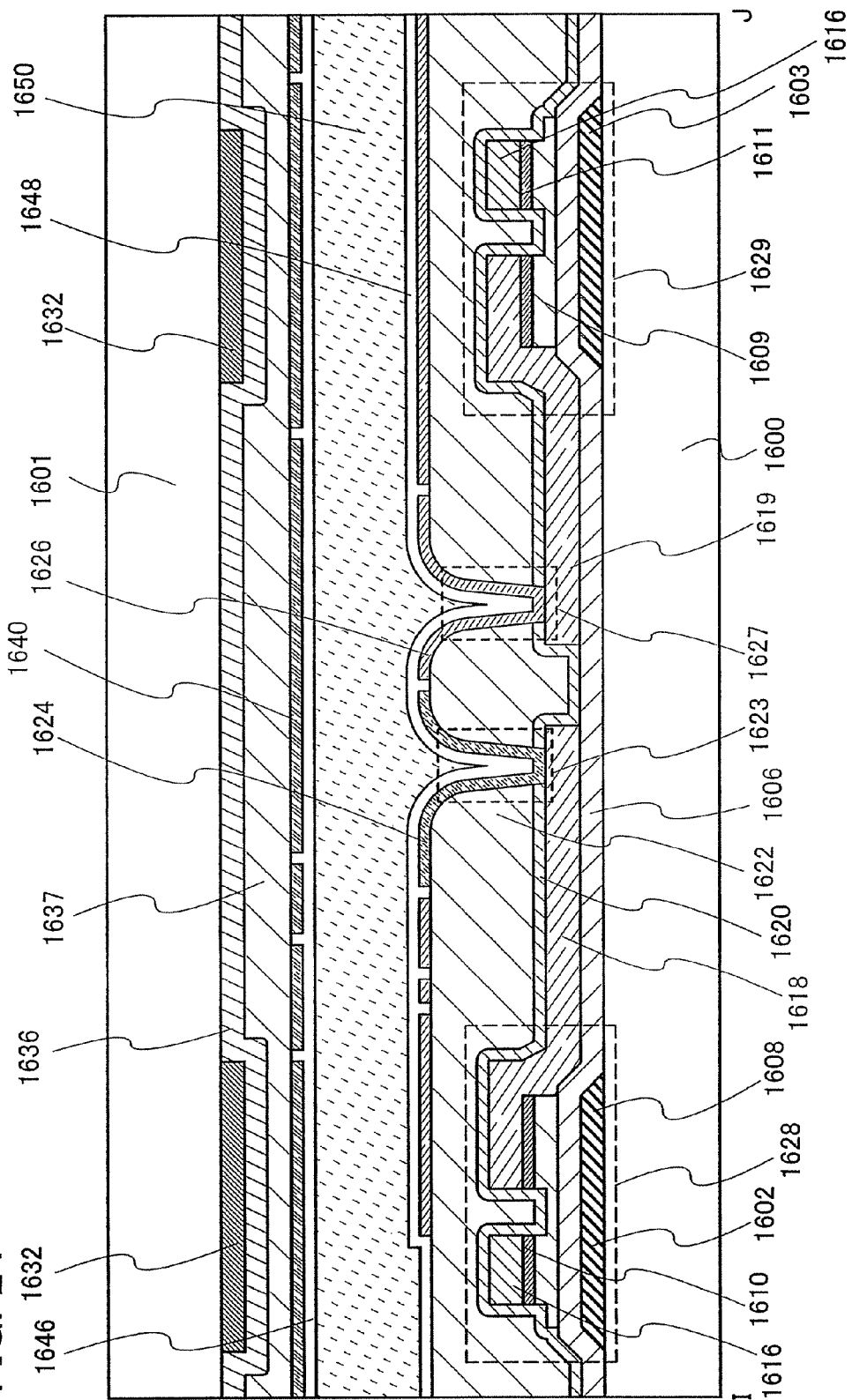
FIG. 24 shows an example of a display device of the present invention.

FIGS. 23 and 24 show a pixel structure of a VA-type liquid crystal panel. FIG. 23 is a plane view, and FIG. 24 is a cross-sectional view of a structure taken along a line I-J in FIG. 23. Hereinafter, the pixel structure is explained with reference to both drawings.

In this pixel structure, a plurality of pixel electrodes are included in one pixel, and TFTs are connected to the pixel electrodes. Each of the TFTs is driven by a different gate signal. In other words, a multi-domain pixel has a structure in which signals applied to the pixel electrodes are individually controlled.

A pixel electrode layer 1624 is connected with a TFT 1628 through a wiring layer 1618 using an opening (contact hole) 1623. A pixel electrode layer 1626 is connected with a TFT 1629 through a wiring layer 1619 using an opening (contact hole) 1627. A gate wiring layer 1602 of the TFT 1628 and a gate electrode layer 1603 of the TFT 1629 are separated so that different gate signals can be given. On the other hand, a wiring layer 1616 serving as a data line is used in common for the TFT 1628 and the TFT 1629.

The pixel electrode layer 1624 and the pixel electrode layer 1626 may be formed utilizing ablation by irradiation with a laser beam through a photomask as shown in the above embodiment mode. A mask formed from a light absorption layer is formed by laser ablation, and a layer to be processed in a lower layer is processed by etching using the mask, so that a desired pixel electrode layer can be obtained. By implementation of the present invention in such a manner, the number of lithography processes can be reduced; therefore, the steps are simplified, and the throughput can be improved. Further, impurity contamination by photoresist or the like can be prevented.

Figure 25:
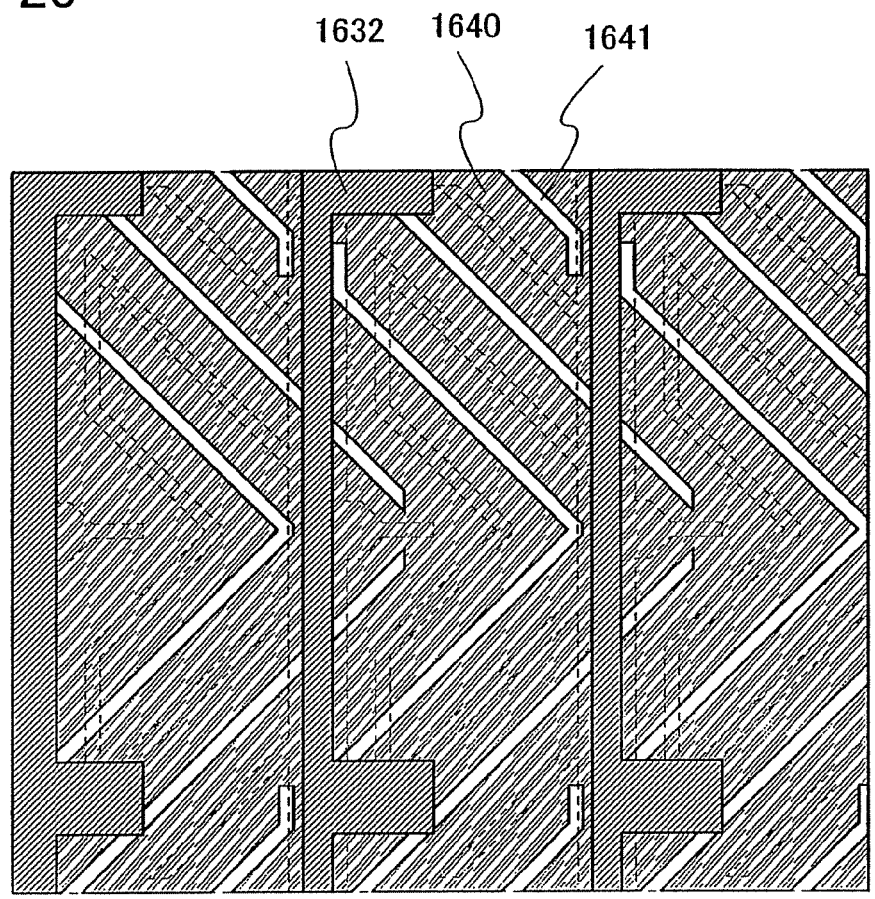
FIG. 25 shows an example of a display device of the present invention.

A shape of the pixel electrode layer 1624 and a shape of the pixel electrode layer 1626 are different from each other, and those pixel electrode layers are separated by a slit 1625. The pixel electrode layer 1626 is formed so as to surround the external side of the pixel electrode layer 1624 that is spread in a V-shaped manner. Timing of voltage application is made to vary between the pixel electrode layer 1624 and the pixel electrode layer 1626 by the TFT 1628 and the TFT 1629, whereby orientation of liquid crystal is controlled. An opposite substrate 1601 is provided with a light-blocking layer 1632, a colored layer 1636, and an opposite electrode layer 1640. Furthermore, a planarization layer 1637 is formed between the colored layer 1636 and the opposite electrode layer 1640, whereby orientation disorder of liquid crystal is prevented. FIG. 25 shows a structure of the opposite substrate side. Although the opposite electrode layer 1640 is used in common between different pixels, a slit 1641 is formed. This slit 1641 and the slit 1625 on the pixel electrode layers 1624 and 1626 side are arranged to be meshed alternately, whereby an oblique electric field is efficiently generated, and orientation of liquid crystal can be controlled. Thus, directions in which liquid crystal is orientated can be varied depending on places, and a viewing angle is widened.

This embodiment mode can be freely combined with any of Embodiment Modes 1 to 6 as appropriate.

By applying the present invention, the number of lithography processes can be reduced, and a manufacturing process can be simplified; therefore, the throughput can be improved. As a result, a display device can be manufactured with high mass productivity.

In addition, resist coating, a development step, and the like can be omitted; therefore, there is no need for rotating a substrate, and then a large-area substrate is easily treated. Furthermore, when a linear laser beam or a planar laser beam having a large area such as a rectangular laser beam or a circular laser beam is used, a plurality of regions can be irradiated with a laser beam in a short time. As a result, many patterns can be formed in a short time over a large-area substrate, and a display device can be manufactured with high mass productivity.

Embodiment Mode 11

In this embodiment mode, a liquid crystal display device using a liquid crystal display element for a display element will be described.

Figure 27:
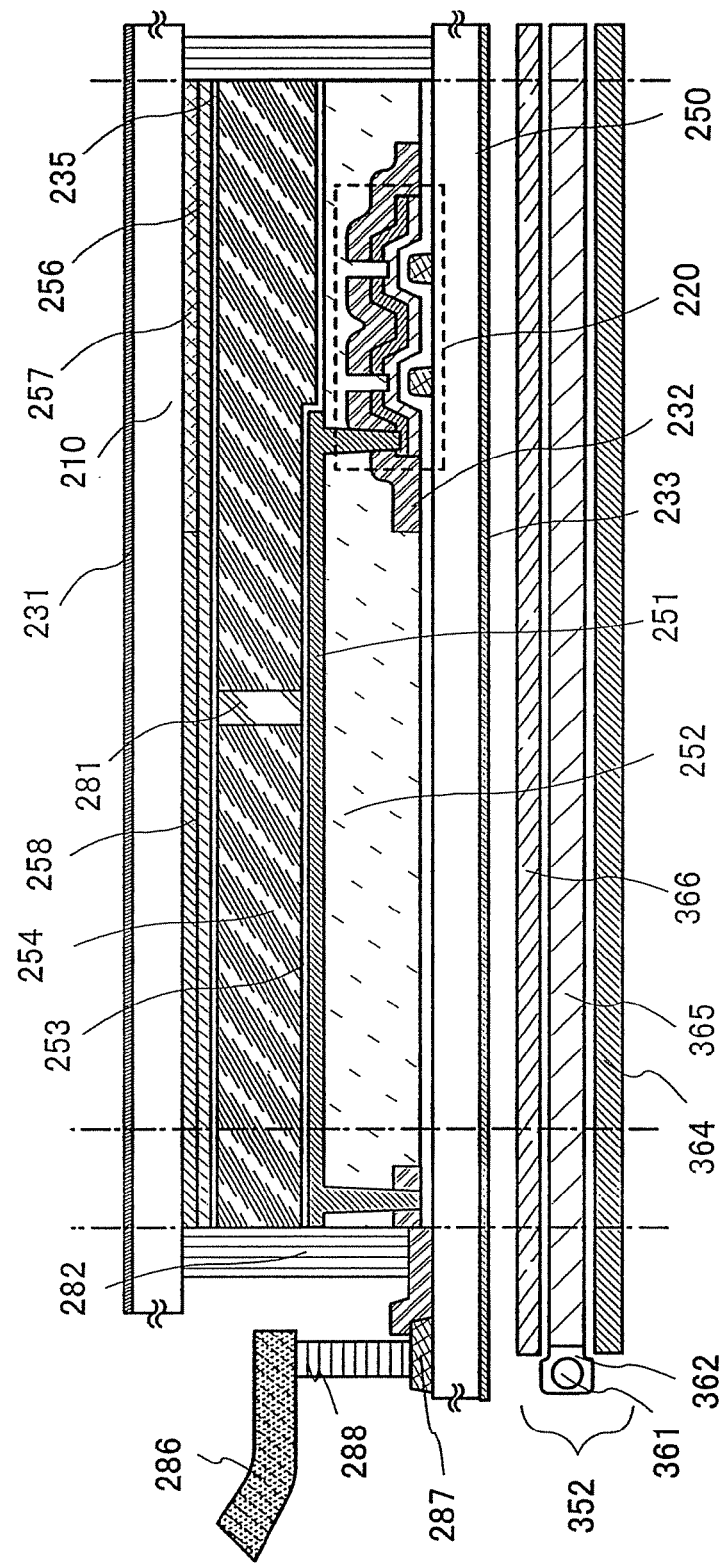
FIG. 27 shows an example of a display device of the present invention.

In a display device shown in FIG. 27, the following is provided over a substrate 250: a transistor 220 that is an inverted staggered transistor, a pixel electrode layer 251, an insulating layer 252, an insulating layer 253, a liquid crystal layer 254, a spacer 281, an insulating layer 235, an opposite electrode layer 256, a color filter 258, a black matrix 257, an opposite substrate 210, a polarizing plate (polarizer) 231, a polarizing plate (polarizer) 233 in a pixel region; and a sealant 282, a terminal electrode layer 287, an anisotropic conductive layer 288, and an FPC 286 in a sealing region.

A gate electrode layer, a semiconductor layer, a source electrode layer, and a drain electrode layer of the transistor 220 that is an inverted staggered transistor, and the pixel electrode layer 251 formed in this embodiment mode may be formed, as shown in Embodiment Mode 1 or the like, by the following: a mask is formed utilizing ablation by irradiation with a laser beam; and etching is performed using the mask. With the use of the present invention in such a manner, the number of lithography processes using a photoresist can be reduced and simplified, and the throughput can be improved.

In this embodiment mode, an amorphous semiconductor layer is used as a semiconductor layer for forming a channel. A semiconductor layer having one conductivity type provided between a source electrode layer or drain electrode layer and the semiconductor layer for forming a channel may be formed as needed. In this embodiment mode, a semiconductor layer for forming a channel and an amorphous n-type semiconductor layer as a semiconductor layer having one conductivity type are stacked. Moreover, an NMOS structure of an n-channel thin film transistor where an n-type semiconductor layer is formed as a semiconductor layer for forming a channel, a PMOS structure of a p-channel thin film transistor where a p-type semiconductor layer is formed, or a CMOS structure of an n-channel thin film transistor and a p-channel thin film transistor can be manufactured.

In order to impart conductivity, an element for imparting a conductivity type is added by doping, and an impurity region is formed in the semiconductor layer, whereby an n-channel transistor or a p-channel transistor can be formed. Instead of forming an n-type semiconductor layer, plasma treatment using a $PH_3$ gas may be performed, so that a conductivity type is imparted to the semiconductor layer.

In this embodiment mode, the transistor 220 is an n-channel inverted staggered thin-film transistor. A channel protection-type inverted staggered thin-film transistor can be used, where a protective layer is provided over a channel region of a semiconductor layer.

Next, a structure of a backlight unit 352 is explained. The backlight unit 352 includes a cold cathode tube, a hot cathode tube, a light-emitting diode, an inorganic EL, or an organic EL as a light source 361 that emits fluorescence; a lamp reflector 362 for effectively leading fluorescence to a light conducting plate 365; the light conducting plate 365 by which fluorescent is totally reflected and light is led to the entire surface of the display panel; a diffusing plate 366 for reducing variations in brightness; and a reflector plate 364 for reusing light leaked under the light conducting plate 365.

A control circuit for controlling the luminance of the light source 361 is connected to the backlight unit 352. The luminance of the light source 361 can be controlled by a signal supplied from the control circuit.

The source electrode layer or drain electrode layer of the transistor 220 is electrically connected to the pixel electrode layer 251 in an opening that is formed in the insulating layer 252. The opening formed in the insulating layer 252 may be formed utilizing ablation by irradiation with a laser beam as shown in the above embodiment mode or may be formed using a lithography technique. In this embodiment mode, a low-melting metal that is comparatively easy to evaporate (chromium in this embodiment mode) is used for the source electrode layer or drain electrode layer. The source electrode layer or drain electrode layer is irradiated with a laser beam through a photomask from the insulating layer 252 side, whereby an irradiated region of the source electrode layer or drain electrode layer and a part of the insulating layer 252 over the irradiated region are removed by irradiation energy, and an opening reaching the semiconductor layer having one conductivity type can be formed.

The pixel electrode layer 251 is formed in the opening where the source electrode layer or drain electrode layer and the semiconductor layer having one conductivity type are exposed, and thus, the pixel electrode layer 251 can be electrically connected to the semiconductor layer having one conductivity and the source electrode layer or drain electrode layer.

By applying the present invention, the number of lithography processes can be reduced, and a manufacturing process can be simplified; therefore, the throughput can be improved. As a result, a display device can be manufactured with high mass productivity.

In addition, resist coating, a development step, or the like can be omitted; therefore, there is no need for rotating a substrate, and then a large-area substrate is easily treated. Furthermore, when a linear laser beam or a planar laser beam having a large area such as a rectangular laser beam or a circular laser beam is used, a plurality of regions can be irradiated with a laser beam in a short time. As a result, many patterns can be formed in a short time over a large-area substrate, and a display device can be manufactured with high mass productivity.

This embodiment mode can be freely combined with any of Embodiment Modes 1 to 6 as appropriate.

Embodiment Mode 12

In this embodiment mode, an example of a display device different from that of the above embodiment mode will be described.

Figure 29:
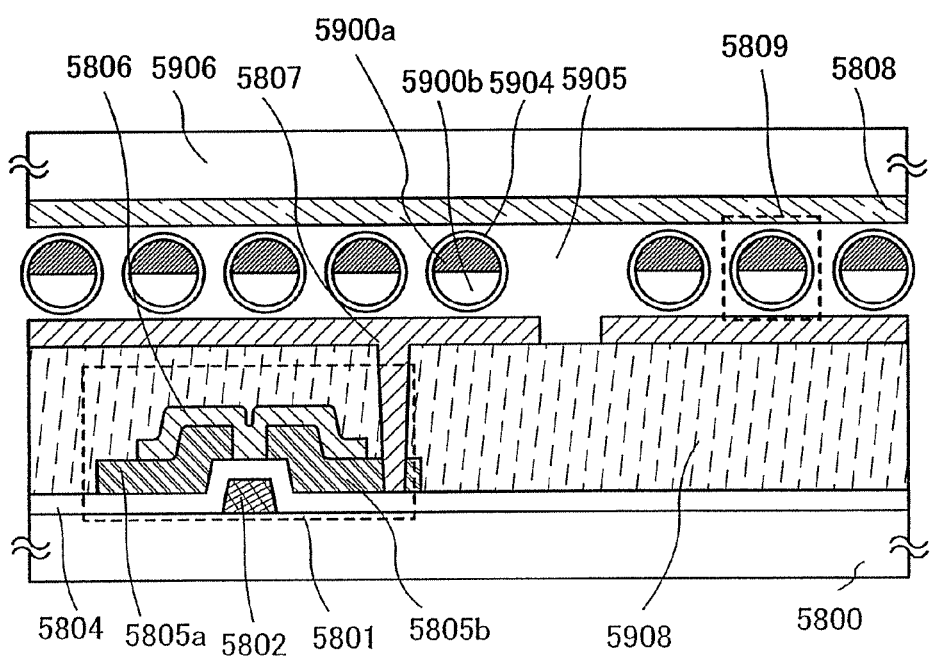
FIG. 29 shows an example of a display device of the present invention.

FIG. 29 shows an active-matrix electronic paper to which the present invention is applied. Although in FIG. 29, the active-matrix electronic paper is shown, the present invention can be applied to a passive-matrix electronic paper.

As the electronic paper, a twisting ball display system can be used. A twisting ball display system is a method in which display is performed by arranging spherical particles each of which is colored separately in black and white between a first electrode layer and a second electrode layer, and generating a potential difference between the first electrode layer and the second electrode layer so as to control the directions of the spherical particles.

A transistor 5801 is an inverted coplanar thin film transistor, which includes a gate electrode layer 5802, a gate insulating layer 5804, wiring layers 5805a and 5805b, and a semiconductor layer 5806. The wiring layers 5805a and 5805b serve as a source electrode layer or drain electrode layer. In addition, the wiring layer 5805b is electrically connected to a first electrode layer 5807 through an opening formed in an insulating layer 5908. Between the first electrode layer 5807 and a second electrode layer 5808, spherical particles 5809, each of which includes a black region 5900a and a white region 5900b, and a cavity 5904 which is filled with liquid around the black region 5900a and the white region 5900b, are provided. A space around the spherical particle 5809 is filled with a filler 5905 such as a resin.

In this embodiment mode, the gate electrode layer 5802, the semiconductor layer 5806, the wiring layers 5805a and 5805b, ant the like included in the transistor 5801 can be formed as follows, as shown in the above embodiment mode: a light absorption layer is formed over a layer to be processed that is to be an object layer; a mask is formed utilizing laser ablation by irradiation with a laser beam through a photomask; and the layer to be processed is etched using the mask.

The wiring layer 5805b is electrically connected to the first electrode layer 5807 in the opening formed in the insulating layer 5908. The opening in the insulating layer 5908 can be formed utilizing laser ablation by irradiation with a laser beam as shown in the above embodiment mode. In this embodiment mode, a low-melting metal that is comparatively easy to evaporate (chromium in this embodiment mode) is used for the wiring layer 5805b. The wiring layer 5805b is selectively irradiated with a laser beam from the insulating layer 5908 side, and an irradiated region of the wiring layer 5805b and a part of the insulating layer 5908 over the irradiated region are removed by the irradiation energy, so that an opening reaching the wiring layer 5805b can be formed. In forming the opening by etching, a wet etching method, a dry etching method, or both of the methods may be used, and the method may be performed plural times.

The first electrode layer 5807 is formed in the opening that penetrates the wiring layer 5805b, and thus, the wiring layer 5805b and the first electrode layer 5807 can be electrically connected.

By utilizing laser ablation, an opening can be formed in the insulating layer by irradiation with a laser beam without conducting a complicated lithography process.

Instead of the twisting ball, an electrophoretic element can also be used. A microcapsule having a diameter of approximately 10 µm to 20 µm, in which a transparent liquid, and positively charged white microparticles and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element, and is called electronic paper in general. The electrophoretic display element has higher reflectance than a liquid crystal display element, and thus, an auxiliary light is unnecessary, less power is consumed, and a display portion can be recognized in a dusky place. Even when power is not supplied to the display portion, an image which has been displayed once can be maintained. Thus, it is possible that a displayed image can be stored, even if a display device having a display function is distanced from a source of an electric wave.

Any structure is acceptable for the transistor as long as the transistor can serve as a switching element. The semiconductor layer may be formed using various semiconductors such as an amorphous semiconductor, a crystalline semiconductor, a polycrystalline semiconductor, and a microcrystalline semiconductor, or an organic transistor may be formed using an organic compound.

Although a case in which a structure of a display device is an active-matrix type is specifically described in this embodiment mode, the present invention can be naturally applied to a passive-matrix display device. Also, in a passive-matrix display device, a wiring layer, an electrode layer, and the like can be formed with a desired shape by using a mask that is formed utilizing laser ablation by irradiation with a laser beam through a photomask, and by performing an etching process.

By the present invention, the number of lithography processes can be reduced, and a manufacturing process can be simplified; therefore, the throughput can be improved. As a result, a display device can be manufactured with high mass productivity.

In addition, resist coating, a development step, and the like can be omitted; therefore, there is no need for rotating a substrate, and then a large-area substrate is easily treated. Furthermore, when a linear laser beam or a planar laser beam having a large area such as a rectangular laser beam or a circular laser beam is used, a plurality of regions can be irradiated with a laser beam in a short time. As a result, many patterns can be formed in a short time over a large-area substrate, and a display device can be manufactured with favorable mass productivity.

This embodiment mode can be freely combined with any of Embodiment Modes 1 to 6 as appropriate.

Embodiment Mode 13

Next, a mode in which a driver circuit for driving is mounted on a display panel manufactured in accordance with Embodiment Modes 6 to 11 will be described.

First, a display device employing a COG method is described with reference to FIG. 18A. A pixel portion 2701 for displaying information of characters, images, or the like is provided over a substrate 2700. A substrate provided with a plurality of driver circuits is divided into rectangles, and a driver circuit 2751 after division (also referred to as a driver IC) is mounted on the substrate 2700. FIG. 18A shows a mode of mounting a plurality of driver ICs 2751 and FPCs 2750 mounted on the end of the driver ICs 2751. In addition, the size obtained after division may be made almost equal to the length of a side of the pixel portion on a signal line side, and a tape may be mounted on the end of the single driver IC.

Alternatively, a TAB method may be employed. In that case, a plurality of tapes may be attached and driver ICs may be mounted on the tapes as shown in FIG. 18B. Similarly to the case of a COG method, a single driver IC may be mounted on a single tape. In this case, a metal piece or the like for fixing the driver IC may be attached together in terms of intensity.

A plurality of driver ICs to be mounted on a display panel are preferably formed over a rectangular substrate having a size of 300 mm to 1000 mm, or a side longer than 1000 mm for the sake of improvement in productivity.

In other words, a plurality of circuit patterns each including a driver circuit portion and an input-output terminal as a unit may be formed over the substrate and may be lastly divided to be used. In consideration of the side length of the pixel portion or the pixel pitch, the driver IC may be formed to be a rectangle having a long side of 15 mm to 80 mm and a short side of 1 mm to 6 mm. Alternatively, the driver IC may be formed to have the same side length as that of the pixel portion, or a length obtaining by adding a side length of the pixel portion to a side length of each driver circuit.

An advantage of the external dimension of the driver IC over an IC chip is the length of the long side. When the driver IC having a long side length of 15 mm to 80 mm is used, the number of the driver ICs necessary for being mounted in accordance with the pixel portion is less than that in the case of using an IC chip. Therefore, yield in manufacturing can be improved. When a driver IC is formed over a glass substrate, productivity is not decreased because there is no limitation on the shape of a substrate used as a mother body. This is a great advantage compared with the case of taking IC chips out of a circular silicon wafer.

When a scanning line driver circuit 3702 is formed in an integrated manner over a substrate as shown in FIG. 17B, a driver IC provided with a signal line driver circuit is mounted on a region outside a pixel portion 3701. The driver IC is a signal line driver circuit. In order to form a pixel region corresponding to RGB full color, 3072 signal lines are required for an XGA class and 4800 signal lines are required for a UXGA class. The signal lines formed in such a number are divided into several blocks at the end of the pixel portion 3701, and lead lines are formed. The signal lines are gathered corresponding to the pitches of output terminals of the driver ICs.

The driver IC is preferably formed of a crystalline semiconductor formed over a substrate. The crystalline semiconductor is preferably formed by being irradiated with a continuous oscillation laser beam. Therefore, a continuous oscillation solid-state or gas laser is used for an oscillator for generating the laser beam. There are almost no crystal defects when continuous oscillation laser is used, and as a result, a transistor can be manufactured by using a polycrystalline semiconductor layer having a large grain size. In addition, high-speed driving is possible because mobility or response speed is high, and it is possible to further improve an operating frequency of an element than that of the conventional element. Therefore, high reliability can be obtained because variation in characteristics is little. Note that the channel-length direction of the transistor and a scanning direction of a laser beam may be arranged in the same direction to further improve the operating frequency. This is because the highest mobility can be obtained when a channel length direction of a transistor and a scanning direction of a laser beam over a substrate are almost parallel to each other (preferably, greater than or equal to −30° and less than or equal to 30°) in a step of laser crystallization with continuous oscillation laser. Note that the channel length direction corresponds to a current flowing direction, in other words, a direction in which an electric charge moves in a channel formation region. The thus manufactured transistor has an active layer including a polycrystalline semiconductor layer in which a crystal grain is extended in the channel direction, and this means that a crystal grain boundary is formed almost along the channel direction.

In order to perform laser crystallization, it is preferable to significantly narrow down the laser beam, and the shape of the laser beam (beam spot) preferably has the same width as that of a short side of the driver ICs, approximately 1 mm to 3 mm or less. In addition, in order to secure an enough and effective energy density for an object to be irradiated, a region irradiated with the laser beam preferably has a linear shape. The term "linear" used herein refers to not a line in a strict sense but a rectangle or an oblong with a large aspect ratio. For example, the linear shape refers to a shape with an aspect ratio of 2 or more (preferably greater than or equal to 10 and less than or equal to 10000). Thus, by making a width of the laser beam shape (beam spot) the same length as a short side of the driver ICs, a method for manufacturing a display device, of which productivity is improved, can be provided.

As shown in FIGS. 18A and 18B, driver ICs may be mounted as both the scanning line driver circuit and the signal line driver circuit. In this case, it is preferable to use the driver ICs having different specifications for the scanning line driver circuit and the signal line driver circuit.

In the pixel region, the signal line and the scanning line intersect to form a matrix, and transistors are arranged corresponding to each intersection. One feature of this embodiment mode is that a TFT having an amorphous semiconductor or a semiamorphous semiconductor as a channel portion is used as the transistor arranged in the pixel region. The amorphous semiconductor is formed by a method such as a plasma CVD method or a sputtering method. The semiamorphous semiconductor can be formed by a plasma CVD method at a temperature of 300° C. or less. A film thickness necessary to form the transistor is formed in a short time even in the case of using, for example, a non-alkaline glass substrate having an external size of 550 mm×650 mm. The feature of such a manufacturing technique is effective for manufacturing a large-sized display device. In addition, a semiamorphous TFT can obtain field effect mobility of 2 $cm^2$/V·sec to 10 $cm^2$/V·sec by forming a channel formation region using a SAS. Thus, a display panel in which system-on-panel is realized can be manufactured. Further, the transistor arranged in the pixel region can be manufactured by the present invention. Accordingly, a manufacturing process is simplified, and a display panel can be manufactured with mass productivity.

The scanning line driver circuit can also be formed in an integrated manner over the substrate by using a TFT having a semiconductor layer formed of a SAS. In the case of using a TFT having a semiconductor layer formed of a SAS, the driver ICs may be mounted as both the scanning line driver circuit and the signal line driver circuit.

In that case, it is preferable to use the driver ICs having different specifications for the scanning line driver circuit and the signal line driver circuit. For example, a transistor included in the scanning line driver IC is required to withstand a voltage of approximately 30 V; however, a drive frequency thereof is 100 kHz or less, and high-speed operation is not comparatively required. Therefore, it is preferable to set a channel length (L) of the transistor included in the scanning line driver sufficiently long. On the other hand, a transistor of the signal line driver IC is required to withstand a voltage of only approximately 12 V; however, a drive frequency thereof is around 65 MHz at 3 V, and high-speed operation is required. Therefore, it is preferable to set a channel length or the like of the transistor included in a driver on a micron rule.

A method for mounting the driver IC is not particularly limited, and a COG method, a wire bonding method, or a TAB method can be employed.

When the thicknesses of the driver IC and the opposite substrate are set equal to each other, a distance therebetween is almost constant, which contributes to thinning of a display device as a whole. When both substrates are formed of the same material, thermal stress is not generated and characteristics of a circuit formed of a TFT are not damaged even when a temperature change is caused in the display device. Furthermore, the number of the driver ICs to be mounted on one pixel region can be reduced by mounting longer driver ICs than IC chips as driver circuits as described in this embodiment mode.

In this manner, a driver circuit can be incorporated in a display panel.

Embodiment Mode 14

In a display panel (EL display panel or liquid crystal display panel) manufactured in accordance with Embodiment Modes 6 to 11, an example will be shown, in which a semiconductor layer is formed of an amorphous semiconductor or a SAS, and a scanning line driver circuit is formed over a substrate.

Figure 31:
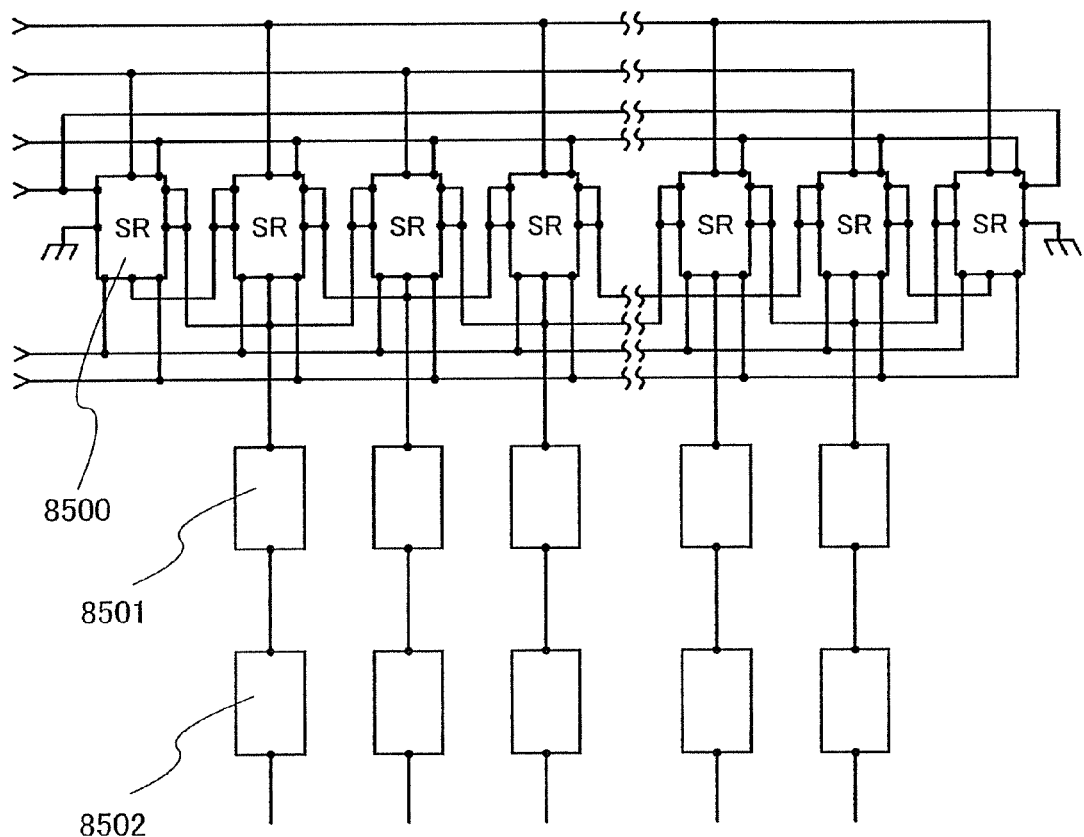
FIG. 31 shows an example of a circuit configuration of a display device of the present invention.

FIG. 31 is a block diagram of a scanning line driver circuit that includes an n-channel TFT using a SAS in which a field-effect mobility of 1 cm$^2$/V·sec to 15 cm$^2$/V·sec can be obtained.

In FIG. 31, a block denoted by reference numeral 8500 corresponds to a pulse-output circuit that outputs a sampling pulse for one stage, and a shift register includes n pieces of pulse-output circuits. Reference numeral 8501 denotes a buffer circuit, and a pixel 8502 is connected to the end thereof.

Figure 32:
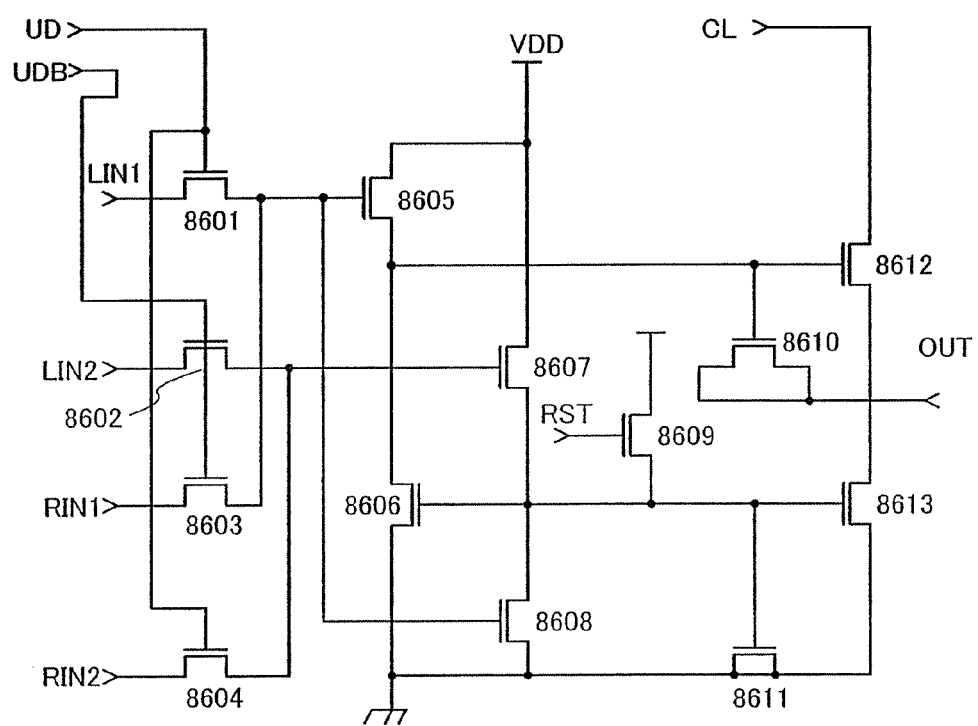
FIG. 32 shows an example of a circuit configuration of a display device of the present invention.

FIG. 32 shows a specific structure of the pulse-output circuit 8500, which includes n-channel TFTs 8601 to 8612. At this point, a size of the TFTs may be determined in consideration of operation characteristics of the n-channel TFTs using a SAS. For example, when the channel length is 8 μm, the channel width can be set in a range of 10 μm to 80 μm.

Figure 33:
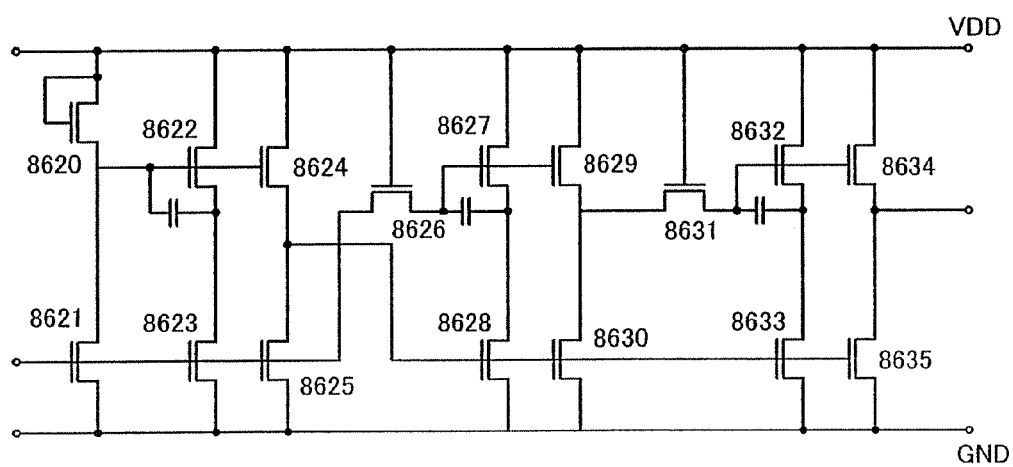
FIG. 33 shows an example of a circuit configuration of a display device of the present invention.

Furthermore, a specific structure of the buffer circuit 8501 is shown in FIG. 33. Similarly, the buffer circuit includes n-channel TFTs 8620 to 8635. At this point, a size of the TFTs may be determined in consideration of operation characteristics of the n-channel TFTs using a SAS. For example, when the channel length is 10 μm, the channel width is to be set in a range of 10 μm to 1800 μm.

In order to realize such a circuit, it is necessary to connect the TFTs with one another by a wiring.

In such a manner, a driver circuit can be incorporated in a display panel.

Embodiment Mode 15

Figure 10:
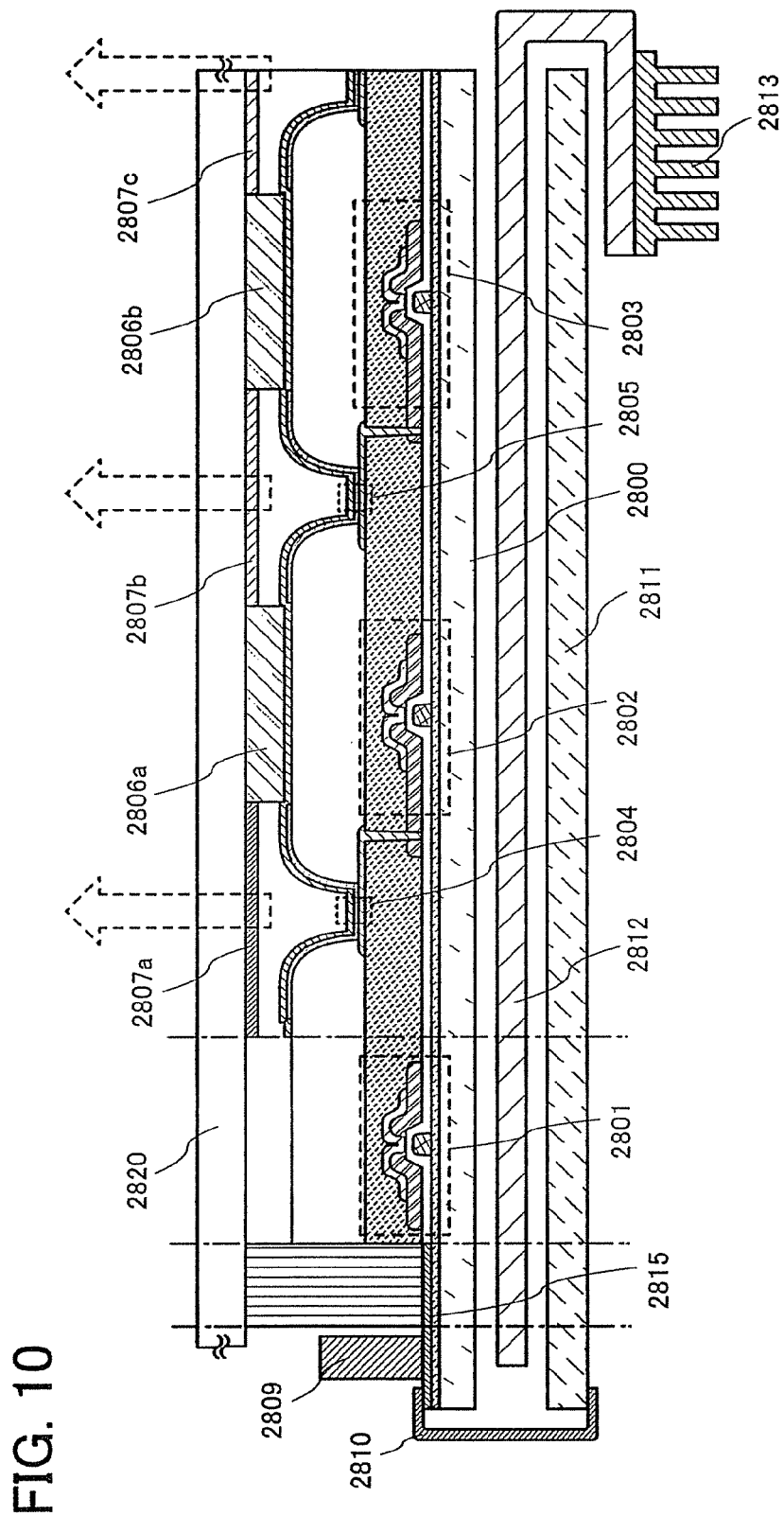
FIG. 10 shows an example of a display module of the present invention.

This embodiment mode will be described with reference to FIG. 10. FIG. 10 shows an example in which an EL display module is formed using a TFT substrate 2800 manufactured in accordance with the present invention. In FIG. 10, a pixel portion including pixels is formed over the TFT substrate 2800.

In FIG. 10, a TFT that has a similar structure to that formed in the pixel, or a protective circuit portion 2801 is provided between a driver circuit and the pixel and outside the pixel portion. The protective circuit portion 2801 operates in a similar manner to a diode by connecting either a source electrode layer or a drain electrode layer to a gate electrode layer of the TFT similar to that formed in the pixel. A driver IC formed of a single crystalline semiconductor, a stick driver IC formed of a polycrystalline semiconductor layer over a glass substrate, a driver circuit formed of a SAS, or the like is applied to a driver circuit 2809.

The TFT substrate 2800 is fixed to a sealing substrate 2820 with spacers 2806a and 2806b formed by a droplet discharge method interposed therebetween. The spacers are preferably provided to keep a distance between two substrates constant even when the substrate is thin or an area of the pixel portion is enlarged. A space between the TFT substrate 2800 and the sealing substrate 2820 over light-emitting elements 2804 and 2805 connected to TFTs 2802 and 2803 respectively may be filled with a resin material having a light-transmitting property at least to light of a visible region may be solidified, or may be filled with anhydrous nitrogen or an inert gas.

FIG. 10 shows a case where the light-emitting elements 2804 and 2805 have a top-emission structure, in which light is emitted in the direction of arrows shown in the drawing. Multicolor display can be performed by making the pixels emit light of different colors of red, green, and blue. At this time, color purity of the light emitted outside can be improved by forming colored layers 2807a to 2807c corresponding to respective colors on the sealing substrate 2820 side. Moreover, pixels that emit white light may be used and may be combined with the colored layers 2807a to 2807c.

The driver circuit 2809 that is an external circuit is connected by a wiring board 2810 to a scanning line or signal line connection terminal that is provided at one end of an external circuit substrate 2811. In addition, a heat pipe 2813, which is a high-efficiency heat conduction device having a pipe-like shape, and a heat sink 2812, each of which is used for conducting heat to the outside of the device, may be provided in contact with or adjacent to the TFT substrate 2800 to enhance a heat dissipation effect.

Note that FIG. 10 shows the top-emission EL display module; however, a bottom emission structure may be employed by changing the structure of the light-emitting element or the disposition of the external circuit board. Naturally, a dual emission structure in which light is emitted from both the top and bottom surfaces may be used. In the case of the top emission structure, the insulating layer serving as a partition may be colored and used as a black matrix. This partition can be formed by a droplet discharge method and it may be formed by mixing a black resin of a pigment material, carbon black, or the like into a resin material such as polyimide. A stack thereof may alternatively be used.

In addition, in the EL display module, reflected light of light that is incident from outside may be blocked by using a retardation film or a polarizing plate. In a top-emission display device, an insulating layer serving as a partition may be colored and used as a black matrix. This partition can be formed by a droplet discharge method. Carbon black or the like may be mixed into a black resin of a pigment material or a resin material such as polyimide, and a stack thereof may also be used. By a droplet discharge method, different materials may be discharged to the same region plural times to form the partition. A quarter-wave plate and a half-wave plate may be used as the retardation film and may be designed to be able to control light. As the structure, a TFT element substrate, the light-emitting element, the sealing substrate (sealant), the retardation film (quarter-wave plate and a half-wave plate), and the polarizing plate are sequentially stacked, through which light emitted from the light-emitting element is transmitted and emitted outside from the polarizing plate side. The retardation film or polarizing plate may be provided on a side where light is emitted or may be provided on both sides in the case of a dual emission display device in which light is emitted from the both surfaces. In addition, an anti-reflection film may be provided on the outer side of the polarizing plate. Accordingly, a more high-definition and accurate image can be displayed.

A resin film may be attached to the side of the TFT substrate 2800 where the pixel portion is formed, with the use of a sealant or an adhesive resin, to form a sealing structure. Although glass sealing using a glass substrate is used in this embodiment mode, various sealing methods such as resin sealing using a resin, plastic sealing using plastics, and film sealing using a film can be used. A gas barrier film that prevents water vapor from penetrating the resin film is preferably provided over the surface of the resin film. By employing a film sealing structure, further reductions in thickness and weight can be achieved.

In a display device provided with a TFT substrate or the like manufactured by the present invention, part of processes are simplified, and the throughput in the manufacture is improved. Accordingly, a display module can be manufactured with high mass productivity.

This embodiment mode can be combined with any of Embodiment Modes 1 to 9, 13, and 14 as appropriate.

Embodiment Mode 16

This embodiment mode will be described with reference to FIGS. 28A and 28B.

Figure 28A:
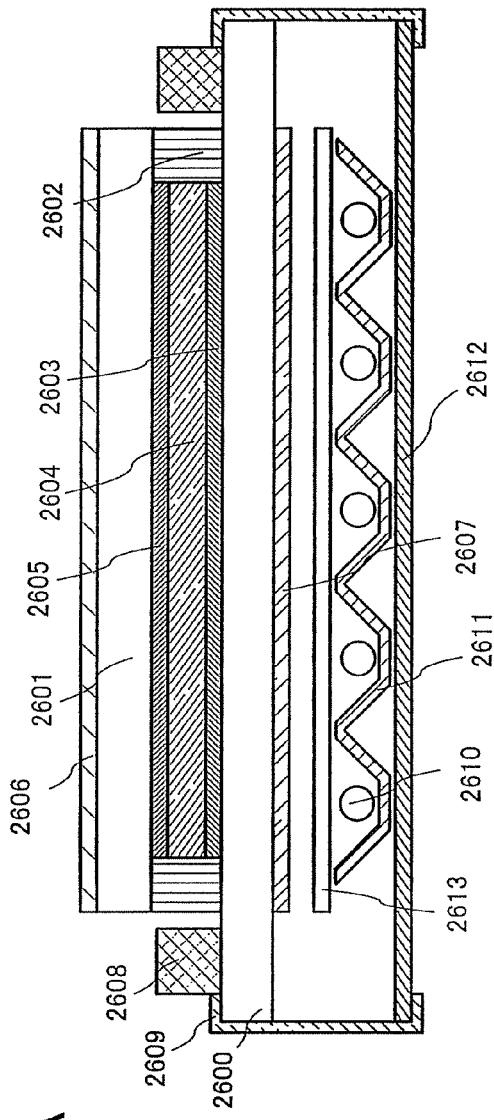
FIGS. 28A and 28B show structural examples of a display module of the present invention.
Figure 28B:
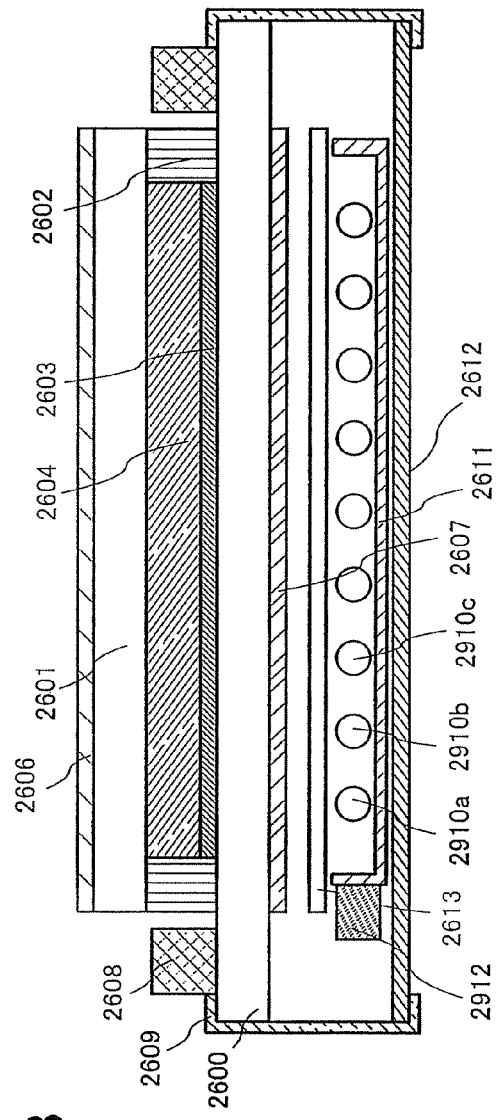

FIGS. 28A and 28B show an example of forming a liquid crystal display module by using a TFT substrate 2600 manufactured by the present invention.

FIG. 28A shows an example of a liquid crystal display module, in which the TFT substrate 2600 and an opposite substrate 2601 are fixed to each other with a sealant 2602, and a pixel portion 2603 and a liquid crystal layer 2604 are provided therebetween to form a display region. A colored layer 2605 is necessary to perform color display. In the case of the RGB system, respective colored layers corresponding to colors of red, green, and blue are provided for respective pixels. The outer sides of the TFT substrate 2600 and the opposite substrate 2601 are provided with polarizing plates 2606 and 2607, and a diffuser plate 2613. A light source includes a cold cathode tube 2610 and a reflector plate 2611. A circuit board 2612 is connected to the TFT substrate 2600 by a flexible wiring board 2609. External circuits such as a control circuit and a power supply circuit are incorporated in the circuit board 2612. The polarizing plate and the liquid crystal layer may be stacked with a retardation film interposed therebetween.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti Ferroelectric Liquid Crystal) mode, or the like.

FIG. 28B shows an example of applying an OCB mode to the liquid crystal display module of FIG. 28A, so that this liquid crystal display module is an FS-LCD (Field Sequential-LCD). The FS-LCD performs red, green, and blue light emissions in one frame period. Color display can be performed by composing an image by a time division method. Also, emission of each color is performed using a light-emitting diode, a cold cathode tube, or the like; hence, a color filter is not required. There is no necessity for arranging color filters of three primary colors and limiting a display region of each color. Display of all three colors can be performed in any region. On the other hand, light emission of three colors is performed in one frame period; therefore, high speed response of liquid crystal is needed. When an FLC mode using an FS system and the OCB mode are applied to the display device of the present invention, a display device or a liquid crystal television device having higher performance and high image quality can be completed.

A liquid crystal layer of the OCB mode has a so-called $\pi$ cell structure. In the $\pi$ cell structure, liquid crystal molecules are oriented such that pretilt angles of the molecules are symmetrical with respect to the center plane between the active matrix substrate and the opposite substrate. The orientation in the $\pi$ cell structure is a splay orientation when a voltage is not applied between the substrates, and shifts into a bend orientation when the voltage is applied. White display is performed in this bend orientation. Further voltage application makes the liquid crystal molecules in the bend orientation orientated perpendicular to the substrates, which does not allow light to pass therethrough. Note that a response speed approximately ten times as high as that of a conventional TN mode can be achieved by using the OCB mode.

Further, as a mode corresponding to the FS system, an HV(Half V)-FLC, an SS(Surface Stabilized)-FLC, or the like using a ferroelectric liquid crystal (FLC) that can operate at high speed can also be used. A nematic liquid crystal that has relatively low viscosity can be used for the OCB mode. A smectic liquid crystal that has a ferroelectric phase can be used for the HV-FLC or the SS-FLC.

An optical response speed of the liquid crystal display module is increased by narrowing a cell gap of the liquid crystal display module. Alternatively, the optical response speed can be increased by lowering the viscosity of the liquid crystal material. The above method of increasing the optical response speed is more effective when a pixel pitch of a pixel region of a TN-mode liquid crystal display module is 30 μM or less. The optical response speed can be further increased by an overdrive method in which an applied voltage is increased (or decreased) only for a moment.

The liquid crystal display module of FIG. 28B is a transmissive liquid crystal display module, in which a red light source 2910a, a green light source 2910b, and a blue light source 2910c are provided as light sources. A control portion 2912 is provided in the liquid crystal display module to separately control the red light source 2910a, the green light source 2910b, and the blue light source 2910c to be turned on or off. The light emission of each color is controlled by the control portion 2912, and light enters the liquid crystal to compose an image using the time division, thereby performing color display.

The liquid crystal display module described above uses a TFT substrate or the like manufactured by the present invention. Accordingly, part of processes can be simplified, and the throughput is improved; therefore, the liquid crystal display module can be manufactured with high mass productivity. Further, the number of lithography processes using a photoresist can be reduced, a liquid crystal display module with higher reliability can be manufactured.

This embodiment mode can be combined with any of Embodiment Modes 1 to 6, 10, and 11 as appropriate.

Embodiment Mode 17

Figure 30:
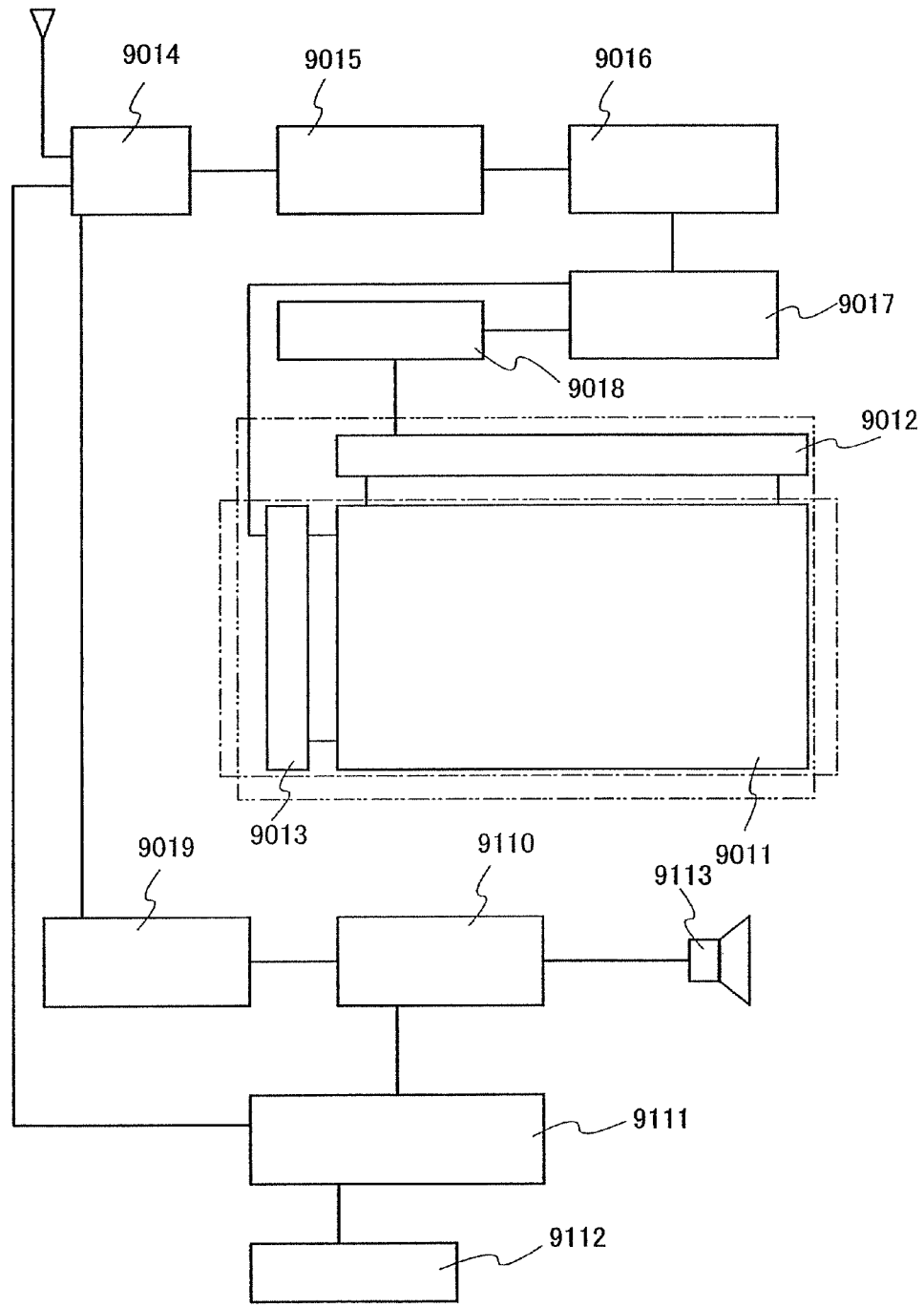
FIG. 30 is a block diagram showing a main configuration of an electronic device to which the present invention is applied.

With the display device formed by the present invention, a television device (also referred to as simply a television, or a television receiver) can be completed. FIG. 30 is a block diagram showing main components of the television device.

FIG. 17A is a top view showing a structure of a display panel according to the present invention. A pixel portion 2701 in which pixels 2702 are arranged in matrix, a scanning line input terminal 2703, and a signal line input terminal 2704 are formed over a substrate 2700 having an insulating surface. The number of pixels may be determined in accordance with various standards. In a case of XGA full-color display using RGB, the number of pixels may be 1024×768×3 (RGB). In a case of UXGA full-color display using RGB, the number of pixels may be 1600×1200×3 (RGB), and in a case of full-spec high-definition, and full-color display using RGB, the number of pixels may be 1920×1080×3 (RGB).

The pixels 2702 are formed in matrix by intersections of scanning lines extended from the scanning line input terminal 2703 and signal lines extended from the signal line input terminal 2704. Each pixel 2702 in the pixel portion 2701 is provided with a switching element and a pixel electrode layer connected thereto. A typical example of the switching element is a TFT. A gate electrode layer of the TFT is connected to the scanning line, and a source or a drain of the TFT is connected to the signal line, which enables each pixel to be independently controlled by a signal inputted from the outside.

FIG. 17A shows a structure of a display panel in which a signal to be inputted to the scanning line and the signal line is controlled by an external driver circuit. Alternatively, a driver IC 2751 may be mounted on the substrate 2700 by a COG (Chip On Glass) method as shown in FIG. 18A. As another mounting mode, a TAB (Tape Automated Bonding) method may be used as shown in FIG. 18B. The driver IC may be formed over a single crystalline semiconductor substrate or may be formed using a TFT over a glass substrate. In each of FIGS. 18A and 18B, the driver IC 2751 is connected to an FPC (Flexible Printed Circuit) 2750.

When a TFT provided in a pixel is formed of a crystalline semiconductor, a scanning line driver circuit 3702 can be formed over a substrate 3700 as shown in FIG. 17B. In FIG. 17B, a pixel portion 3701 is controlled by an external driver circuit connected to a signal line input terminal 3704, similarly to FIG. 17A. When the TFT provided in a pixel is formed of a polycrystalline (microcrystalline) semiconductor, a single crystalline semiconductor, or the like having high mobility, a pixel portion 4701, a scanning line driver circuit 4702, and a signal line driver circuit 4704 can all be formed over a glass substrate 4700 as shown in FIG. 17C.

As for the display panel, there are the following cases in FIG. 30: a case in which only a pixel portion 9011 is formed as shown in FIG. 17A and a scanning line driver circuit 9013 and a signal line driver circuit 9012 are mounted by a TAB method as shown in FIG. 18B; a case in which the pixel portion 9011 is formed, and the scanning line driver circuit 9013 and the signal line driver circuit 9012 are mounted by a COG method as shown in FIG. 18A; a case in which a TFT is formed as shown in FIG. 17B, the pixel portion 9011 and the scanning line driver circuit 9013 are formed over a substrate, and the signal line driver circuit 9012 is separately mounted as a driver IC; a case in which the pixel portion 9011, the signal line driver circuit 9012, and the scanning line driver circuit 9013 are formed over a substrate as shown in FIG. 17C; and the like. However, the display panel may have any structures.

As another external circuit in FIG. 30, a video signal amplifier circuit 9015 that amplifies a video signal among signals received by a tuner 9014, a video signal processing circuit 9016 that converts the signals outputted from the video signal amplifier circuit 9015 into chrominance signals corresponding to respective colors of red, green, and blue, a control circuit 9017 that converts the video signal into an input specification of the driver IC, and the like are provided on an input side of the video signal. The control circuit 9017 outputs signals to both a scanning line side and a signal line side. In the case of digital drive, a signal dividing circuit 9018 may be provided on the signal line side and an input digital signal may be divided into m pieces and supplied.

An audio signal among signals received by the tuner 9014 is sent to an audio signal amplifier circuit 9019 and is supplied to a speaker 9113 through an audio signal processing circuit 9110. A control circuit 9111 receives control information of a receiving station (reception frequency) or sound volume from an input portion 9112 and transmits signals to the tuner 9014 and the audio signal processing circuit 9110.

Figure 16A:
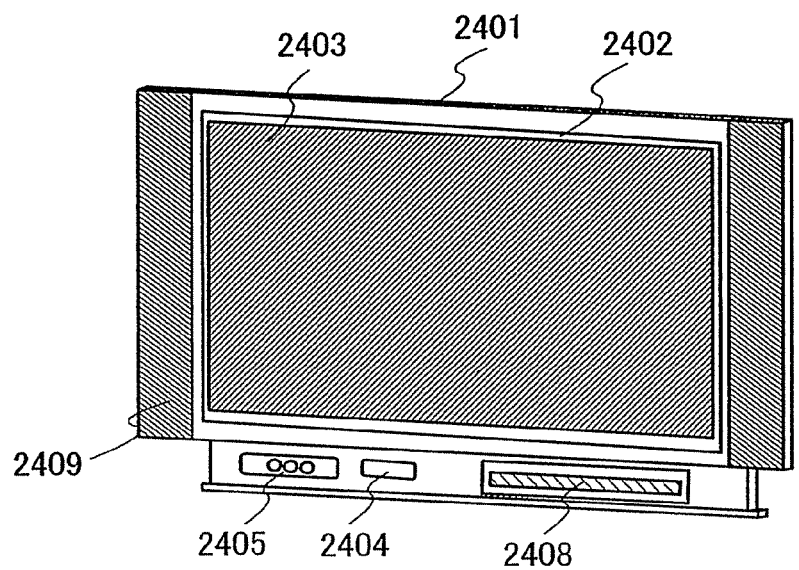
FIGS. 16A and 16B show examples of electronic devices to which the present invention is applied.
Figure 16B:
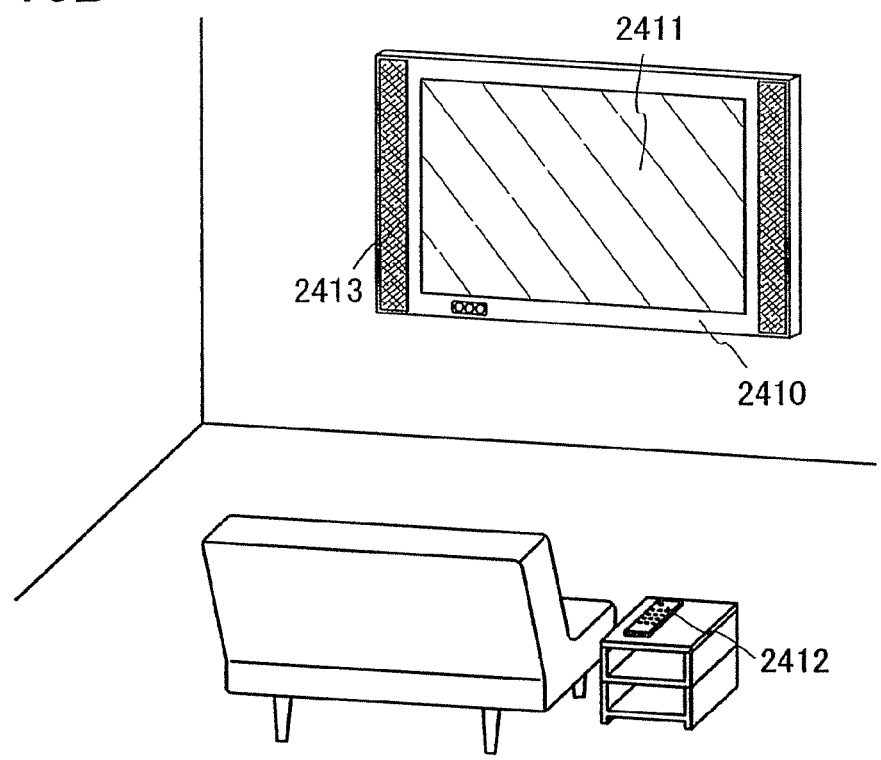

A television device can be completed by incorporating the display module into a chassis as shown in FIGS. 16A and 16B. When a liquid crystal display module is used as a module, a liquid crystal television device can be manufactured. When an EL display module is used, an EL television device can be manufactured. Alternatively, a plasma television, electronic paper, or the like can be manufactured. In FIG. 16A, a main screen 2403 is formed by using the display module, and a speaker portion 2409, an operation switch, and the like are provided as its accessory equipment. Thus, a television device can be completed in accordance with the present invention.

In FIG. 16A, a display panel 2402 is incorporated in a chassis 2401, and general TV broadcast can be received by a receiver 2405. When the display device is connected to a communication network by wired or wireless connections via a modem 2404, one-way (from a sender to a receiver) or two-way (between a sender and a receiver or between receivers) information communication can be performed. The television device can be operated by using a switch built in the chassis 2401 or a remote control unit 2406 that is separately formed. A display portion 2407 for displaying output information may also be provided in the remote control device 2406.

Further, the television device may include a sub screen 2408 formed using a second display panel so as to display channels, volume, or the like, in addition to the main screen 2403. In this structure, both the main screen 2403 and the sub screen 2408 can be formed using the liquid crystal display panel of the present invention. Alternatively, the main screen 2403 may be formed using an EL display panel having a wide viewing angle, and the sub screen 2408 may be formed using a liquid crystal display panel capable of displaying images with less power consumption. In order to reduce the power consumption preferentially, the main screen 2403 may be formed using a liquid crystal display panel, and the sub screen may be formed using an EL display panel, which can be switched on and off. In accordance with the present invention, a high-reliability display device can be formed even when a large-area substrate is used and a large number of TFTs or electronic components are used.

FIG. 16B shows a television device having a large-sized display portion, for example, a 20-inch to 80-inch display portion. The television device includes a chassis 2410, a display portion 2411, a remote control device 2412 that is an operation portion, a speaker portion 2413, and the like. The present invention is applied to manufacture of the display portion 2411. Since the television device in FIG. 16B is a wall-hanging type, it does not require a large installation space.

Naturally, the present invention is not limited to the television device, and can be applied to various use applications as a large-sized display medium such as an information display board at a train station, an airport, or the like, or an advertisement display board on the street, as well as a monitor of a personal computer.

A TFT or the like of a display device can be manufactured by the present invention. As a result, the display device can be manufactured with the simplified processes; therefore, it is possible to manufacture the display device with high mass productivity.

This embodiment mode can be freely combined with any of Embodiment Modes 1 to 16 as appropriate.

Embodiment Mode 18

Examples of electronic devices in accordance with the present invention are as follows: television devices (also referred to as simply a television, or a television receiver), cameras such as a digital camera and a digital video camera, cellular telephone devices (simply also referred to as a cellular phone or a cell-phone), portable information terminals such as PDA, portable game machines, computer monitors, computers, sound reproducing devices such as a car audio system, image reproducing devices including a recording medium, such as a home-use game machine, and the like. Specific examples of them are described with reference to FIGS. 20A to 20E.

Figure 20A:
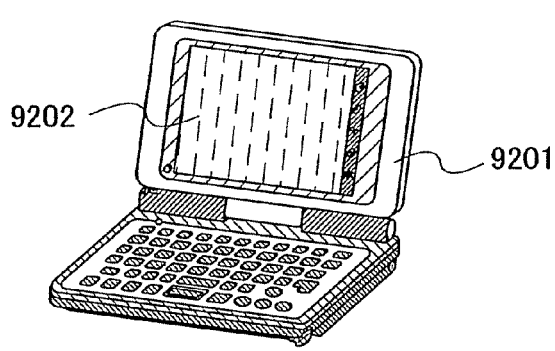
FIGS. 20A to 20E show examples of electronic devices to which the present invention is applied.

A portable information terminal device shown in FIG. 20A includes a main body 9201, a display portion 9202, and the like. A display device of the present invention can be applied to the display portion 9202. As a result, a portable information terminal device can be manufactured by simplified processes, whereby it can be manufactured with high mass productivity.

Figure 20B:
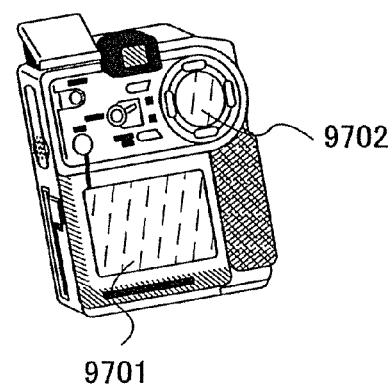

A digital video camera shown in FIG. 20B includes a display portion 9701, a display portion 9702, and the like. A display device of the present invention can be applied to the display portion 9701. As a result, a digital video camera can be manufactured by the simplified processes, whereby it can be manufactured with high mass productivity.

Figure 20C:
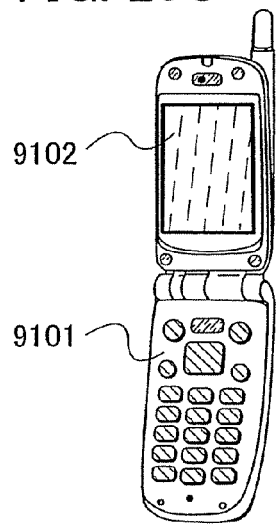

A cellular phone shown in FIG. 20C includes a main body 9101, a display portion 9102, and the like. A display device of the present invention can be applied to the display portion 9102. As a result, a cellular phone can be manufactured by simplified processes, whereby it can be manufactured with high mass productivity.

Figure 20D:
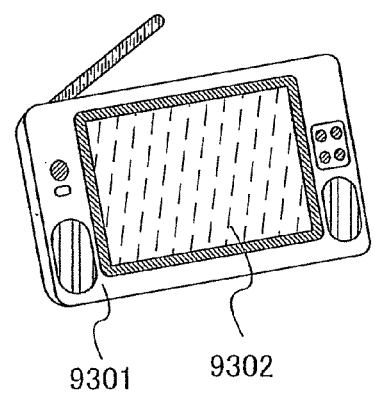

A portable television device shown in FIG. 20D includes a main body 9301, a display portion 9302, and the like. A display device of the present invention can be applied to the display portion 9302. As a result, a portable television device can be manufactured by simplified processes, whereby it can be manufactured with high mass productivity. The display device of the present invention can be applied to a wide range of television devices ranging from a small-sized television device mounted on a portable terminal such as a cellular phone, a medium-sized television device which can be carried, to a large-sized (for example, 40-inch or larger) television device.

Figure 20E:
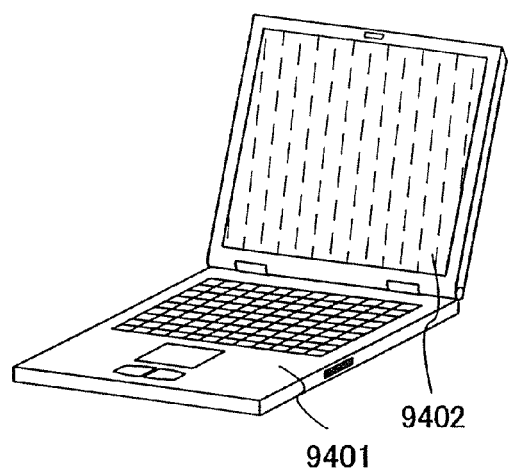

A portable computer shown in FIG. 20E includes a main body 9401, a display portion 9402, and the like. A display device of the present invention can be applied to the display portion 9402. As a result, a portable computer can be manufactured by simplified processes, whereby it can be manufactured by high mass productivity.

As described above, by the display device of the present invention, electronic devices can be provided with high mass productivity.

This embodiment mode can be freely combined with any of Embodiment Modes 1 to 17 as appropriate.

Embodiment 1

In this embodiment, characteristics of an inverted staggered transistor that is manufactured by the present invention will be described. First, a method for manufacturing a transistor used for measurement is described.

Figure 35A:
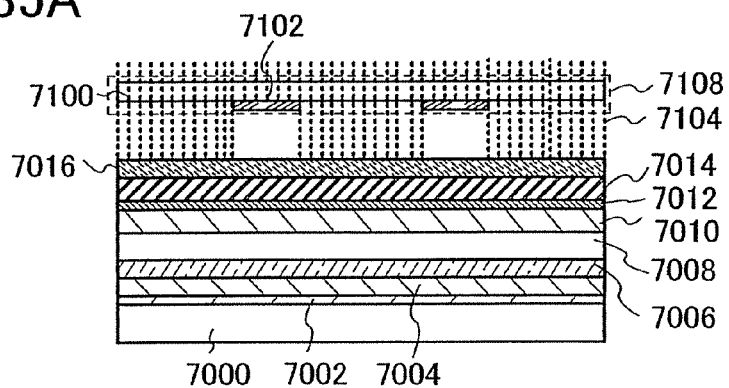
FIGS. 35A to 35E show an example of a manufacturing method of a transistor to which the present invention is applied.

As shown in FIG. 35A, a stacked structure was formed over a glass substrate 7000, in which a silicon nitride oxide layer 7002 (a thickness of 50 nm), a silicon oxynitride layer 7004 (a thickness of 100 nm), a tungsten layer 7006 (a thickness of 100 nm), a silicon nitride layer 7008 (a thickness of 300 nm), a first amorphous silicon layer 7010 (a thickness of 150 nm), a second amorphous silicon layer 7012 to which phosphorus is added (a thickness of 50 nm), a molybdenum layer 7014 (a thickness of 200 nm), and a polyimide layer 7016 (a thickness of 100 nm) were sequentially stacked. Note that the silicon nitride oxide layer 7002 and the silicon oxynitride layer 7004 are used for forming a base insulating layer, and the silicon nitride layer 7008 is used for forming a gate insulating layer. The first amorphous silicon layer 7010 is used for forming a semiconductor layer including a region in which a channel is formed afterwards. The second amorphous silicon layer 7012 serves as a semiconductor layer for making favorable ohmic contact between the semiconductor layer for forming a channel and a source electrode or drain electrode. The tungsten layer 7006 is used for forming a gate electrode, and the molybdenum layer 7014 is used for forming the source electrode or drain electrode. The polyimide layer 7016 is used for forming a light absorption layer.

The stacked structure formed over the glass substrate 7000 was irradiated with a laser beam 7104 through a photomask 7108. As the laser beam 7104, an excimer laser with an energy density of about 250 mJ/cm$^2$ was applied. Note that the photomask 7108 that was formed to have a desired pattern using a light-transmitting region 7100 and a light-blocking region 7102 of the laser beam 7104 was used. Further, in this embodiment, the photomask 7108 that was formed to have a mask pattern for forming the source electrode or drain electrode was used. The laser beam 7104, which transmits the light-transmitting region 7100 of the photomask 7108, is absorbed by the polyimide layer 7016.

Figure 35B:
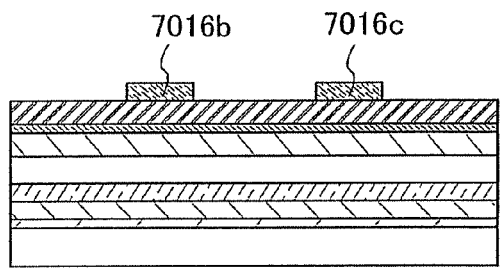

As shown in FIG. 35B, laser ablation was conducted to the polyimide layer 7016 in a region reached by the laser beam 7104, and polyimide layers 7016b and 7016c were formed. Here, the remaining polyimide layers 7016b and 7016c correspond to the pattern of the photomask 7108, specifically, the light-blocking region 7102.

Figure 35C:
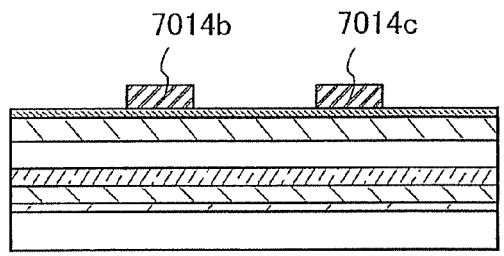

As shown in FIG. 35C, the molybdenum layer 7014 was etched using the polyimide layers 7016b and 7016c as masks to form molybdenum layers 7014b and 7014c serving as gate electrodes. Etching of the molybdenum layer was performed using an aluminum mixed acid solution. After the desired molybdenum layers 7014b and 7014c were formed, the polyimide layers 7016b and 7016c were removed.

Figure 35D:
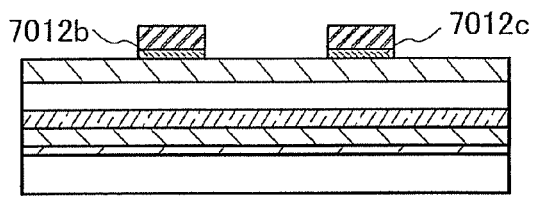

As shown in FIG. 35D, the second amorphous silicon layer 7012 was etched using the molybdenum layers 7014b and 7014c as masks to form second amorphous silicon layers 7012b and 7012c.

Figure 35E:
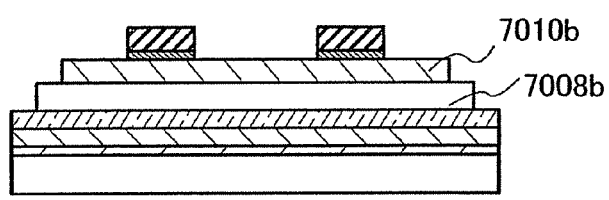

As shown in FIG. 35E, the first amorphous silicon layer 7010 was selectively etched to form an island-shaped first amorphous silicon layer 7010b. Then, the silicon nitride layer 7008 in the vicinity of the glass substrate 7000 was etched to form a silicon nitride layer 7008b. By the above-described steps, an inverted staggered transistor of this embodiment was obtained. The inverted staggered transistor was formed so that a channel length L was 9 µm, and the channel width W was 146 µm. Further, the thickness of the gate insulating layer (the silicon nitride layer 7008b) was 300 nm.

Figure 36:
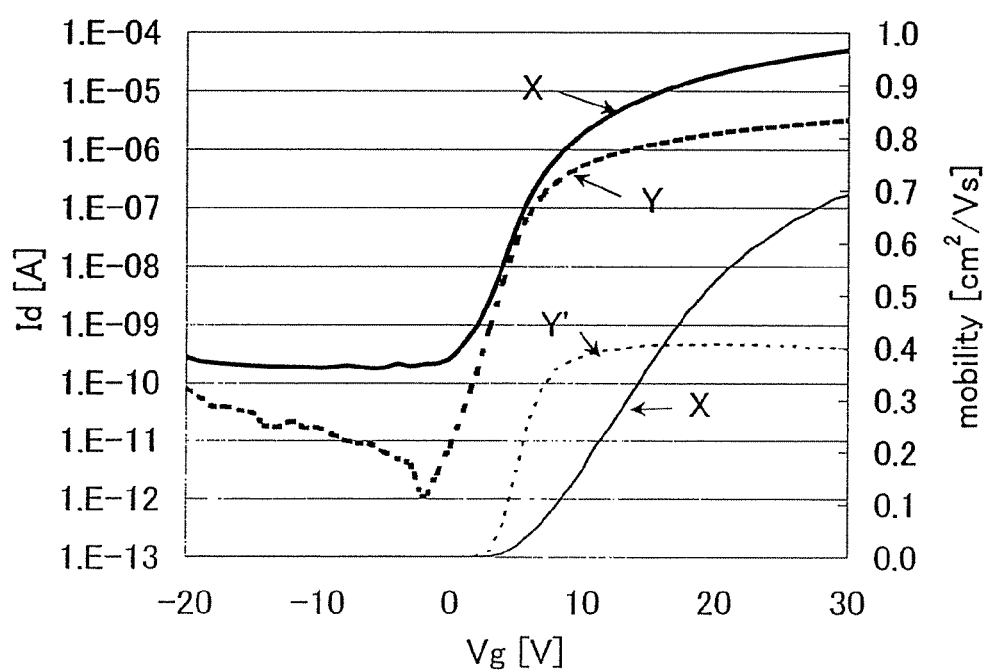
FIG. 36 shows characteristics of a transistor to which the present invention is applied.

FIG. 36 shows a measurement result of drain current vs. gate voltage ($I_d$ vs. $V_g$) characteristics and field effect mobility vs. gate voltage ($\mu_{FE}$ vs. $V_g$) characteristics of the inverted staggered transistor. Here, in a graph showing the $I_d$ vs. $V_g$ characteristics, the vertical axis indicates a current (A), and the horizontal axis indicates a voltage (V). In a graph showing the $\mu_{FE}$ vs. $V_g$ characteristics, the vertical axis indicates a mobility (cm$^2$/Vs), and the horizontal axis indicates a voltage (V). The measurement was conducted under the condition that a drain voltage ($V_d$) was 1 V or 15 V, and a gate voltage ($V_g$) was changed from −20 V to 30 V.

In FIG. 36, the $I_d$ vs. $V_g$ characteristic that has a condition of $V_d$=1 V is represented by Y, and the $\mu_{FE}$ vs. $V_g$ characteristic is represented by Y'. The $I_d$ vs. $V_g$ characteristic that has a condition of $V_d$=15 V is represented by X, and the $\mu_{FE}$ vs. $V_g$ characteristic is represented by X'. From FIG. 36, it was found that the field effect mobility was 0.40 cm$^2$/Vs and the threshold voltage was 4.20 V.

This application is based on Japanese Patent Application serial no. 2006-229777 filed in Japan Patent Office on Aug. 25, 2006, the entire contents of which are hereby incorporated by reference.

What is claimed is:

1. A manufacturing method of a semiconductor device, comprising the steps of:
   forming a layer to be processed;
       forming a light absorption layer by a sputtering method or a CVD method over the layer;
       adding an inert gas to the light absorption layer;
       irradiating the light absorption layer with a laser beam through a photomask, so that an irradiated part of the light absorption layer is removed; and
   etching the layer using a remaining part of the light absorption layer as a mask,
       wherein the light absorption layer is formed using a conductive material, a semiconductor material, or an inorganic insulating material.

2. The manufacturing method of a semiconductor device according to claim 1, wherein a layer having a tapered shape is formed by the etching.

3. The manufacturing method of a semiconductor device according to claim 2, wherein a wet etching method or a combination of a dry etching method and a wet etching method is used for the etching.

4. The manufacturing method of a semiconductor device according to claim 1, wherein a layer having a perpendicular shape is formed by the etching.

5. The manufacturing method of a semiconductor device according to claim 4, wherein a dry etching method is used for the etching.

6. The manufacturing method of a semiconductor device according to claim 1, wherein the layer to be processed is formed using a conductive material or a semiconductor material.

7. The manufacturing method of a semiconductor device according to claim 1, wherein the light absorption layer is formed using a material which absorbs the laser beam.

8. The manufacturing method of a semiconductor device according to claim 1, wherein the light absorption layer is formed using at least one element selected from chromium, molybdenum, nickel, titanium, cobalt, copper, or aluminum.

9. The manufacturing method of a semiconductor device according to claim 1, wherein a mask including a region which transmits the laser beam and a region which blocks the laser beam is used as the photomask.

10. A manufacturing method of a semiconductor device, comprising the steps of:
    forming a gate electrode over a substrate;
    forming a semiconductor layer over the gate electrode with a gate insulating layer interposed between the semiconductor layer and the gate electrode; and
    forming a conductive layer over the semiconductor layer,
        wherein at least one of the gate electrode, the semiconductor layer and the conductive layer is formed by forming a layer to be processed, forming a light absorption layer by a sputtering method or a CVD method over the layer, adding an inert gas to the light absorption layer, irradiating the light absorption layer with a laser beam through a photomask, so that an irradiated part of the light absorption layer is removed, and etching the layer using a remaining part of the light absorption layer as a mask, and
        wherein the light absorption layer is formed using a conductive material, a semiconductor material, or an inorganic insulating material.

11. A manufacturing method of a semiconductor device, comprising the steps of:
    forming a first conductive layer over a substrate;
    forming a first light absorption layer by a sputtering method or a CVD method over the first conductive layer;
    irradiating the first light absorption layer with a laser beam through a photomask, so that an irradiated part of the first light absorption layer is removed;
    etching the first conductive layer using a remaining part of the first light absorption layer as a mask to form a gate electrode;
    removing the remaining part of the first light absorption layer;
    forming a gate insulating layer to cover the gate electrode;
    forming a semiconductor layer over the gate insulating layer;
    forming a second light absorption layer by a sputtering method or a CVD method over the semiconductor layer;
    irradiating the second light absorption layer with a laser beam through a photomask, so that an irradiated part of the second light absorption layer is removed;
    etching the semiconductor layer using a remaining part of the second light absorption layer as a mask to be processed correspondingly to a pattern of the remaining part of the second light absorption layer;

removing the remaining part of the second light absorption layer;

forming a second conductive layer to cover the semiconductor layer;

forming a third light absorption layer by a sputtering method or a CVD method over the second conductive layer;

irradiating the third light absorption layer with a laser beam through a photomask, so that an irradiated part of the third light absorption layer is removed;

etching the second conductive layer using a remaining part of the third light absorption layer as a mask to form a source electrode and a drain electrode;

removing the remaining part of the third light absorption layer; and etching a part of the semiconductor layer using the source electrode and the drain electrode as a mask, wherein an inert gas is added to at least one of the first light absorption layer, the second light absorption layer and the third light absorption layer, and wherein each of the first light absorption layer, the second light absorption layer and the third light absorption layer is formed using a conductive material, a semiconductor material, or an inorganic insulating material.

* * * * *